(12) United States Patent
Chung et al.

(10) Patent No.: US 8,736,296 B2
(45) Date of Patent: May 27, 2014

(54) STACKED SEMICONDUCTOR APPARATUS WITH CONFIGURABLE VERTICAL I/O

(75) Inventors: Hoe ju Chung, Yongin-si (KR); Jung bae Lee, Yongin-si (KR); Hoon Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 444 days.

(21) Appl. No.: 13/163,884

(22) Filed: Jun. 20, 2011

(65) Prior Publication Data

US 2011/0248740 A1    Oct. 13, 2011

Related U.S. Application Data

(62) Division of application No. 12/245,928, filed on Oct. 6, 2008, now Pat. No. 7,990,171.

(30) Foreign Application Priority Data

Oct. 4, 2007  (KR) .......................... 10-2007-0099807

(51) Int. Cl.
*G01R 31/26* (2014.01)
*H01L 21/66* (2006.01)
*H01L 25/065* (2006.01)
*H01L 25/18* (2006.01)

(52) U.S. Cl.
CPC ............ *H01L 22/22* (2013.01); *H01L 25/0657* (2013.01); *H01L 25/18* (2013.01); *H01L 2925/01055* (2013.01); *H01L 2225/06513* (2013.01); *H01L 2924/01019* (2013.01); *H01L 2224/16145* (2013.01)
USPC .................................................. 324/762.01

(58) Field of Classification Search
CPC ........ H01L 22/22; H01L 25/0657; H01L 25/18
See application file for complete search history.

(56) References Cited

U.S. PATENT DOCUMENTS

| | | | |
|---|---|---|---|
| 6,788,070 B2 * | 9/2004 | Ishigaki | 324/508 |
| 6,876,221 B2 | 4/2005 | Ishigaki | |
| 7,489,030 B2 * | 2/2009 | Shibata et al. | 257/686 |
| 7,737,540 B2 | 6/2010 | Choi | |
| 7,816,181 B1 * | 10/2010 | Bhagath et al. | 438/108 |
| 7,830,692 B2 | 11/2010 | Chung et al. | |
| 7,990,171 B2 * | 8/2011 | Chung et al. | 324/762.01 |
| 8,445,918 B2 * | 5/2013 | Bartley et al. | 257/77 |
| 2003/0020171 A1 | 1/2003 | Dutta et al. | |
| 2007/0132085 A1 | 6/2007 | Shibata et al. | |
| 2009/0039492 A1 | 2/2009 | Kang et al. | |
| 2009/0079463 A1 | 3/2009 | Conn | |
| 2009/0085599 A1 | 4/2009 | Choi et al. | |
| 2009/0091962 A1 | 4/2009 | Chung et al. | |

(Continued)

*Primary Examiner* — Jermele M Hollington
(74) *Attorney, Agent, or Firm* — Volentine & Whitt, PLLC

(57) ABSTRACT

The present invention provides an apparatus including a stacked plurality of devices and a related method. The apparatus includes a stacked plurality of devices including a master device and at least one secondary device; a plurality of segments, each segment being associated with one of the stacked plurality of devices; and a plurality of N vertical connection paths traversing the stacked plurality of devices. The apparatus further includes a plurality of M vertical signal paths configured from the plurality of N vertical connections paths, wherein M is less than N, and at least one of the plurality of M vertical signal paths is a merged vertical signal path adaptively configured by the master device using at least one segment from each one of at least two of the plurality of N vertical connection paths.

13 Claims, 42 Drawing Sheets

(56) References Cited

U.S. PATENT DOCUMENTS

| | | |
|---|---|---|
| 2009/0153177 A1 | 6/2009 | Shibata |
| 2009/0319703 A1 | 12/2009 | Chung |
| 2010/0020583 A1 | 1/2010 | Kang et al. |
| 2010/0213593 A1 | 8/2010 | Lee et al. |
| 2011/0044084 A1 | 2/2011 | Chung et al. |
| 2012/0086125 A1* | 4/2012 | Kang et al. .................... 257/738 |
| 2012/0187570 A1* | 7/2012 | Bartley et al. ................. 257/774 |
| 2013/0161836 A1* | 6/2013 | Yeom et al. ................... 257/778 |

* cited by examiner

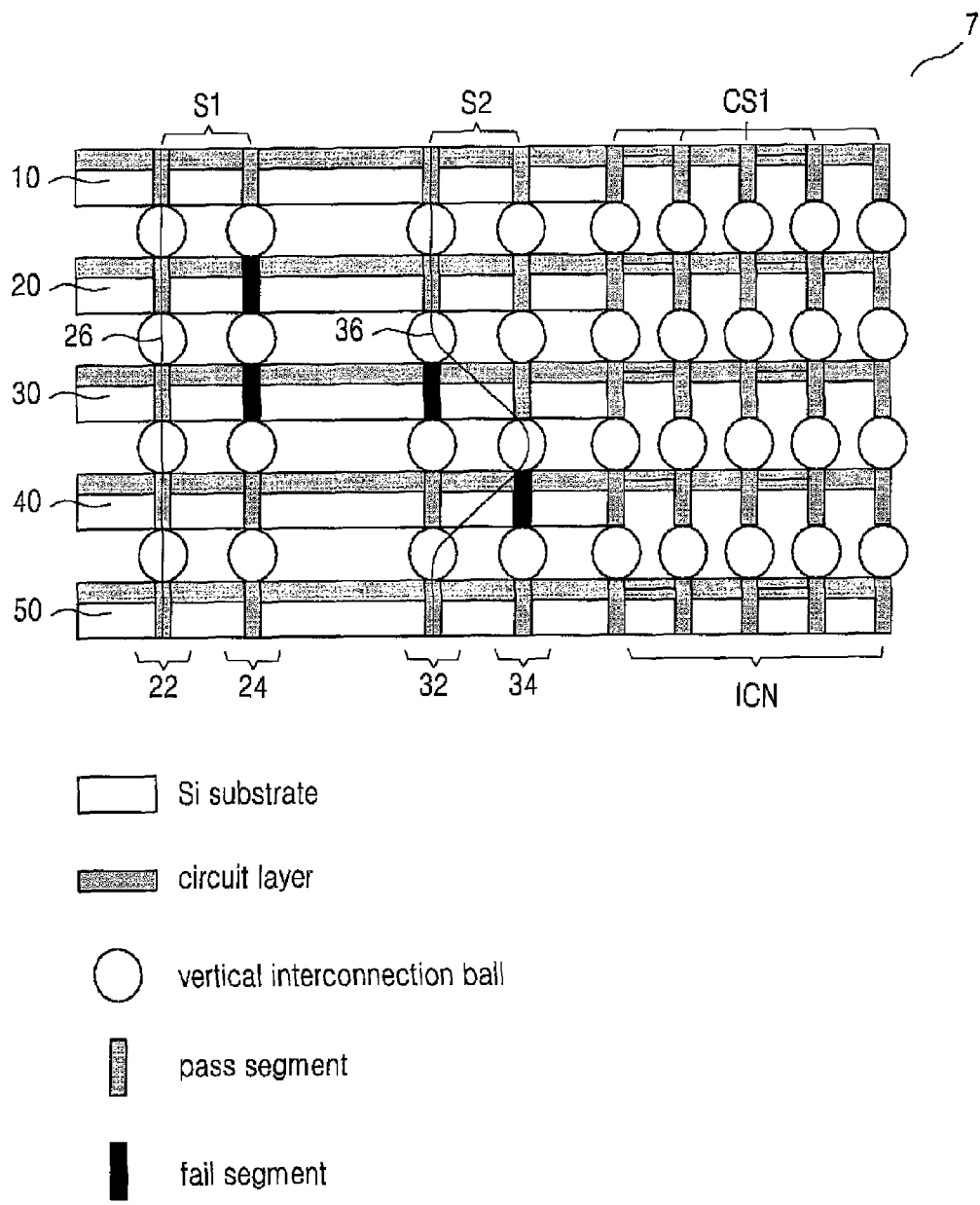

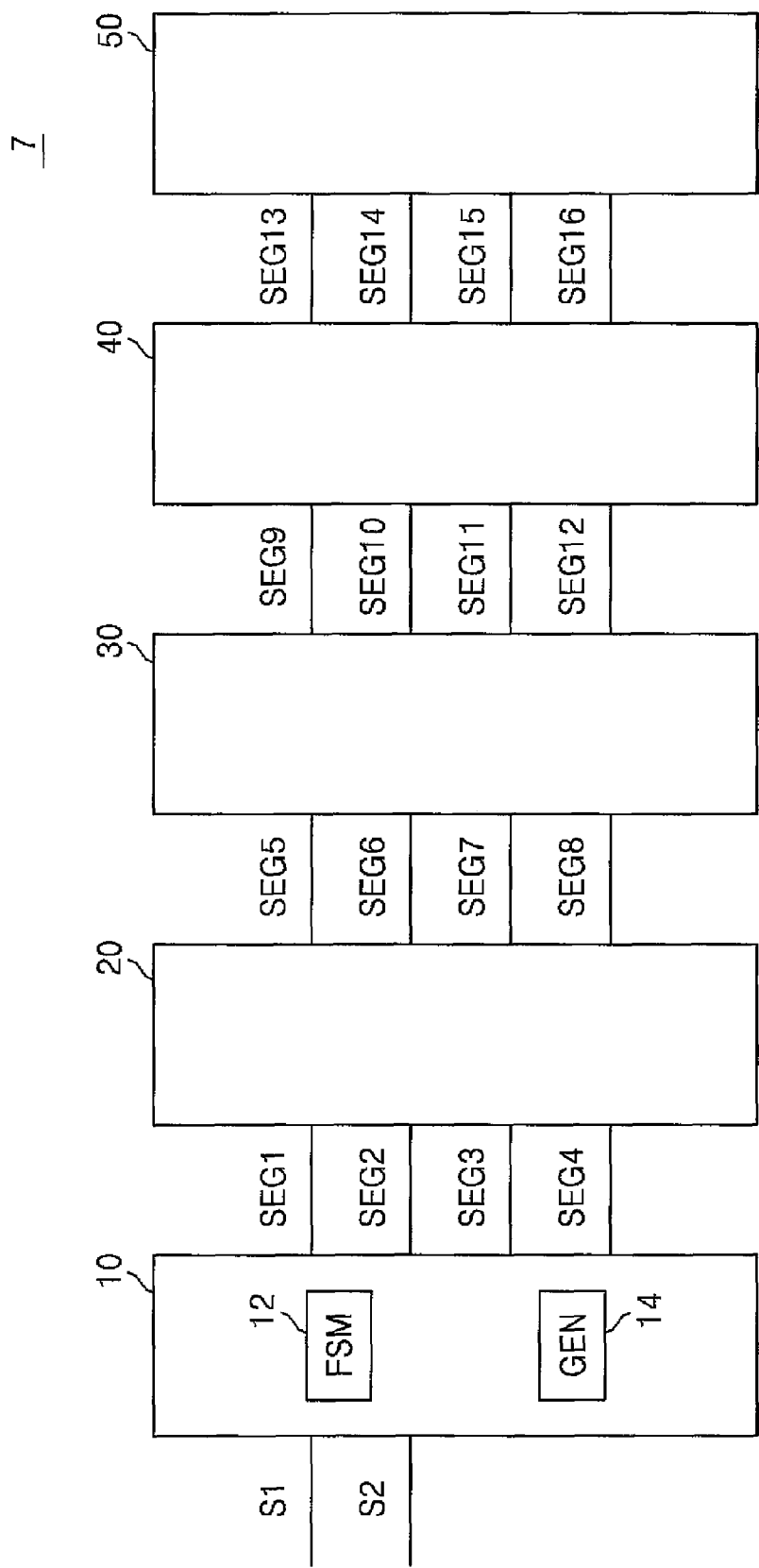

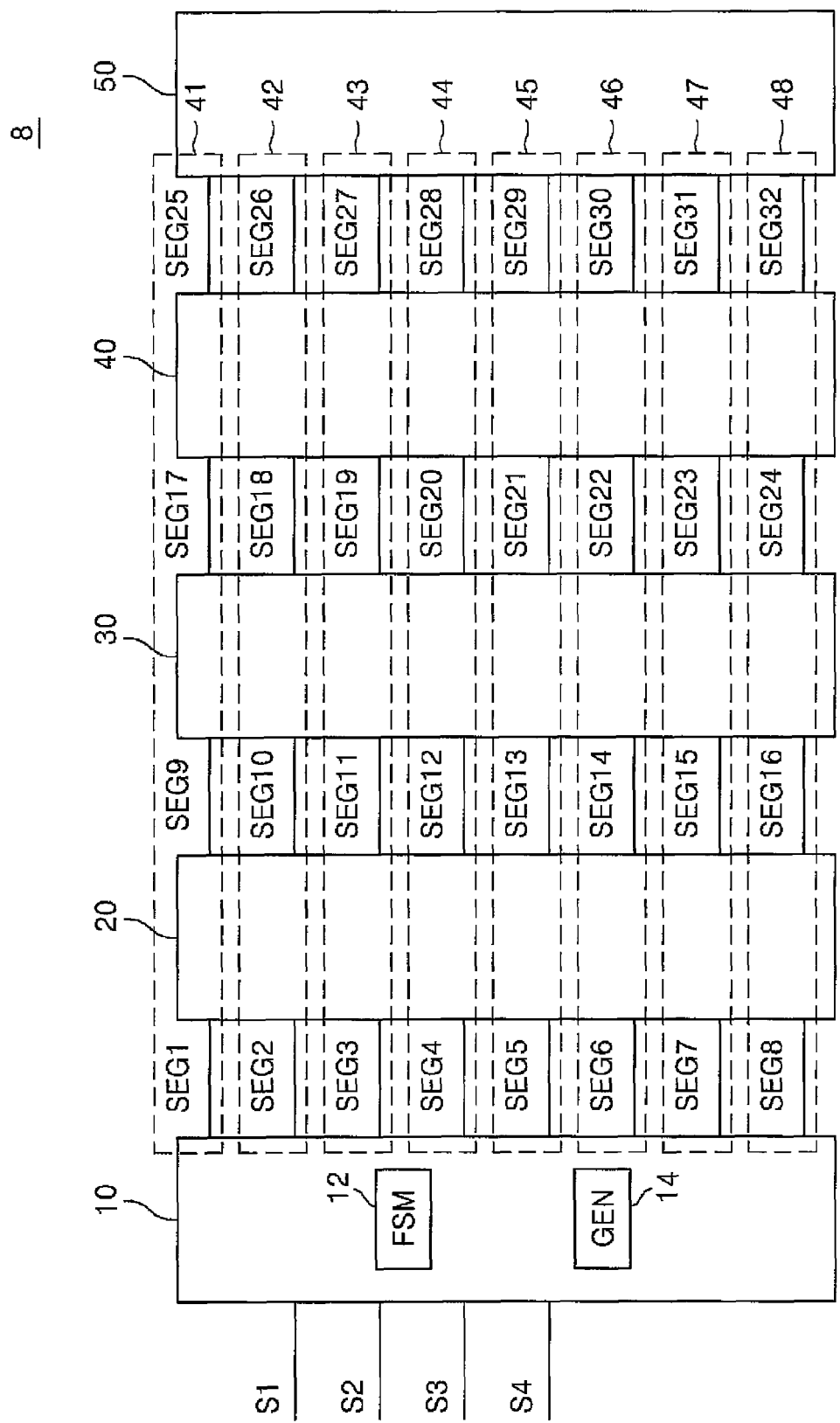

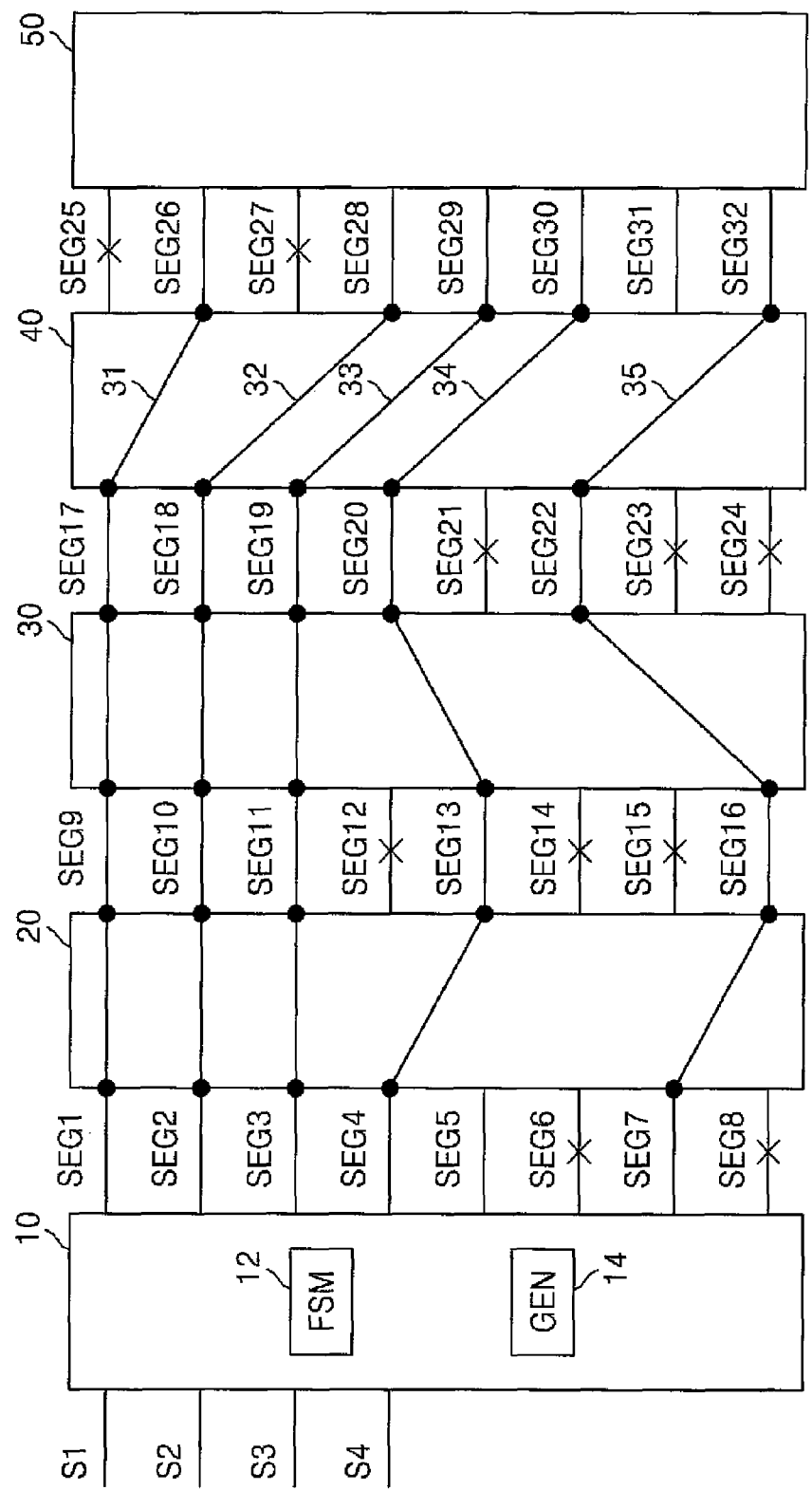

● Default vertical connection path
○ Redundant vertical connection path

● Default vertical connection path
○ Redundant vertical connection path

STACKED SEMICONDUCTOR APPARATUS WITH CONFIGURABLE VERTICAL I/O

CROSS-REFERENCE TO RELATED APPLICATIONS

This is a divisional of application Ser. No. 12/245,928 filed on Oct. 6, 2008, which claims the benefit of Korean Patent Application No. 10-2007-0099807 filed on Oct. 4, 2007, the collective subject matters of which are hereby incorporated by reference in their entirety.

BACKGROUND

Contemporary electronics are characterized by additional or greatly enhanced functionality. Hand-held telephones and other mobile host devices are capable of streaming high-quality video and running sophisticated Internet applications. Such additional and enhanced functionality are implemented in host devices further characterized by increasingly small physical size. Television sets that were once large pieces of furniture now hang on the wall and have a thickness of only a couple of inches.

The provision of additional and/or enhanced functionality within smaller and smaller host devices results in commensurate performance requirements on constituent semiconductor apparatuses. That is, a semiconductor apparatus must provide additional or enhanced functionality while occupying less and less space within the host device. This general requirement has motivated semiconductor designers to develop stacked semiconductor apparatuses. A stacked semiconductor apparatus is one wherein the ultimately provided package includes two or more functional devices vertically stacked one on top of the other. The term "vertically stacked" denotes aspects of both mechanically mounting the devices one on top of the other and electrically connecting the mechanically mounted devices.

A stacked semiconductor apparatus offers many benefits related to the provision of increased and/or enhanced functionality per unit of surface area occupied by the apparatus. However, the fabrication, testing, and incorporation of stacked semiconductor apparatuses within a host device present some unique challenges.

SUMMARY OF THE INVENTION

Embodiments of the invention provide a stacked semiconductor apparatus having configurable Input and/or Output (I/O) connections. Embodiments of the invention further provide systems and methods for testing and configuring I/O connections within a stacked semiconductor apparatus.

In accordance with one embodiment of the invention, an apparatus comprises a stacked plurality of devices including a master device and at least one secondary device; a plurality of segments, each segment being associated with one of the stacked plurality of devices; and a plurality of N vertical connection paths traversing the stacked plurality of devices, each one of the plurality of N vertical connection paths comprising a subset of the plurality of segments. The apparatus further comprises a plurality of M vertical signal paths configured from the plurality of N vertical connections paths, wherein M is less than N, and at least one of the plurality of M vertical signal paths is a merged vertical signal path adaptively configured by the master device using at least one segment from each one of at least two of the plurality of N vertical connection paths.

In accordance with another embodiment of the invention, a system comprises a stacked plurality of devices; testing equipment connected to the stacked plurality of devices; and a plurality of segments, each segment being associated with one of the stacked plurality of devices or with the testing equipment, wherein segments among the plurality of segments that are associated with the testing equipment connect the testing equipment to the stacked plurality of devices. The system further comprises a plurality of N vertical connection paths traversing the stacked plurality of devices, each one of the plurality of N vertical connection paths comprising a subset of the plurality of segments; and a plurality of M vertical signal paths configured from the plurality of N vertical connections paths, wherein M is less than N, and at least one of the plurality of M vertical signal paths is a merged vertical signal path adaptively configured by the testing equipment using at least one segment from each one of at least two of the plurality of N vertical connection paths.

In accordance with yet another embodiment of the invention, a method of configuring a merged vertical signal path traversing a stacked plurality of devices using a plurality of vertical connection paths, wherein the stacked plurality of devices comprises a plurality of segments, comprises detecting whether each of the plurality of segments is a pass segments or a fail segment, respectively; and merge-connecting at least one pass segment from each one of at least two of the plurality of vertical connection paths to configure the merged vertical signal path.

In accordance with still another embodiment of the invention, a method of configuring M vertical signal paths through a stacked plurality of devices using a plurality of N vertical connection paths, wherein M is less than N and the stacked plurality of devices comprises a plurality of segments, comprises detecting whether each of the plurality of segments is a pass segment or a fail segment, respectively. The method further comprises identifying all vertical connection paths in the plurality of N vertical connection paths comprising only pass segments as L non-merged vertical connection paths and designating the L non-merged vertical connection paths as respective ones of the M vertical signal paths, wherein L is less than M. In addition, the method further comprises configuring K merged vertical signal paths, where K is equal to M minus L, and designating the K merged vertical signal paths as respective ones of the M vertical signal paths, wherein configuring each one of the K merged vertical signal paths comprises adaptively connecting at least one pass segment from each one of at least two of the plurality of vertical connection paths, excluding the L non-merged vertical connection paths.

In accordance with still another embodiment of the invention, a method of configuring a merged vertical signal path traversing a stacked plurality of devices from among a plurality of vertical connection paths using testing equipment connected to the stacked plurality of devices, wherein the stacked plurality of devices comprises a plurality of segments, comprises detecting whether each of the plurality of segments is a pass segments or a fail segment, respectively; and merge-connecting at least one pass segment from each one of at least two of the plurality of vertical connection paths to configure the merge connected signal path.

In accordance with still another embodiment of the invention, an apparatus comprises a stacked plurality of devices including a master device, wherein the master device comprises a driver, a receiver, and a plurality of connection points; a plurality of segments, each segment being associated with one of the stacked plurality of devices; and a plurality of vertical connection paths traversing the stacked plurality of devices, each one of the plurality of vertical connection paths comprising a subset of the plurality of segments. In addition, the driver comprises a plurality of first switching elements, and each of the first switching elements comprises a first output connected to a default connection point for the first switching element among the plurality of connection points; a second output connected to a redundant connection point among the plurality of connection points through a first alternate signal path; and a third output connected to a default connection point corresponding to another one of the switching elements among the plurality of connection points through a second alternate signal path.

In accordance with still another embodiment of the invention, a method comprises establishing an ordering of r redundant vertical connection paths and q default vertical connection paths in a stacked apparatus, wherein one of the redundant vertical connection paths is arranged after every RU(q/r) default vertical connection paths in the ordering, detecting whether each of the plurality of default vertical connection paths is a passed vertical connection path or a failed vertical connection path, respectively, and, for a failed default vertical connection path, selecting an alternate vertical connection path from among the remaining default and redundant vertical connection paths, wherein RU is a round-up function.

BRIEF DESCRIPTION OF THE DRAWINGS

The invention will be described below in relation to several embodiments illustrated in the accompanying drawings. Throughout the drawings, like reference symbols indicate like exemplary elements, components, or steps. In the drawings:

FIG. 1 is a cross-sectional view of a stacked semiconductor apparatus in accordance with an embodiment of the invention;

FIG. 2 is a conceptual diagram further illustrating the stacked apparatus of FIG. 1, and more particularly illustrating various segments of the stacked apparatus of FIG. 1 in accordance with an embodiment of the invention;

FIG. 8 is a conceptual diagram illustrating a stacked apparatus in accordance with an embodiment of the invention;

FIG. 9 further illustrates the stacked apparatus illustrated in FIG. 8 and includes annotations showing fail segments and ultimately defined vertical signal paths through the stacked apparatus in accordance with an embodiment of the invention;

DESCRIPTION OF EMBODIMENTS

Figure 3A:
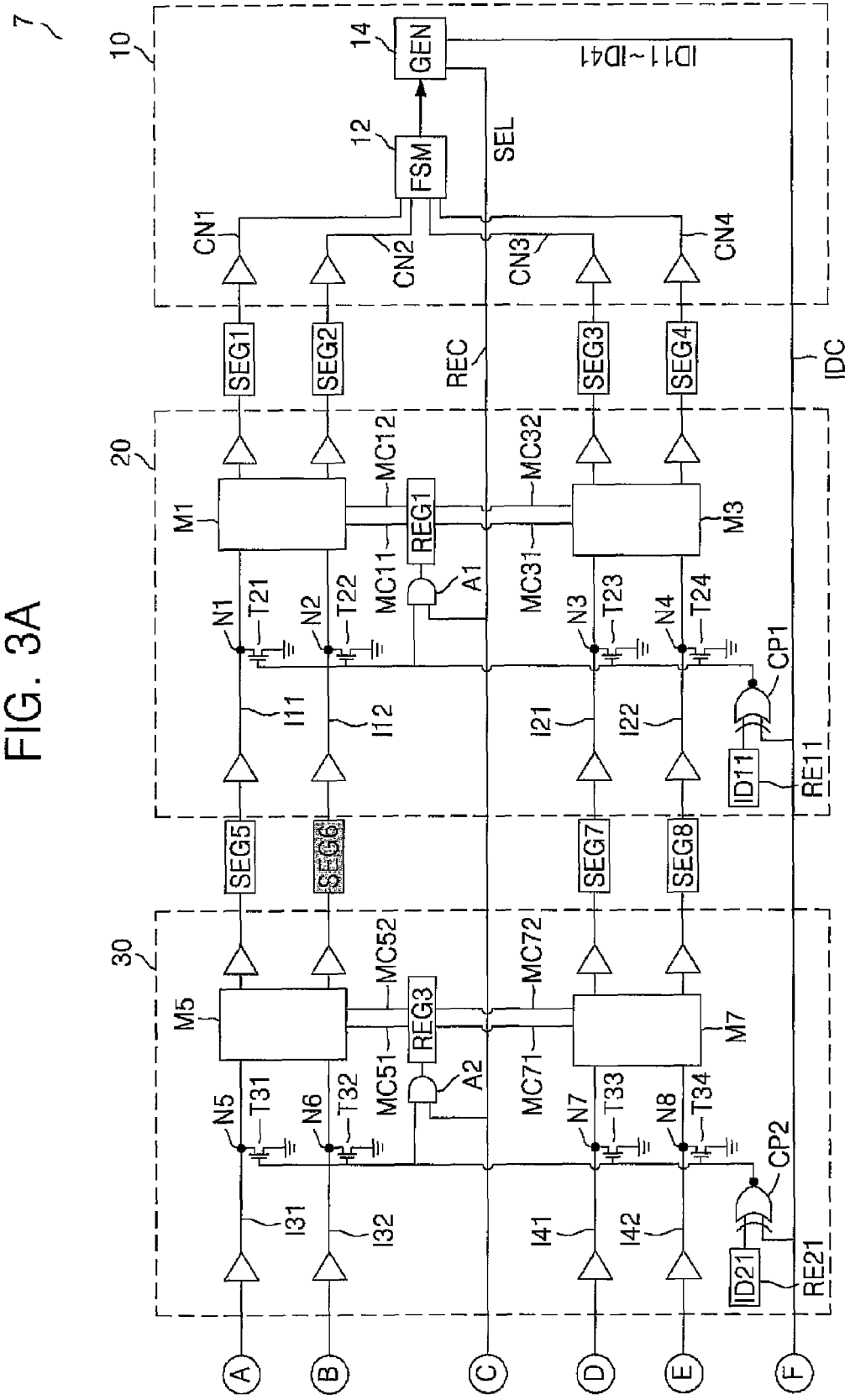
FIGS. 3A and 3B collectively illustrate a circuit diagram further illustrating the stacked apparatus of FIG. 1 in accordance with an embodiment of the invention.

Embodiments of the invention will now be described with reference to the accompanying drawings, in which like reference symbols indicate like or similar elements throughout. While the present invention is described in relation to several embodiments, the invention may be variously embodied and should not be construed as being limited to only the illustrated embodiments. The terms "first", "second", etc., are used only for convenience of description herein. Thus, a first element may alternatively be described as a second element, for example.

As previously noted, the advent of stacked semiconductor apparatuses offers great promise to host device designers. Smaller yet more powerful semiconductor packages allow the incorporating host device to scale down in physical size while providing additional and/or enhanced functionality.

However, the stacked nature of these apparatuses presents some unique challenges particularly related to the implementation and testing of I/O "through-connections." That is, the connection paths traversing a stacked semiconductor apparatus must reliably communicate one or more signals (e.g., address, data, control, etc.) to one or more of the stacked devices. In many instances, an I/O connection must communicate a common signal to each and every device in the stacked semiconductor apparatus. Given the many connection paths required by contemporary stacked semiconductor apparatuses and the multiple element-to-element connections implementing each connection path, the reliable provision of signals throughout the stacked semiconductor apparatus proves challenging. In a conventional stacked semiconductor apparatus, a single misconnection (i.e., an open or short circuit) is sufficient to render the entire apparatus useless. Further, since many misconnections are buried between stacked devices, the effective repair of a defective I/O path has been conventionally improbable, if not impossible.

Embodiments of the invention do not suffer from these drawbacks. An I/O connection path (whether serial or parallel in its nature) traversing a stacked semiconductor apparatus and including one or more misconnections (e.g., damaged or broken segments forming open, shorted or noisy portions of the I/O connection path) may nonetheless be rehabilitated for reliable use.

Embodiments of the invention should not be confused with conventional semiconductor apparatuses that merely provide alternate through-connections paths traversing a stacked arrangement of devices. (See, for example, U.S. Patent Application No. 2007/0132085 published on Jun. 14, 2007). That is, some conventional stacked semiconductor apparatuses provide an A/B alternative to the provision of a through-connection. If connection path A is inoperable due to one or more misconnections, the connection path B is used. Certainly, this approach creates a statistically better chance of providing a working through-connection, but it does so at great overhead and without much flexibility.

FIG. 1 is a cross-sectional view of a stacked semiconductor apparatus in accordance with an embodiment of the invention. In the embodiment illustrated in FIG. 1, a stacked semiconductor apparatus 7 comprises a plurality of vertically stacked devices, comprising a master, interface and/or control device 10 (hereafter, "master device"), and a plurality of secondary devices 20, 30, 40, and 50 (hereafter "device(s)", etc.). Each of stacked devices 10 through 50 may be implemented as a naked (i.e., unpackaged) semiconductor chip or as a fully or partially packaged device within the stacked apparatus. In accordance with one embodiment of the invention, devices 10 through 50 may be packaged into a single apparatus. Alternatively, secondary devices 20 through 50 may be packaged as an apparatus before being subsequently mounted on master device 10. In one embodiment of the invention, secondary devices 20, 30, 40, and 50 may be semiconductor memory devices (volatile and/or nonvolatile) and master device 10 may be a memory controller. Alternately, master device 10 may be a processor, a system or sub-system controller, a memory device, and/or an Automated Test Equipment (ATE) interface.

Regardless of actual physical form or mounting techniques used, a device within a stacked apparatus may be said to be stack-mounted on top of another device. The term stacked-mounted has reference to not only the mechanical assembly techniques and elements used to form a stacked apparatus, but also the inter-device provision of connection paths for signals intended to traverse all or part of the stacked apparatus.

In the embodiment illustrated in FIG. 1, the devices within stacked apparatus 7 are connected via a plurality of vertical connection paths (e.g.,) 22, 24, 32, 34. Each vertical connection path is implemented by a stacked-mounted collection of vertically aligned connection path "segments". Those skilled in the art will recognize that connection path segments may be variously embodied. In the illustrated embodiments, however, it is assumed that each segment is associated with one of the stacked plurality of devices and is at least partially implemented by a conductive element vertically traversing the substrate on which the device is implemented. In the illustrated embodiments, through-silicon vias (TSVs) are assumed as constituent portions of each segment, but the invention is not limited to only this type of connection path segment architecture.

Thus, each of the segments illustrated in FIG. 1 is associated with one of the stacked devices 10, 20, 30, 40, and 50. As used herein, when a segment is said to be "associated with" a device, it means that the segment has a unique physical association with just that particular device. For example, if a segment is disposed in a particular device, then that segment is "associated with" that device and is not "associated with" any other device, although the segment may be, for example, electrically connected to many other devices.

Additionally, when master device 10 is an ATE interface, interconnection structures incorporated within or external to master device 10 (e.g., external solder bumps) may also be considered segments associated with the ATE interface.

In FIG. 1, each segment apparent in stacked apparatus 7 passes vertically through one of devices 10, 20, 30, 40, and 50. That is, each of the segments shown in stacked apparatus 7 is at least partially disposed in and is therefore associated with one of devices 10, 20, 30, 40, and 50. In addition, and as will be described in additional detail hereafter, each segment may be a "pass segment" or a "fail segment." Since each segment is intended to provide a portion of a vertically oriented, electrical connection path (i.e., at least a section passing through a device substrate), a pass segment is one providing proper electrical connection (i.e., ohmic connection) or one providing a sufficiently high-quality electrical connection (i.e., providing a signal path having a acceptable signal to noise ratio).

In contrast, a segment that fails to provide a proper or acceptable electrical connection is deemed a fail segment. The standard(s) and/or criteria for determining whether a segment is a pass segment or a fail segment may vary with different design considerations and ultimate host device application. A most basic criteria may be the existence of an ohmic connection (or conductivity) between opposite vertical ends of a segment. More sophisticated criteria may include, active signal-to-noise ratios, or segment impedance or resistance characteristics.

Hereafter, for the sake of simplicity, embodiments of the invention will be described which simply use signal transmissibility versus non-transmissibility as the only criteria for determining whether a segment is a pass segment or a fail segment. Thus, as used herein, when a segment is described as "satisfactorily receiving" or "satisfactorily communicating" a signal, it means that the receipt of that signal meets whatever standard(s) and/or criteria have been chosen for determining whether a segment is a pass segment or a fail segment in accordance with an embodiment of the invention.

The embodiment illustrated in FIG. 1 shows both pass segments and fail segments. In addition, adjacent stacked devices within stacked apparatus 7 are connected to one another by various interconnection structures (e.g., back-side and/or front-side mounted connection elements, such as ball/land structures, etc.). As illustrated in FIG. 1, for each pair of adjacent devices in stacked apparatus 7, interconnection structures connect segments associated with one of the adjacent devices to respective segments associated with the other of the adjacent devices. For example, in FIG. 1, interconnection structures within stacked apparatus 7 connect the segments associated with master device 10 to the segments associated with secondary device 20, which is adjacent to master device 10.

The vertical connection paths 22, 24, 32, and 34 of FIG. 1 are intended to serve as vertical signal paths traversing the stacked apparatus 7. However, as indicated by the presence of the failed segments in vertical connection paths 24, 32, and 34, some vertical connection path(s) may not be capable of satisfactorily communicating an electrical signal through the stacked apparatus 7. A vertical connection path comprising one or more fail segment(s) is not capable of satisfactorily communicating an electrical signal upward (or downward) through the entire arrangement of stacked devices. Hence, a vertical connection path comprising at least one fail segment may be referred to as a "failed vertical connection path." Each of vertical connection paths 24, 32, and 34 is a failed vertical connection path.

In contrast to failed vertical connection path 24, all of the segments in vertical connection path 22 are pass segments. Thus, vertical connection path 22 is able to serve as a vertical signal path 26 within the stacked apparatus 7. A vertical connection path comprising only pass segments may be referred to herein as a "passed vertical connection path." In addition, as used herein, a "vertical signal path" is a conductive path capable of satisfactorily communicating an electrical signal upward/downward through a stacked semiconductor apparatus. As will described in additional detail hereafter, a vertical signal path may be implemented as "merged vertical signal path" or as a "non-merged vertical signal path". Vertical connection path 22 forms a non-merged vertical signal path, since each and every segment forming the operative vertical signal path 26 physically resides within vertical connection path 22. From the foregoing definitions, it is clear that a vertical signal path, while conveying an electrical signal upward/downward through the stacked apparatus 7, need not be strictly a vertically oriented component. While passed vertical connection paths, such as vertical connection path 22, containing only passed segments may serve as a strictly vertically oriented signal path (i.e., a non-merged vertical signal path), other vertical signal paths (i.e., merged vertical signal paths) will traverse stacked apparatus 7 in a non-linear manner (i.e., along a path not defined by a single straight line).

In stacked apparatus 7 illustrated in FIG. 1, two different vertical connection paths are associated with each of first and second electrical signals S1 and S2. As used herein, when a vertical connection path is said to be "associated with" a particular signal, it means that the vertical connection path is intended to communicate at least said signal through the stacked apparatus 7. In the particular illustrated example of FIG. 1, either one or both of vertical connection paths 22 and 24 may be associated with first signal S1, and either one or both of vertical connection paths 32 and 34 may be associated with second signal S2. Hence, up to four (4) vertical connection paths may be variously used to implement two (2) vertical signal paths through stacked apparatus 7. As a result, the presence of multiple fail segments in vertical connection paths 24, 32, and 34 do not cause a signal communication failure within the stacked apparatus 7. Since vertical connection path 22 may be used as a vertical signal path (i.e., a non-merged vertical signal path 26), the multiple fail segments in vertical connection path 24 are of no consequence, and no segment of vertical connection path 24 is used as part of a first vertical signal path 26 communicating first signal S1.

In contrast to the first signal S1 example, where multiple vertical connection paths (e.g., 32 and 34) associated with second signal S2 each contain at least one fail segment, a test and reconfiguration capability provided by embodiments of the invention allow stacked apparatus 7 to implement a merged vertical signal path from two or more failed vertical connections paths. In effect, embodiments of the invention are capable of bypassing fail segment(s) in one vertical connection path using one or more pass segment(s) respectively associated with the same device(s) as the fail segments, albeit in different vertical connection path(s).

In the example illustrated in FIG. 1, a second vertical signal path 36 associated with second signal S2 bypasses the fail segment in vertical connection path 32 associated with device 30. In this manner the second vertical signal path (i.e., a merged vertical signal path 36) associated with second signal S2 is implemented through stacked apparatus 7. The second vertical signal path (i.e., merged vertical signal path 36) may also be understood as bypassing the fail segment in vertical connection path 34 associated with device 40.

Several examples of methods capable of discriminating pass and fail segments, and thereafter identifying and/or implementing merged and non-merged vertical signal paths through a stacked apparatus will be described hereafter. However, in the context of various embodiments of the invention, a merged vertical signal path may be formed within stacked apparatus 7 before or after final packaging of the stacked apparatus 7.

Because embodiments of the invention have the capability of adaptively forming merged vertical signal paths from multiple vertical connection paths traversing a stacked apparatus, the production yield of stacked apparatuses may be greatly improved with significantly reduced design and layout overhead and greater flexibility in vertical signal path definition. No longer will a single fail segment result in a useless stacked apparatus. Yet, 2× or greater redundant vertical connection paths need not be provided for each electrical signal. The embodiment illustrated in FIG. 1 further comprises one or more so-called "robust vertical signal paths" or ICN. As is conventionally understood, the provision of certain critical control signals (e.g., chip selection signals, test voltages, etc.) must be ensured within a stacked apparatus. Thus, despite the markedly improved ability of embodiments of the invention to provide functional vertical signal paths through a stacked apparatus at reduced overhead, certain embodiments may nonetheless wish to incorporate one or more robust vertical signal paths. In the embodiment illustrated in FIG. 1, stacked apparatus 7 comprises a robust vertical signal path ICN comprising five redundant (and electrically cross-connected) vertical connection paths collectively dedicated to the provision of a control signal CS1. The use of robust vertical signal path(s) should be minimized in a stacked apparatus to avoid the loss of significant connection real estate. Thus, embodiments of the invention may allow a marked reduction in the number of robust vertical signal paths within certain stacked apparatuses. Naturally, robust vertical signal paths should not be formed in device substrate regions more prone to the development of fail segments, but the fabrication and functionality of robust vertical signal paths is considered conventional and will not be further described.

FIG. 2 is a conceptual diagram further illustrating the stacked apparatus 7 of FIG. 1, and more particularly illustrating various segments of stacked apparatus 7. As illustrated in FIG. 2, stacked apparatus 7 comprises segments SEG1 through SEG16. Although segments SEG1 through SEG4 are schematically illustrated as being disposed between device 10 and device 20, these segments are associated with device 10 as described above. Thus, in certain embodiments of the invention, segments SEG1 through SEG4 may comprise TSVs disposed through device 10, along with other interconnection elements. Likewise, segments SEG5 through SEG16 are variously associated with devices 20, 30, and 40. Segments associated with device 50 are not illustrated in FIG. 2. In an embodiment in which master device 10 is an ATE interface, segments SEG1 through SEG4 may be externally connected to various test signal generation and/or measurement equipment. However, ATE connections to a semiconductor device undergoing test are generally deemed to be conventional in nature. As will be described in some additional detail hereafter, each device within stacked apparatus 7 may be adaptively used to variously connect different device layer segments. For example, circuitry provided by secondary device 20 and/or by master device 10 may be used to variously connect at least one "first layer segment" (i.e., any one of segments SEG1 through SEG 4 associated with first (master) device 10) with at least one "second layer segment" (i.e., any one of segments SEG5 though SEG8 associated with second device 20). Master device 10 may also be referred to herein as a "first" device 10, and devices 20, 30, 40, and 50 may also be referred to herein as "second", "third", "fourth", and "fifth" devices, respectively.

Additionally, the plurality of segments of a stacked apparatus in accordance with an embodiment of the invention may be referred to relative to horizontal subsets of the plurality of segments and relative to vertical subsets of the same plurality of segments. For example, a plurality of $n^{th}$ layer segments may correspond to a horizontal subset of the plurality of segments, wherein each segment of the horizontal subset (i.e., the plurality of $n^{th}$ layer segments) is associated with an $n^{th}$ device. In addition, each vertical connection path of a stacked apparatus in accordance with an embodiment of the invention may correspond to a respective vertical subset of the plurality of segments.

In the embodiment illustrated in FIG. 2, master device 10 of stacked apparatus 7 further comprises a Finite State Machine (FSM) 12 and an identification (ID) signal generator 14 (ID GEN 14). Additionally, master device 10 receives first and second electrical signals 51 and S2.

Figure 3B:
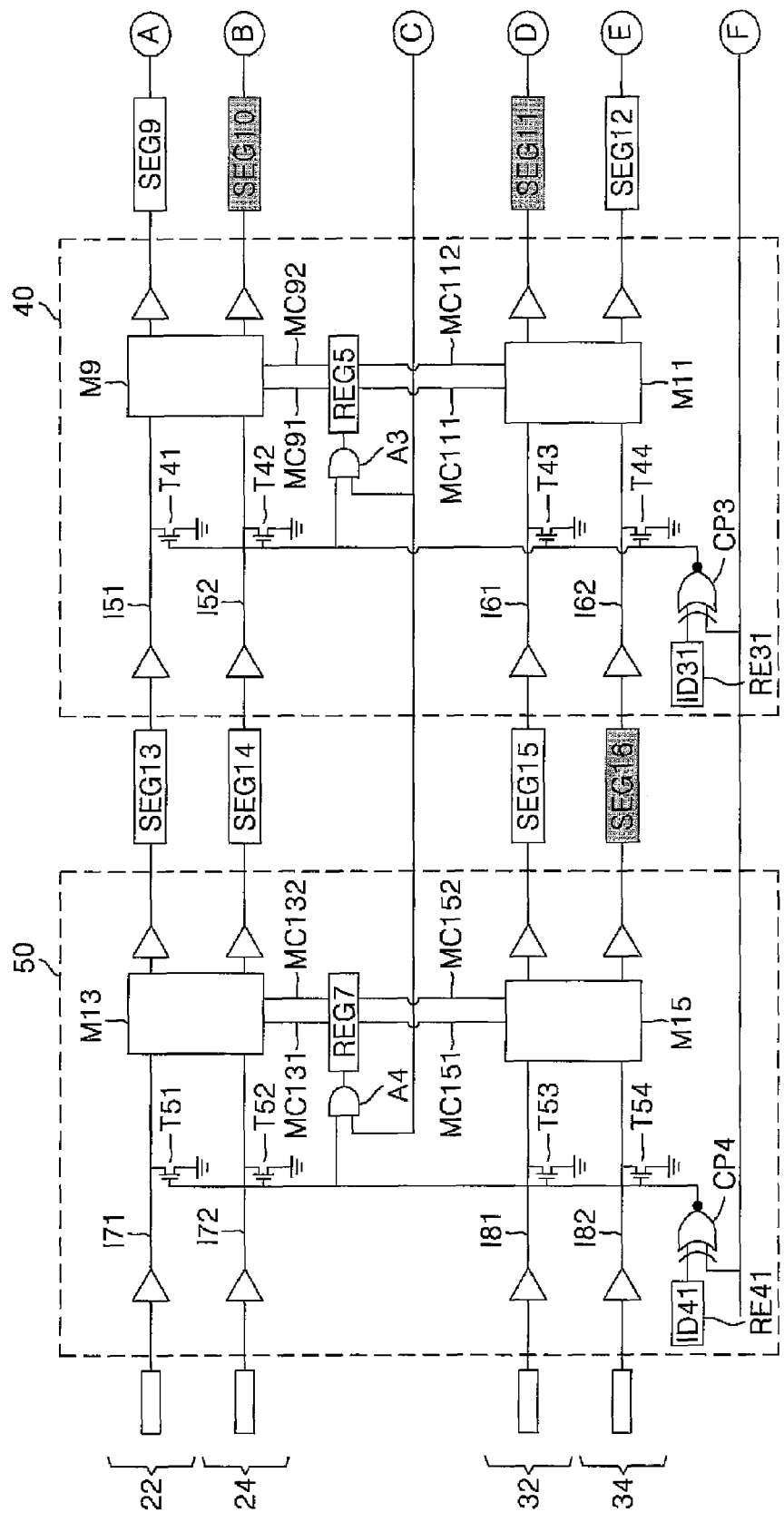

Collectively, FIGS. 3A and 3B are a circuit diagram further illustrating stacked apparatus 7 in accordance with an embodiment of the invention. The encircled letters A though F in FIGS. 3A and 3B indicate respective connections between the circuit elements of FIGS. 3A and 3B. In accordance with an embodiment of the invention, master device 10, operating as a stand alone device or in conjunction with externally connected test equipment, detects fail segments in the vertical connection paths of stacked apparatus 7, and may further define one or more non-merged vertical signal paths and/or merged vertical signal paths to implement a given number of vertical signal paths through the stacked devices.

Referring to FIGS. 3A and 3B, master device 10 comprises FSM 12 and ID GEN 14 having substantially conventional designs and operating characteristics. FSM 12 is connected to and receives respective test signals from connection paths CN1 through CN4. Each of devices 20, 30, 40, and 50 comprises a number of switching elements positioned in relation to segments of stacked apparatus 7, and the switching elements are separated from the segments by buffers. Each of the buffers may be tri-state buffer. ID GEN 14 provides a control signal SEL to logic circuits A1, A2, A3, and A4 respectively associated with devices 20, 30, 40, and 50 via a control signal path REC. FSM 12 is connected to ID GEN 14, which selectively provides identification signals ID11, ID21, ID31, and ID41 via a control signal path IDC to device select circuits associated with devices 20, 30, 40, and 50.

Each of the device select circuits comprises a comparator and an identification (ID) register. For example, in the embodiment illustrated in FIGS. 3A and 3B, the device select circuit associated with second device 20 (i.e., a first device select circuit) comprises first comparator CP1 and first ID register RE11 providing identification signal ID11 to comparator CP1. First comparator CP1 is a logic circuit in the illustrated example but is not limited to only this particular configuration. First comparator CP1 receives control signals from ID GEN 14 via control signal path IDC, and receives the first identification signal ID11 from first ID register RE11. Master device 10 may select second device 20 for operation by causing ID GEN 14 to provide control signal ID11 to first comparator CP1. However, when ID GEN 14 provides a control signal other than the first control signal ID11 to first comparator CP1, the output of first comparator CP1 is not activated, and second device 20 is not selected by master device 10. In the embodiment illustrated in FIGS. 3A and 3B, the configuration and operation of device select circuits associated with third through fifth devices 30, 40, and 50 are analogous to the first device select circuit associated with second device 20 and described above.

In addition, in the embodiment illustrated in FIGS. 3A and 3B, second device 20 comprises multiplexers M1 and M3. Multiplexer M1 switch-connects between segments SEG5 and SEG6 associated with second device 20 and segments SEG1 and SEG2 associated with master device 10. Similarly, multiplexer M3 switch-connects between segments SEG7 and SEG8 associated with second device 20 and segments SEG3 and SEG4 associated with master device 10. Corresponding signal path portions I11 through I22 associated with multiplexers M1 and M3 are indicated in second device 20.

Multiplexer M1 is capable of adaptively defining switch paths forming connections between second layer segments SEG5 and SEG6 associated with second device 20, and first layer segments SEG1 and SEG2 associated with master device 10. As used herein, a "switch path" is a signal path formed between an input and an output of a multiplexer or other switching element. In this context, segments SEG1 through SEG4 may be denoted as "a plurality of first layer segments" and segments SEG5 though SEG8 as "a plurality of second layer segments", where the term "layer" has reference to the layered relationship between stacked devices. Similarly, multiplexer M3 is capable of adaptively defining switch paths forming connections between second layer segments SEG7 and SEG8 associated with second device 20, and first layer segments SEG3 and SEG4 associated with master device 10.

For example, multiplexer M1 may switch-connect second layer segment SEG5 with first layer segment SEG1, both of which reside in a common vertical connection path 22. Alternately, in a case wherein segment SEG1 is a fail segment, for example, multiplexer M1 may switch-connect second layer segment SEG5 with first layer segment SEG2.

Device 20 further comprises a first control register REG1 providing switching element control signals (e.g., multiplexer control signals) MC11 and MC12 to multiplexer M1 and switching element control signals (e.g., multiplexer control signals) MC31 and MC32 to multiplexer M3. In accordance with embodiments of the invention, a control register of a device may provide switching element control signals to switching elements of a device. In the embodiment of the invention illustrated in FIGS. 3A and 3B, the switching elements forming switch paths are multiplexers. Thus, the switching element control signals provided to the multiplexers may be referred to herein as "multiplexer control signals."

Multiplexer M1 adaptively defines one or more switch paths among a range of possible switch paths based on multiplexer control signals MC11 and MC12. Similarly, multiplexer M3 adaptively defines one or more switch paths based on multiplexer control signals MC31 and MC32. In turn, multiplexer control signals MC11, MC12, MC31, and MC32 are defined by control data stored in first control register REG1. In this manner, master device 10 may control the switch paths formed by multiplexers M1 and M3 by controlling the data stored in first control register REG1.

In the embodiment illustrated in FIGS. 3A and 3B, when master device 10 selects second device 20 (i.e., when the output of comparator CP1 is activated), FSM 12 of master device 10 may change the contents of first control register REG1. By changing the contents of first control register REG1, FSM 12 may change the switch paths between second layer segments SEG5 and SEG6 and first layer segments SEG1 and SEG2, as well as between second layer segments SEG7 and SEG8 and first layer segments SEG3 and SEG4.

It should be noted at this point that simple 2-by-2 multiplexers arranged between two arbitrarily defined incoming and outgoing (e.g., with reference to test signal transmission) segments have been used in the illustrated example for simplicity. Those skilled in the art will recognize that any reasonable N-by-M multiplexer may be similarly used in other embodiments of the invention, where N and M are natural numbers. A particular device may incorporate multiplexers having similar or different I/O configurations to adaptively define various switch paths between incoming and outgoing segments.

In the illustrated embodiment of FIGS. 3A and 3B, second device 20 further comprises connection test circuits respectively associated with segments SEG1 through SEG4. The connection test circuits may be used in performing connection tests in relation to corresponding segments SEG1 through SEG4, respectively. In the illustrated embodiment, the connection test circuits incorporated in second device 20 respectively comprise transistors T21, T22, T23, and T24. Transistor T21 has a first source/drain terminal connected to ground, a second source/drain terminal connected to signal path portion I11 at node N1, and a gate connected to the output of first comparator CP1. Transistors T22, T23, and T24 are similarly configured with respect to corresponding signal path portions and multiplexers M1 and M3. Each of transistors T21, T22, T23, and T24 is turned ON when second device 20 is selected by master device 10 (i.e., when the output of first comparator CP1 is activated). When transistors T21, T22, T23, and T24 are turned ON, FSM 12 may determine, for each of segments SEG1 through SEG4, whether the segment is a pass segment or a fail segment. That is, master device 10 may perform a connection test on each segment of the plurality of first layer segments SEG1 through SEG4.

Here again, a very simple type of connection test circuit has been assumed in the illustrated embodiment. Those skilled in the art will recognize that many different types of connection test circuits may be associated (1-for-1 or 1-for-many) with the plurality of first segments SEG1 through SEG4.

Third through fifth devices 30, 40, and 50 illustrated in FIGS. 3A and 3B have configurations similar to the configuration described above with respect to second device 20. Thus, further explanation of the respective configurations of devices 30, 40, and 50 will be omitted.

In the illustrated embodiment of FIGS. 3A and 3B, certain darkly shaded segments (i.e., SEG6, SEG10, SEG11, and SEG16) indicate fail segments, while the non-shaded segments indicate pass segments. Vertical connection paths 22, 24, 32, and 34 are shown traversing the stacked apparatus 7, similar to the description given with respect to FIG. 1. For example, vertical connection path 22 comprises segments SEG1, SEG5, SEG5, and SEG13; vertical connection path 24 comprises segments SEG2, SEG6, SEG10, and SEG14; vertical connection path 32 comprises segments SEG3, SEG7, SEG11, and SEG15; and vertical connection path 34 comprises segments SEG4, SEG8, SEG12, and SEG16.

A method of detecting pass and fail segments in a stacked apparatus in accordance with an embodiment of the invention will now be described with reference to FIGS. 3A, 3B, 4, and 5A-5D.

Figure 4:
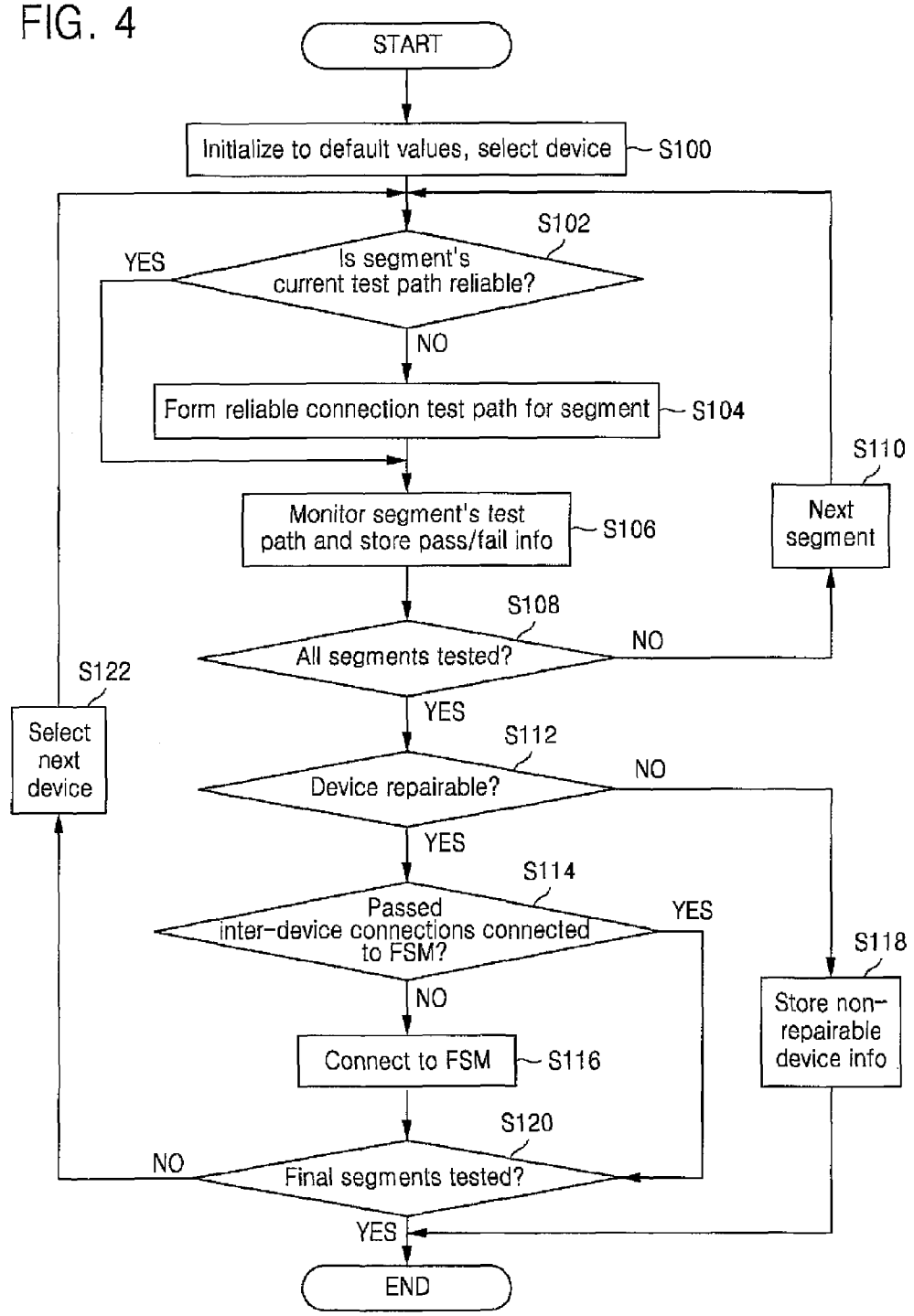
FIG. 4 is a flow chart summarizing a method of detecting pass and fail segments in various vertical connection paths through a stacked apparatus in accordance with an embodiment of the invention.

FIG. 4 is a flow chart summarizing a method of detecting pass and fail segments in various vertical connection paths through a stacked apparatus in accordance with an embodiment of the invention. The exemplary method described in relation to FIG. 4 will be explained in the context of a stacked apparatus 7 having a configuration like that shown in FIGS. 3A and 3B. FIGS. 5A-5D each illustrate a portion of the stacked apparatus 7 of FIGS. 3A and 3B with additional annotations further illustrating an exemplary performance of the method summarized in FIG. 4. In particular, FIGS. 5A and 5B correspond to FIG. 3A, and FIGS. 5C and 5D correspond to FIG. 3B in the working example.

Referring to FIGS. 4 and 5A-5D, master device 10 initializes each of the first through fourth control registers REG1, REG3, REG5, and REG7 to store default data and thereafter selects device 20 (S100) to begin evaluation of the plurality of first layer segments SEG1 through SEG4. The default data stored in first through fourth control registers REG1 through REG7 cause the multiplexers associated with each control register to form default (or initial) switch paths. In the example illustrated in FIGS. 5A-5D, and referring to FIGS. 5A and 5C, when default data is stored in first through fourth control registers REG1 through REG7, first control register REG1 causes multiplexer M1 to form a switch path p11 connecting second layer segment SEG5 with first layer segment SEG1, and a switch path p12 connecting second layer segment SEG6 with first layer segment SEG2. First control register REG1 also causes multiplexer M3 to form a switch path p31 connecting second layer segment SEG7 with first layer segment SEG3, and a switch path p32 connecting second layer segment SEG8 with first layer segment SEG4. Second through fourth control registers REG3, REG5, and REG7 similarly control corresponding multiplexers to form analogous default switch paths within corresponding vertical connection paths (which would form four (4) non-merged vertical signal paths corresponding to vertical connection paths 22, 24, 32, and 34, if all of segments SEG1 through SEG16 were pass segments).

Figure 5A:
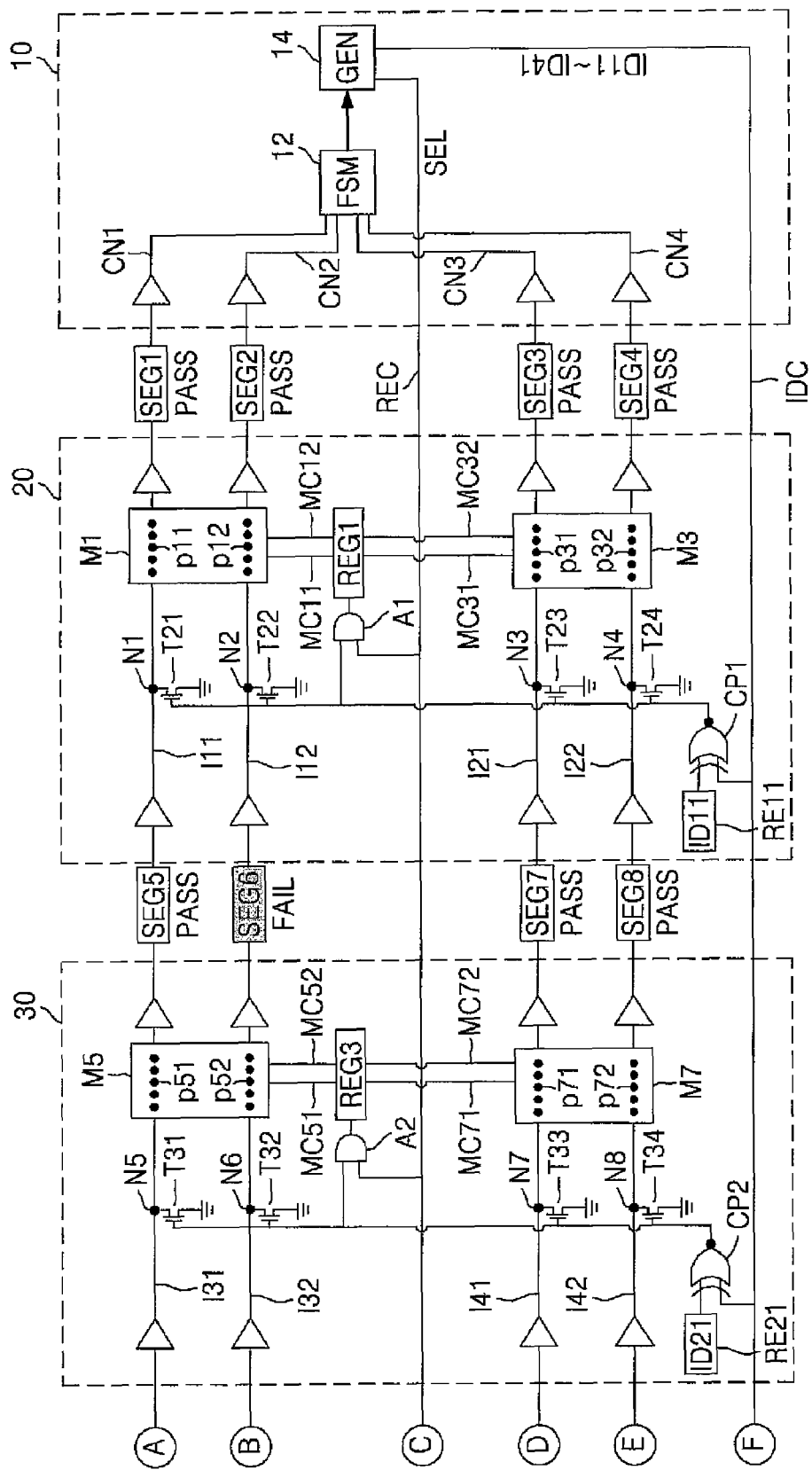
FIGS. 5A-5D each illustrate a portion of stacked apparatus collectively illustrated in FIGS. 3A and 3B with additional annotations further illustrating an exemplary performance of the method summarized in FIG. 4.

Referring to FIG. 5A, master device 10 selects device 20 using ID GEN 14 to generate and provide the first ID signal ID11 to the device selection circuit associated with second device 20 (i.e., to first comparator CP1). When first comparator CP1 receives the first ID signal ID11 from ID GEN 14, the output signal of first comparator CP1 is activated. Thus, the activated output of first comparator CP1 turns ON each one of transistors T21, T22, T23, and T24 so that FSM 12 may determine whether first layer segments SEG1 through SEG4 are pass or fail segments, respectively.

That is, FSM 12 performs a connection test on each one of the plurality of first layer segments upon selecting second device 20. In accordance with the simple working example, a connection test may include performing steps corresponding to steps S102, S104 (if necessary), and S106 of the method corresponding to FIG. 4. Beginning with a first segment (e.g., first layer segment SEG1), FSM 12 determines whether the current connection test path corresponding to the current segment (e.g., first layer segment SEG1) is reliable (S102). As used herein, a "connection test path" comprises at least one segment, and may also include conductive path portions (and related elements) intended to connect the segment, the connection test circuit associated with the segment, and master device circuitry determining whether the segment is a pass or fail segment. In accordance with an embodiment of the invention, a connection test path is "reliable" if, apart from the segment being tested, it comprises no fail segments.

The current connection test path corresponding to segment SEG1 comprises transistor T21, switch path p11, segment SEG1, and connection path CN1. Apart from segment SEG1 (which master device 10 has not yet determined to be either a pass or a fail segment), the current connection test path corresponding to segment SEG1 comprises no fail segments and is therefore determined to be reliable (S102=yes).

Thus, master device 10 skips method step S104 and proceeds to monitor the connection test path corresponding to segment SEG1 and store resulting pass/fail information (S106). Using the connection test circuit associated with segment SEG1, FSM 12 determines whether segment SEG1 is a pass segment or a fail segment. For example, the connection test circuit associated with segment SEG1 connects the connection test path corresponding to segment SEG1 to ground and FSM 12 monitors the connection test path to determine whether segment SEG1 is a pass segment or a fail segment. In the example of FIGS. 5A-5D, segment SEG1 is assumed to be a pass segment, so FSM 12 determines that segment SEG1 passes the connection test and stores information indicating that segment SEG1 is a pass segment. Thus, "PASS" is indicated below segment SEG1 in FIG. 5A.

Master device 10 then determines whether all remaining segments in the plurality of first layer segments have been tested (S108). If not, master device 10 sequentially tests (i.e., increments a segment counter to sequentially test) each remaining segment in the plurality of first layer segments (e.g., segment SEG2, then segment SEG3, and segment SEG4) using the test loop formed by method steps S102, S104 (if necessary), S106, S108, and S110.

A pass result and "PASS" indication is assumed for each one of the remaining first layer segments SEG2, SEG3, and SEG4 shown in FIG. 5A. After storing the PASS indication for segment SEG4 (S106), master device 10 determines that all segments in the plurality of first layer segments associated with master device 10 have been tested (S108=yes). Once the plurality of first layer segments has been tested, master device 10 is able to determine whether a master device 10 is "repairable" (S112). As used herein, a device is "repairable" if a passed inter-device layer connection between the device and an adjacent device is available for each signal of stacked apparatus 7. As used herein, an "inter-device layer connection" may be a "passed inter-device layer connection" or a "failed inter-device layer connection." A "passed inter-device layer connection" of a device is a conductive path capable of satisfactorily communicating an electrical signal upward/downward between the device and an adjacent device and comprises one pass segment associated with the device. In contrast, a "failed inter-device layer connection" is a connection that is not capable of satisfactorily communicating an electrical signal upward/downward between the device and an adjacent device and comprises one fail segment associated with the device.

In the working example, each of vertical connection paths 22 and 24 (and each segment in each of those vertical connection paths) is presumed to be specifically associated with first signal S1, and each of vertical connection paths 32 and 34 (and each segment in each of those vertical connection paths) is presumed to be specifically associated with electrical signal S2 (see FIGS. 1, 3A, and 3B). However, in accordance with other embodiments of the invention, vertical connection paths in a stacked apparatus need not be specifically associated with any electrical signal. In addition, among the plurality of first layer segments, segment SEG1 is associated with vertical connection path 22, segment SEG2 is associated with vertical connection path 24, segment SEG3 is associated with vertical connection path 32, and segment SEG4 is associated with vertical connection path 34. Thus, to determine that a passed inter-device layer connection between devices 10 and 20 is available for each signal of stacked apparatus 7, master device 10 must determine that at least one of first layer segments SEG1 and SEG2 (associated with first signal S1) is a passed segment and that at least one of first layer segments SEG3 and SEG4 (associated with first signal S2) is a pass segment. Since each of segments SEG1 through SEG4 is assumed to be a pass segment in the working example, master device 10 determines that the inter-device layer connections corresponding to segments SEG1 through SEG4 between master device 10 and second device 20 are each passed inter-device layer connections. Thus, master device 10 determines that a passed inter-device layer connection is available for each signal in stacked apparatus 7 and therefore determines that master device 10 is repairable (S112=yes). While only two signals (first and second signals S1 and S2) are considered relative to the working example for convenience of description, stacked apparatuses in accordance with embodiments of the invention may communicate many more signals.

Additionally, if, in another example, segments SEG1 and SEG3 were determined to be pass segments, but segments SEG2 and SEG4 were determined to be fail segments, then master device 10 would still determine that passed inter-device layer connections between master device 10 and second device 20 are available for each signal in stacked apparatus 7. In that example, inter-device layer connections corresponding to segments SEG1 and SEG3 are passed inter-device layer connections, and segments SEG1 and SEG3 are associated with first and second signals S1 and S2, respectively.

However, if, in yet another example, segments SEG1 and SEG2 (i.e., the segments in the plurality of first layer segments associated with first signal S1) are both fail segments, then there is no way to satisfactorily communicate first signal S1 via a competent vertical signal path through stacked apparatus 7. Hence, master device 10 would determine that a passed inter-device layer connection between master device 10 and second device 20 is not available for each signal in stacked apparatus 7 (specifically, for first signal S1) and would therefore determine that master device 10 is not repairable (S112=no). Master device 10 would therefore record non-repairable device information related to stacked apparatus 7 (S118). At this point, stacked apparatus 7 would fail testing and be removed from the production line. However, at a minimum, the stacked apparatus manufacturer (or a testing contractor) would have knowledge regarding the exact nature of the inter-device layer connection failures. That is, the test results accurately specify the device, the vertical connection path(s), and the corresponding segments implicated in the failure.

However, in the working example (in which each of segments SEG1 through SEG4 is a pass segment), master device 10 determines that a passed inter-device layer connection is available for each signal in stacked apparatus 7 and therefore determines that master device 10 is repairable (S112=yes). Thus, master device 10 proceeds to method step S114. Master device 10 then determines that at least one passed inter-device layer connection corresponding to first signal S1 is reliably connected to FSM 12 and at least one passed inter-device layer connection corresponding to second signal S2 is reliably connected to FSM 12 (S114=yes), so those inter-device layer connections do not need to be connected to FSM 12. Thus, master device 10 skips the method step S116 and proceeds to the method step S120. As used herein, an inter-device layer connection is "reliably connected" to FSM 12 when a path connecting the inter-device layer connection and FSM 12 comprises no fail segments.

Next, master device 10 determines whether the final plurality of segments associated with a device of stacked apparatus 7 that are to be tested have been tested (S120). If so, the method terminates. However, if one or more pluralities of segments remain to be tested in stacked apparatus 7 (S120=no), master device 10 selects the next device (S122). In the working example, additional pluralities of segments remain to be tested (S120=no), so master device 10 selects the next device, which is third device 30 (S122). To select third device 30, master device 10 uses ID GEN 14 to generate and provide second ID signal ID21 to the device select circuit of third device 30, which comprises second comparator CP2. When second comparator CP2 receives ID signal ID21, the output signal of second comparator CP2 is activated, which turns ON each of transistors T31, T32, T33, and T34, so that FSM 12 may determine whether the plurality of second layer segments (i.e., segments SEG5 through SEG8) are pass or fail segments.

Referring to FIG. 5A, second control register REG3 has already been initialized to store default data (S100), so multiplexer M5 has formed switch paths p51 and p52 and multiplexer M7 has formed switch paths p71 and p72. Beginning with segment SEG5, master device 10 determines that a current connection test path corresponding to segment SEG5 is reliable (S102=yes). This determination may be made in view of the fact that first layer segment SEG1 is a pass segment. Thus, master device 10 tests segment SEG5 using a connection test circuit comprising transistor T31 associated with segment SEG5. In the working example, the current connection test path corresponding to segment SEG5 comprises transistor T31 connecting segment SEG5 to ground, switch path p51, segment SEG5, signal path portion I11, switch path p11, segment SEG1, and connection path CN1. By monitoring connection path CN1 (i.e., monitoring the current connection test path corresponding to segment SEG5), FSM 12 determines that segment SEG5 is a pass segment and then stores the requisite PASS indication (S106). Because segment SEG5 is not the last segment in the plurality of second layer segments (S108=no), testing proceeds to the next segment (S110), which is segment SEG6. However, as indicated by the shading of segment SEG6, segment SEG6 is a fail segment, so FSM 12 determines that segment SEG6 is a fail segment and stores the FAIL indication (S106). The current connection test path corresponding to segment SEG6 comprises transistor T32 connecting segment SEG6 to ground, switch path p52, segment SEG6, signal path portion I12, switch path p12, segment SEG2, and connection path CN2. FSM 12 determines that segment SEG6 is a fail segment by monitoring connection path CN2 (i.e., by monitoring the current connection test path corresponding to segment SEG6). While segment SEG5 is a pass segment and is therefore identified by "PASS" in FIG. 5A, segment SEG6 is a fail segment and is identified by "FAIL" in FIG. 5A. FSM 12 then determines whether or not second layer segments SEG7 and SEG8 are pass or fail segments in a manner similar to that discussed above with respect to segment SEG5. As illustrated in FIG. 5A, FSM 12 determines that both second layer segments SEG7 and SEG8 are pass segments.

Master device 10 then determines that a passed inter-device layer connection between devices 20 and 30 is available for each signal of stacked apparatus 7, and therefore determines that device 20 is repairable (S112=yes), because at least one segment among segments SEG5 and SEG6 (associated with first signal 51 in the working example) is a pass segment and at least one segment among segments SEG7 and SEG8 (associated with second signal S2 in the working example) is a pass segment. In the working example, the passed inter-device layer connection comprising segment SEG5 is reliably connected to FSM 12 (e.g., through switch path p11), and the passed inter-device layer connections comprising segments SEG7 and SEG8, respectively, are each reliably connected to FSM 12 (e.g., through switch paths p31 and p32, respectively). Thus, master device 10 determines that, for each of first and second signals S1 and S2, at least one passed inter-device layer connection between devices 20 and 30 is reliably connected to FSM 12 (S114=yes). Therefore, master device 10 does not need to make those connections, so master device 10 skips method step S116 and proceeds directly to method step S120. Master device 10 then determines that at least one plurality of segments remains to be tested (S120=no), and selects the next device, which is fourth device 40 (S122).

Figure 5B:
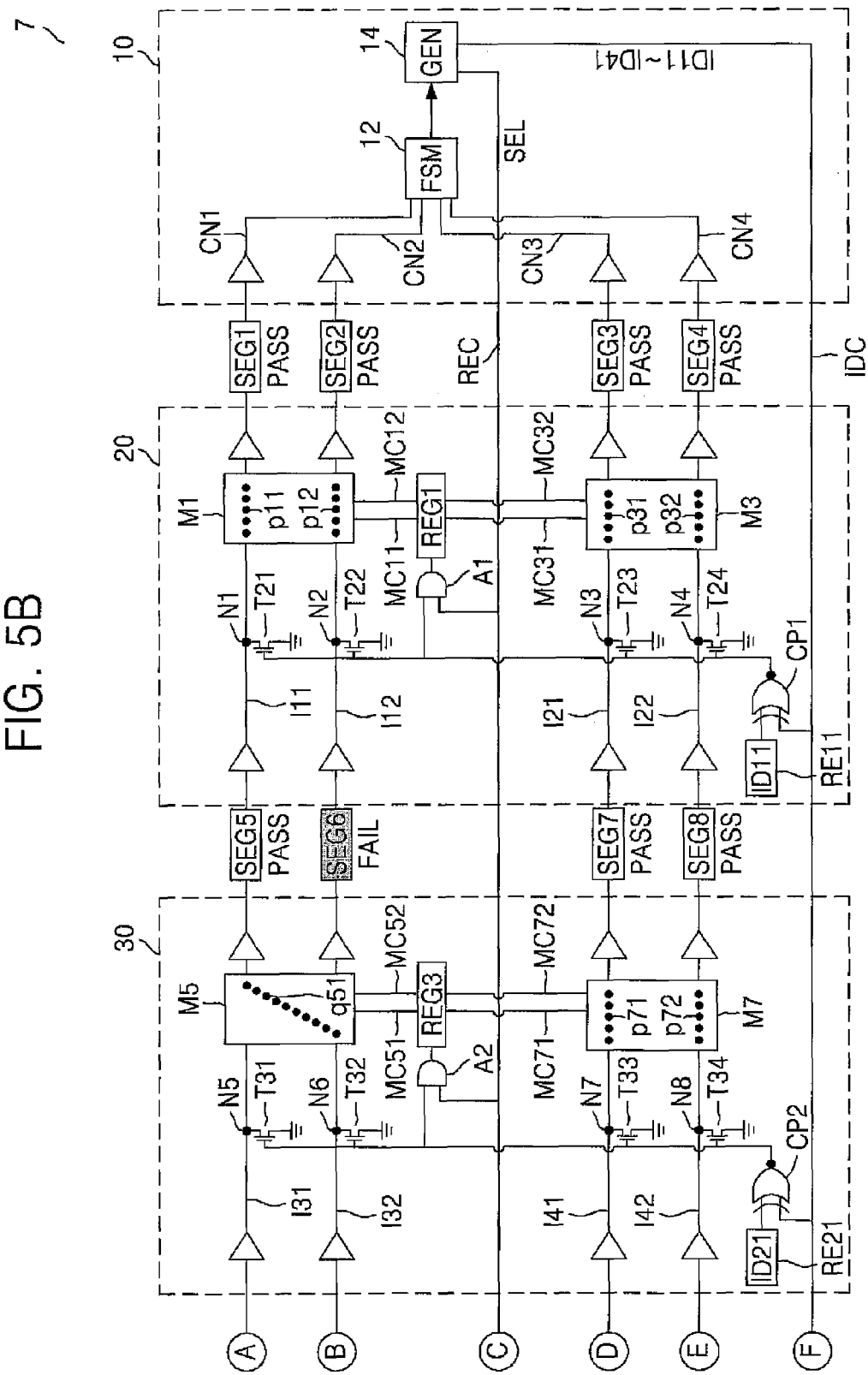
Figure 5C:
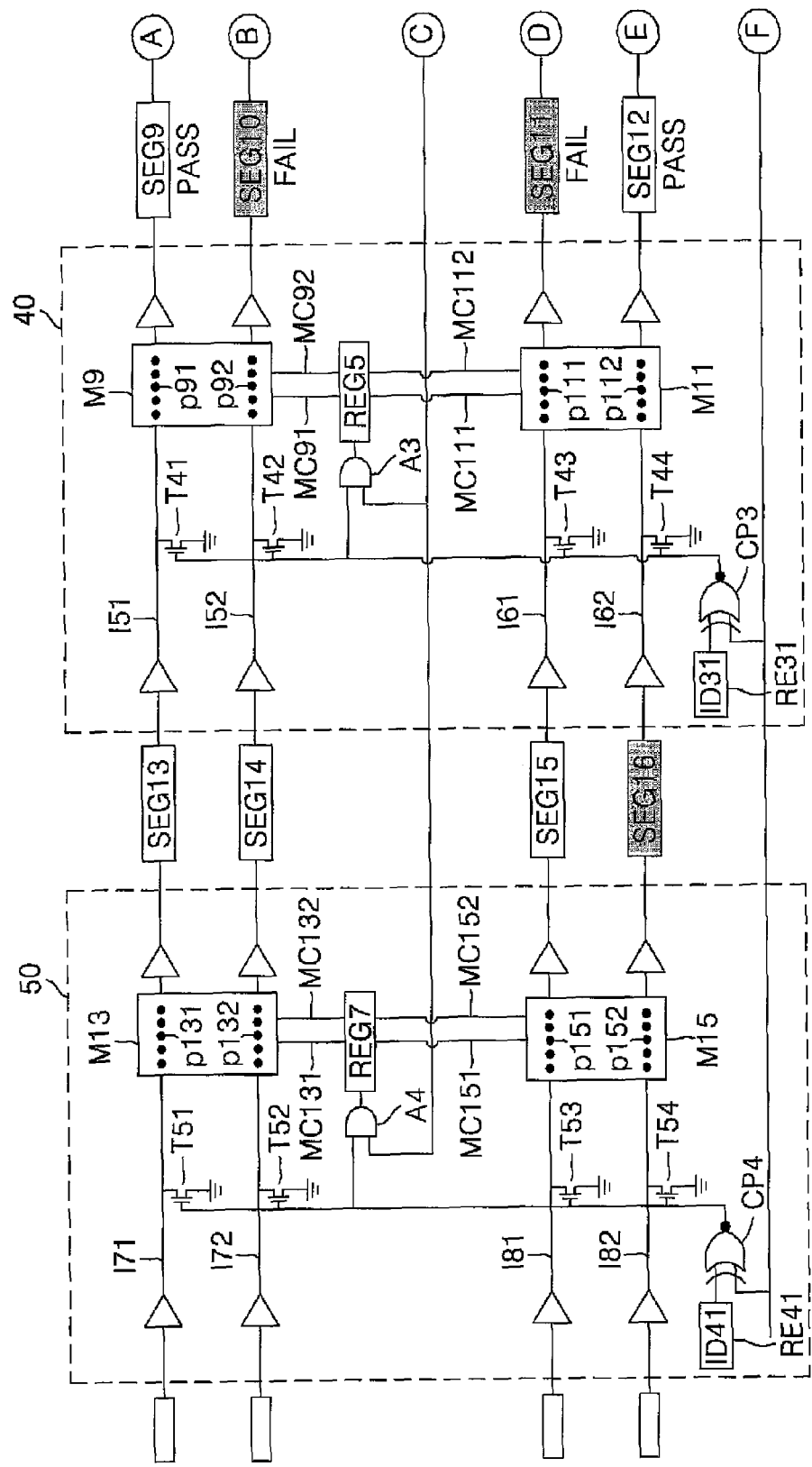
Figure 5D:
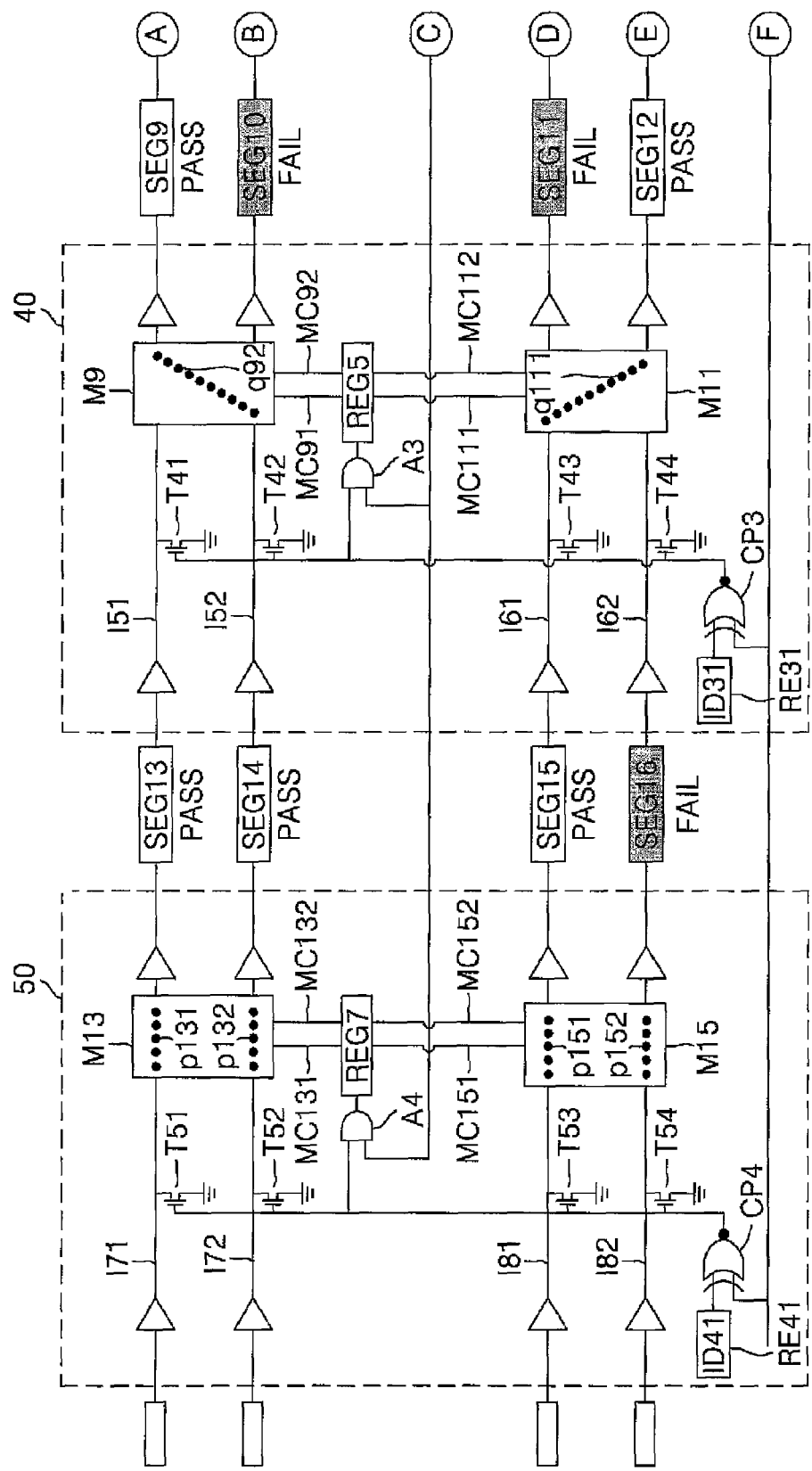

Referring to FIGS. 5A and 5C, to select fourth device 40 (S122), master device 10 uses ID GEN 14 to generate and provide third ID signal ID31 to the device select circuit associated with fourth device 40 comprising third comparator CP3. When third comparator CP3 receives the third ID signal ID31 its output signal is activated and turns ON each of transistors T41, T42, T43, and T44 so that FSM 12 may determine whether the plurality of third layer segments (SEG9 through SEG12) are pass or fail segments by monitoring reliable connection test paths corresponding to the respective segments.

Master device 10 begins with segment SEG9 and determines that the connection test path corresponding to segment SEG 9 is reliable (S102=yes) because multiplexer M5 is connecting at least segments SEG9 and SEG5 (through switch path p51), multiplexer M1 is connecting at least segments SEG5 and SEG1 (through switch path p11), and segments SEG5 and SEG1 are both pass segments. Thus, master device 10 tests segment SEG9 using a connection test circuit comprising transistor T41 associated with segment SEG9. In the working example, the connection test path corresponding to segment SEG9 comprises transistor T41 connecting segment SEG9 to ground, switch path p91, segment SEG9, signal path portion I31, switch path p51, segment SEG5, signal path portion I11, switch path p11, segment SEG1, and connection path CN1. By monitoring connection path CN1 (i.e., the connection test path corresponding to segment SEG9), FSM 12 determines that segment SEG9 is a pass segment and stores the requisite PASS indication (S106). Because segment SEG9 is not the last segment among the plurality of third layer segments (S108=no), testing proceeds to the next segment (S110), which is segment SEG10.

However, master device 10 determines that the connection test path corresponding to segment SEG10 is not reliable (S102=no). Master device 10 has previously determined that segment SEG6 is a fail segment. Thus, referring to FIGS. 5A and 5C, the current connection test path for segment SEG10, which comprises signal path portion I32, switch path p52 (in multiplexer M5), fail segment SEG6, signal path portion I12, switch path p12 (in multiplexer M1), segment SEG2, and connection path CN2, is not reliable. Therefore, referring to FIGS. 5B and 5C, master device 10 changes the data stored in second control register REG3 so that multiplexer M5 will form a switch path q51 within multiplexer M5 to connect segment SEG10 to segment SEG5 and thereby form a reliable connection test path for segment SEG10 (S104).

To form the reliable connection test path for segment SEG10, master device 10 selects third device 30 using the ID GEN 14 to generate and provide the second ID signal ID21 to second comparator CP2 of third device 30. When second comparator CP2 receives the second ID signal ID21, its output signal is activated and provided to logic circuit A2. FSM 12 then changes the data stored in second control register REG3 to cause multiplexer M5 to form switch path q51 in multiplexer M5. Changing the data stored in second control register REG3 may also disconnect switch path p52 in multiplexer M5.

Master device 10 then selects fourth device 40 using ID GEN 14 to generate and provide the third ID signal ID31 to third comparator CP3. The output signal of third comparator CP3 turns ON each of transistors T41, T42, T43, and T44 so that FSM 12 may determine whether segment SEG10 is a pass or fail segment by monitoring the connection test path corresponding to segment SEG10. Referring to FIGS. 5B and 5C, master device 10 monitors the connection test path corresponding to segment SEG10, which comprises transistor T42, a switch path p92, segment SEG10, signal path portion I32, switch path q51, segment SEG5, signal path portion I11, switch path p11, segment SEG1, and connection path CN1. By monitoring connection path CN1 (i.e., the connection test path corresponding to segment SEG10), FSM 12 determines that segment SEG10 is a fail segment and stores that indication (S106). Because segment SEG10 is not the last segment among the plurality of third layer segments (S108=no), testing proceeds to the next segment (S110), which is segment SEG11.

FSM 12 then determines whether segments SEG11 and SEG12 are pass or fail segments in a manner similar to that discussed above with regard to segment SEG9. Master device 10 does not need to change the current connection test paths corresponding to segments SEG11 and SEG12, respectively, before monitoring them. Referring to FIGS. 5B and 5C, segment SEG11 may be monitored through a connection test path comprising a switch path p71 in multiplexer M7, and segment SEG12 may be monitored through a connection test path comprising a switch path p72 in multiplexer M7. As illustrated in FIG. 5C, FSM 12 determines that segment SEG11 is a fail segment and determines that SEG12 is a pass segment.

After testing segment SEG12, master device 10 determines that all segments associated with third device 30 (i.e., all of the segments among the plurality of third layer segments) have been tested (S108=yes). Master device 10 then determines that a passed inter-device layer connection between devices 30 and 40 is available for each signal of stacked apparatus 7, and therefore determines that device 30 is repairable (S112=yes), because at least one of segments SEG9 and SEG10 (associated with first signal 51) is a pass segment, and because at least one of segments SEG11 and SEG12 (associated with second signal S2) is a pass segment. Master device 10 then determines whether, for each signal of stacked apparatus 7, at least one corresponding passed inter-device layer connections between devices 30 and 40 is reliably connected to FSM 12 (S114). In the working example, master device 10 determines that the passed inter-device layer connection between devices 30 and 40 that is available for electrical signal S1, which comprises SEG9, is not reliably connected to FSM 12 because multiplexer M5 is connecting segments SEG10 and SEG5 through at least switch path q51 (S114=no).

Thus, master device 10 stores data in second control register REG3 that causes multiplexer M5 to form at least switch path p51 (see FIG. 5A) connecting segment SEG9 to segment SEG5 (S116). The passed inter-device layer connection between devices 30 and 40 that is available for electrical signal S2 (which comprises segment SEG12) is already reliably connected to FSM 12, so no switch path(s) of multiplexer M7 needs to be changed to connect that passed inter-device layer connection to FSM 12. Master device 10 then determines that the at least one plurality of segments remains to be tested (S120=no) and selects device 50 (S122).

Referring to FIGS. 5A and 5C, master device 10 selects fifth device 50 using ID GEN 14 to generate and provide the fourth ID signal ID41 to the device select circuit associated with device 50 comprising fourth comparator CP4. Thus, the output signal of fourth comparator CP4 turns ON each of transistors T51, T52, T53, and T54 so that FSM 12 may determine whether segments SEG13 through SEG16 are pass or fail segments by monitoring connection test paths corresponding to segments SEG13, SEG14, SEG15, and SEG16, respectively. Fourth control register REG7 has already been initialized to store default data (S100), so multiplexer M13 has formed switch paths p131 and p132 and multiplexer M15 has formed switch paths p151 and p152.

Master device 10 determines that the current connection test path for segment SEG13 is reliable (S102). Master device 10 then monitors the connection test path corresponding to segment SEG13, which comprises transistor T51, switch path p131 (within multiplexer M13), segment SEG13, signal path portion 151, switch path p91, segment SEG9, signal path portion 131, switch path p51, segment SEG5, signal path portion I11, switch path p11, segment SEG1, and connection path CN1 (S106). By monitoring connection path CN1 (i.e., by monitoring the connection test path corresponding to segment SEG13), FSM 12 determines that segment SEG13 is a pass segment and stores that information (S106). Because segment SEG13 is not the last segment among the plurality of fourth layer segments (S108=no), testing proceeds to the next segment (S110), which is segment SEG14.

However, master device 10 determines that the current connection test path corresponding to segment SEG14 is not reliable at least because segment SEG10 was previously determined to be a fail segment (S102=no). Thus, master device 10 must form a reliable connection test path for segment SEG14 (S104). To form a reliable connection test path for segment SEG14, master device 10 changes the data stored in third control register REG5 to form at least one new switch path in multiplexer M9. In particular, referring to FIG. 5D, master device changes data in third control register REG5 to form switch path q92 in multiplexer M9 to connect segments SEG14 and SEG9. Master device 10 then monitors segment SEG14 using the reliable connection test path corresponding to segment SEG14, which comprises transistor T52, switch path p132 (within multiplexer M13), segment SEG14, signal path portion 152, switch path q92, segment SEG9, signal path portion 131, switch path p51, segment SEG5, signal path portion I11, switch path p11, segment SEG1, and connection path CN1 (S106). By monitoring connection path CN1 (i.e., by monitoring the reliable connection test path corresponding to segment SEG14), FSM 12 determines that segment SEG14 is a pass segment and stores that information (S106). Because segment SEG14 is not the last segment among the plurality of fourth layer segments (S108=no), testing proceeds to the next segment (S110), which is segment SEG15.

In accordance with the method corresponding to FIG. 4, master device 10 tests segments SEG15 and SEG16 in a manner similar to the manner in which it tested segments SEG13 and SEG14. Thus, master device 10 determines that a current connection test path for segment SEG15 is not reliable (S102=no) (see FIG. 5C) and uses third control register REG5 to form inter-segment connection q111 within multiplexer M11 (see FIG. 5D) to form a reliable connection test path for segment SEG15 (S104). Master device 10 then tests segment SEG15 via a reliable connection test path for segment SEG15 comprising switch path q111, segments SEG12, SEG8, and SEG4, and connection path CN4 (S106). By monitoring connection path CN4 (i.e., by monitoring the reliable connection test path for segment SEG15), FSM 12 determines that segment SEG15 is a pass segment and stores that information (S106).

Proceeding to segment SEG16 (S108=no), master device 10 determines that the current connection test path for segment SEG16 is not reliable because multiplexer M11 previously formed switch path q111 connecting segments SEG15 and SEG12, so segment SEG16 is not currently connected to FSM 12 (S102=no). Master device 10 uses fourth control register REG5 to form at least switch path p112 within multiplexer M11 (see FIG. 5C) to form a reliable connection test path (S104). In the working example, when master device 10 forms switch path p112 in multiplexer M11, it also disconnects switch path q111. Master device 10 then tests segment SEG16 via the reliable connection test path comprising switch path p112, segments SEG12, SEG8, and SEG4, and connection path CN4 (S106). By monitoring connection path CN4 (i.e., by monitoring the reliable connection test path for segment SEG16), FSM 12 determines that segment SEG16 is a fail segment and stores that information (S106).

Master device 10 then determines that a passed inter-device layer connection between devices 40 and 50 is available for each signal of the stacked apparatus 7, and therefore determines that device 40 is repairable (S112=yes), because at least one segment among segments SEG13 and SEG14 is a pass segment and at least one segment among segments SEG15 and SEG16 is a pass segment.

Then master device 10 determines that there is not at least one the passed inter-device layer connections between devices 40 and 50 for each signal that is reliably connected to FSM 12 (S114=no). In the working example, master device 10 determines that the passed inter-device layer connection comprising segment SEG15 (which is the only passed inter-device layer connection associated with first signal S1) is not connected to FSM 12 because after testing segment SEG16, multiplexer M11 is implementing at least switch path p112, and not implementing switch path q111 (S114=no).

Thus, master device 10 then stores data in third control register REG5 that causes multiplexer M11 to form at least switch path q111 (see FIG. 5D) connecting segment SEG15 to segment SEG12 (S116). Additionally, the data stored in control register REG5 may cause multiplexer M9 to form switch path p91 connecting segments SEG13 and SEG9 (see FIG. 5C) (S116) since segment SEG13 is part of a passed inter-device layer connection. Master device 10 then determines that the final set of segments that are to be tested have been tested (S120=yes).

As a result of the foregoing method, each and every segment relevant to the communication of an electrical signal in stacked apparatus 7 may be accurately characterized as a pass segment or a fail segment. The foregoing method may not characterize segments associated with fifth device 50 (e.g., segments to the left of device 50, as illustrated in FIG. 3B); however, these segments may not be necessary to the communication of electrical signals in stacked apparatus 7 at least because no device is stacked below device 50 in the working example. Switching elements, such as the multiplexers described in the illustrated embodiments, are effectively used to implement reliable test connection paths for each segment, despite the presence of certain failed segments. An accurate "mapping" of segments in stacked apparatus 7 enables the flexible, adaptive, and intelligent definition and implementation of vertical signal paths through the apparatus.

Figure 6:
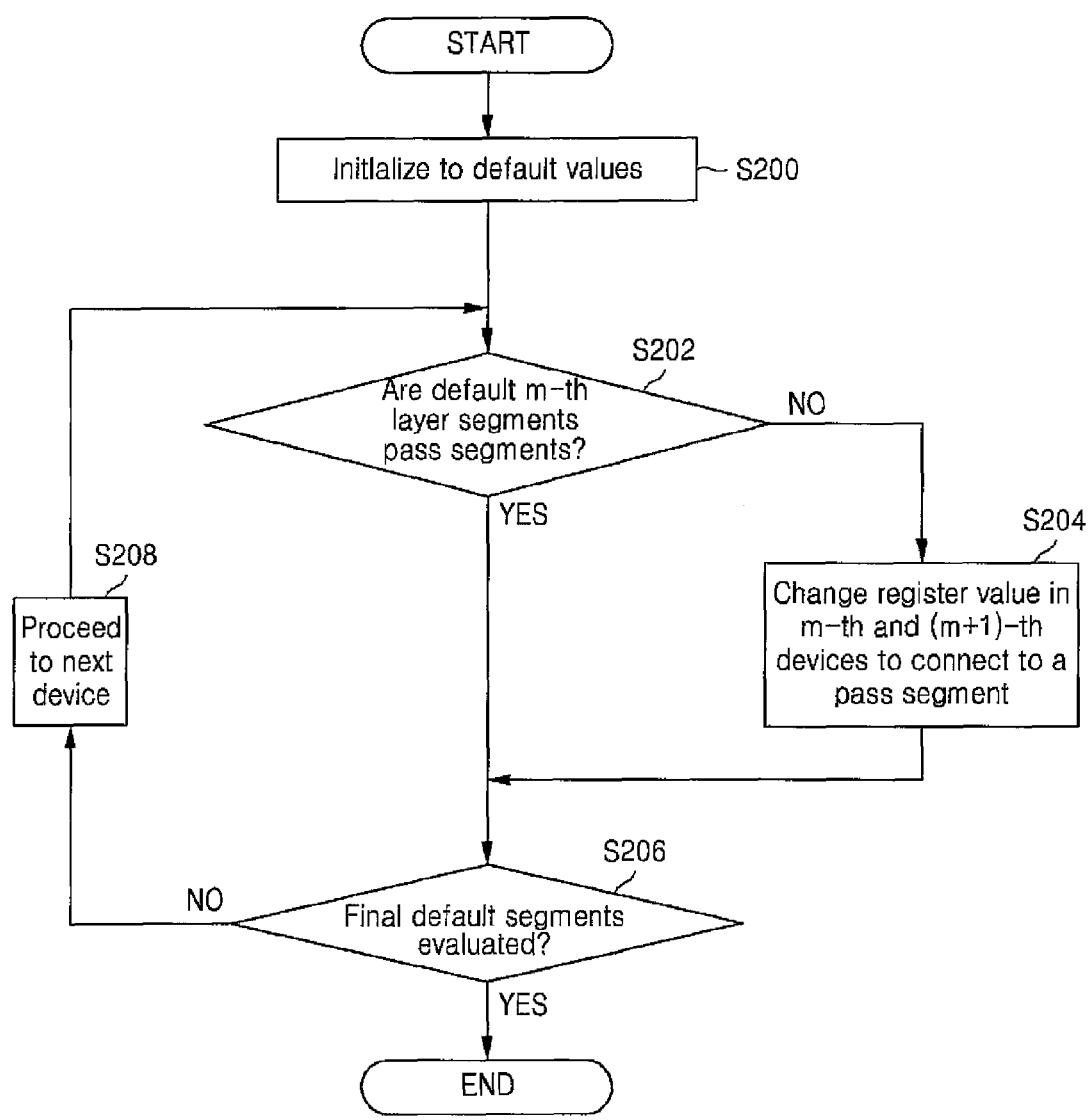
FIG. 6 is a flow chart summarizing a method of defining and implementing a plurality of "M" vertical signal paths from a plurality of "N" vertical connection paths provided in a stacked apparatus in accordance with an embodiment of the invention.
Figure 7A:
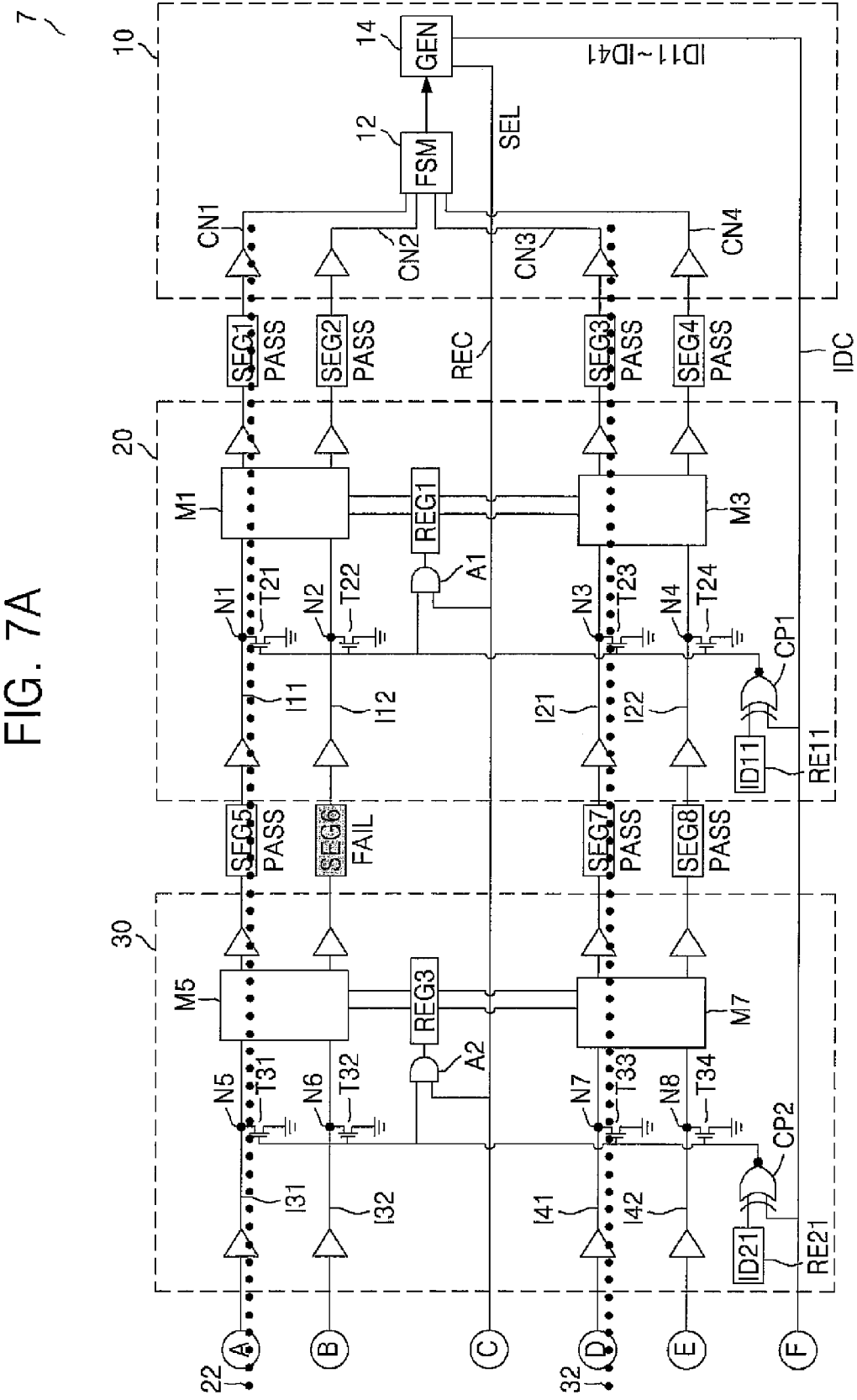
FIGS. 7A-7D each illustrate a portion of the stacked apparatus collectively illustrated in FIGS. 3A and 3B, but with additional annotations to illustrate an exemplary performance of the method corresponding to FIG. 6.

A method of defining and implementing vertical signal paths from among the vertical connection paths provided in stacked apparatus 7 will now be described with reference to FIGS. 6 and 7A-7D. FIG. 6 is a flow chart summarizing a method of defining and implementing a plurality of "M" vertical signal paths from a plurality of "N" vertical connection paths provided in a stacked apparatus in accordance with an embodiment of the invention. FIGS. 7A-7D each illustrate a portion of stacked apparatus 7 collectively illustrated in FIGS. 3A and 3B, but with additional annotations to illustrate an exemplary performance of the method corresponding to FIG. 6. FIGS. 7A and 7C correspond to FIG. 3A, and FIGS. 7B and 7D correspond to FIG. 3B. The method corresponding to FIG. 6 will be described by walking through an exemplary performance of the method on stacked apparatus 7 of FIGS. 3A and 3B with reference to FIGS. 7A-7D.

Figure 7B:
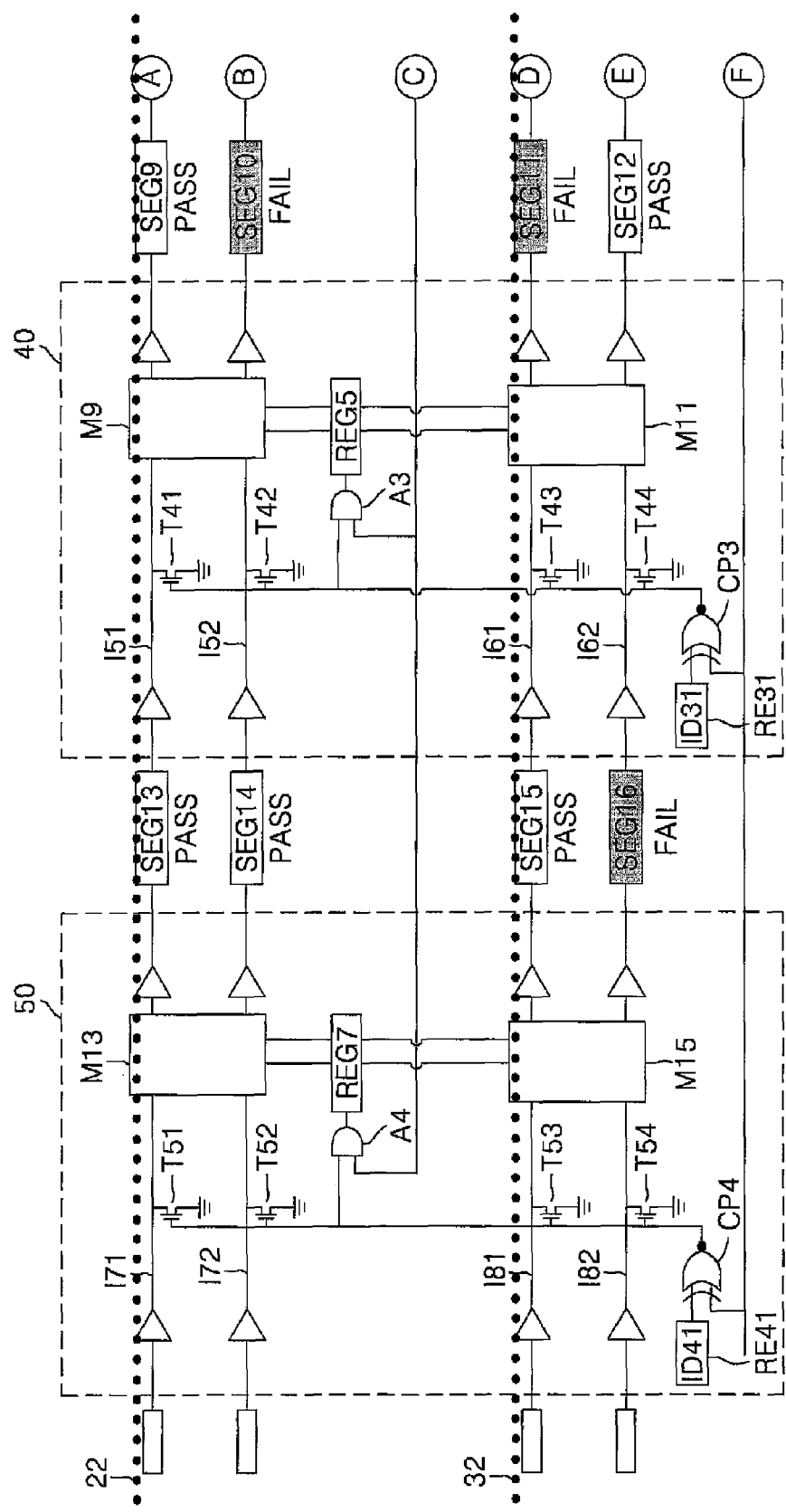
Figure 7C:
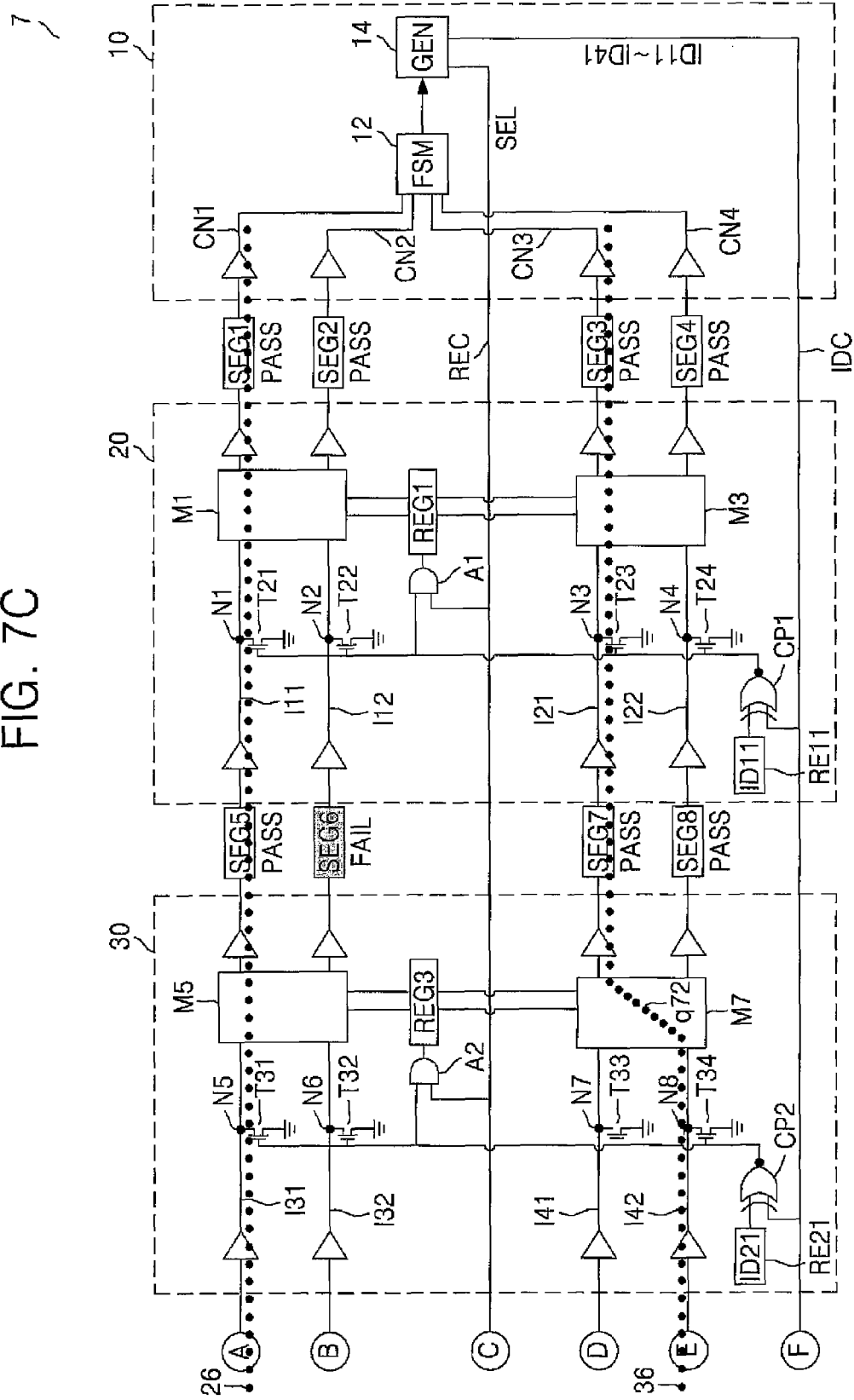
Figure 7D:
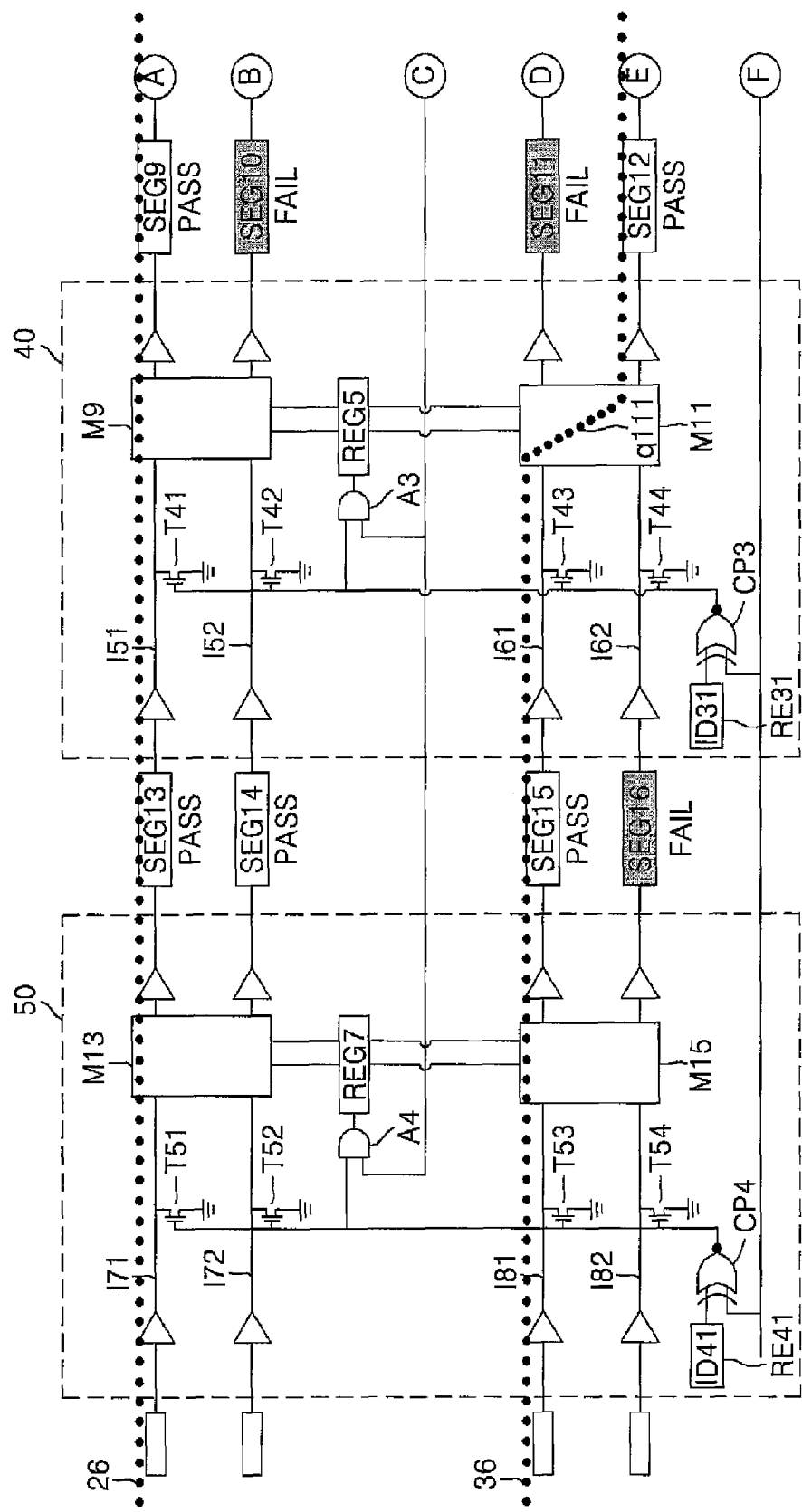

Referring to FIGS. 6, 7A, and 7B, master device 10 initializes each of control registers REG1, REG3, REG5, and REG7 to store default data (S200). When first through fourth control registers REG1 through REG7 store the default data, those control registers control the corresponding switching elements (e.g., multiplexers) such that they form default switch paths. In the example illustrated in FIGS. 7A-7D, the default switch paths include, for example, switch path p11 (FIG. 5A) connecting second layer segment SEG5 with first layer segment SEG1, switch path p51 (FIG. 5A) connecting third layer segment SEG9 with second layer segment SEG5, switch path p91 (FIG. 5C) connecting fourth layer segment SEG13 with third layer segment SEG9, and switch path p131 (FIG. 5C) connecting signal path portion 171 with fourth layer segment SEG13. Thus, master device 10 selects, as a default option, vertical connection path 22 as the vertical signal path associated with first signal S1. The default switch paths also include switch path p31 between segments SEG7 and SEG3, switch path p71 between segments SEG11 and SEG7, switch path p111 between segments SEG15 and SEG11, and switch path p151 between SEG15 and signal path portion 181. (See FIGS. 5A and 5C). Hence, relative to the example illustrated in FIGS. 7A and 7B, the default switch paths yield the ultimate identification of vertical connection path 22 as a viable, non-merged vertical signal path capable of satisfactorily communicating signal 51 through stacked apparatus 7. However, this is not the case for vertical connection paths 24, 32, and 34 (see FIGS. 3A and 3B).

As part of initializing the default values (S200), device 10 is assumed to select as a second default connection path, vertical connection path 32. While the vertical connection paths 22 and 32 were selected as first and second default connection paths, vertical connection paths 24 and 34 were not selected, but remain as "spare connection paths" (see FIGS. 3A and 3B).

Next, FSM 12 determines whether the default $m^{th}$ layer segments are pass segments (S202). As used herein, a "default segment" is a segment that is part of one of the default connection paths. In addition, segments associated with master device 10 (i.e., segments SEG1 through SEG4 in the working example) may also be referred to herein as first layer segments (and segments associated with the second device may be referred to as second layer segments, etc.). Thus, for example, the default first layer segments are segment SEG1, which is part of first default connection path 22, and segment SEG3, which is part of second default connection path 32. Accordingly, at step S202, FSM 12 determines whether the default first layer segments (i.e., segments SEG1 and SEG3) are pass segments (S202).

FSM 12 has previously stored information indicating that segments SEG1 and SEG3 are both pass segments in accordance with the method described above with regard to FIG. 4. Thus, FSM 12 determines that the default first layer segments (i.e., segments SEG1 and SEG3) are pass segments (S202=yes). Then, the FSM 12 or other control logic resident on master device 10 or connected through master device 10 then determines that the final set of default layer segments to be evaluated have not yet been evaluated (S206=no), and proceeds to the next device (S208), which is second device 20.

Master device 10 then determines whether the default second layer segments (i.e., segments SEG5 and SEG7) are pass segments (S202). In a manner similar to the procedure described above with regard to segments SEG1 and SEG3, master device 10 determines that segments SEG5 and SEG7 are pass segments (S202=yes). Subsequently, master device 10 determines that the final set of default layer segments to be evaluated have not yet been evaluated (S206=no), and proceeds to the next device (S208), which is third device 30.

Thus, master device 10 then determines whether the default third layer segments (i.e., the default segments associated with third device 30, which are segments SEG9 and SEG11) are pass segments in a manner similar to the procedure described above with regard to the default first layer segments (S202). However, while master device 10 has previously stored information indicating that segment SEG9 is a pass segment, it has also stored information indicating that segment SEG11 is a fail segment. Thus, not all of the default third layer segments are pass segments (S202=no), so master device 10 must change data stored in control registers of third device 30 (the $m^{th}$ device) and fourth device 40 (the $(m+1)^{th}$ device) to connect those devices to a pass segment among the plurality of third layer segments (i.e., a pass segment associated with device 30) instead of third layer segment SEG11. That is, master device 10 must reroute second default connection path 32 around default third layer segment SEG11, which is a fail segment. Referring to FIGS. 7A-7D, master device 10 reroutes second default connection path 32 around fail segment SEG11 by changing the data stored in second control register REG3 to cause multiplexer M7 to form switch path q72 (FIG. 7C) connecting second layer segment SEG7 with third layer segment SEG12, and by changing the data stored in the third control register REG5 to cause multiplexer M11 to form switch path q111 (FIG. 7D) connecting segments third layer segment SEG12 with fourth layer segment SEG15 (S204). In this manner, master device 10 connects pass segments from different vertical connection paths 32 and 34 (i.e., segments SEG15 and SEG7 from vertical connection path 32 and segment SEG12 from vertical connection path 34) to ultimately form a viable, merged vertical signal path 36. Connecting two segments of different vertical connection paths may be referred to herein as "merge-connecting" the two segments. For example, master device 10 merge-connects second layer segment SEG7 (of vertical connection path 32) and third layer segment SEG12 (of vertical connection path 34) by forming switch path q72, as described above. Subsequently, master device 10 determines that the final set of default layer segments to be evaluated have not yet been evaluated (S206=no), and proceeds to the next device (S208), which is fourth device 40.

Master device 10 then determines whether the default fourth layer segments (i.e., the default segments associated with fourth device 40, which are segments SEG13 and SEG15) are pass segments (S202). In a manner similar to the procedure described above with regard to the default first layer segments, master device 10 determines that segments SEG13 and SEG15 are pass segments (S202=yes). Then, master device 10 determines that the final set of default layer segments to be evaluated have been evaluated (S206=yes).

Thus, after detecting fail segments using the method corresponding to FIG. 4, master device 10 may use that information in the method corresponding to FIG. 6 to define and implement vertical signal paths (including both non-merged vertical signal paths and merged vertical signal paths) through stacked apparatus 7. In the example illustrated in FIGS. 7A-7D, master device 10 defines and/or implements two (2) vertical signal paths 26 and 36 using four (4) vertical connection paths 22, 24, 32, and 34. Vertical signal path 36 is a merged vertical signal path using at least one segment from each of vertical connection paths 32 and 34. On the other hand, vertical signal path 26 is a non-merged vertical signal path corresponding to vertical connection path 22, which only comprises pass segments.

In embodiments of the invention described above with regard to FIGS. 1-7D, two or more vertical connection paths have been associated with an electrical signal. However, in accordance with additional embodiments of the invention, "M" vertical signals paths communicating at least M different signals may be implemented in a stacked apparatus using "N" vertical connection paths, where N is greater than M. It is possible that one or more vertical connection paths may be particularly associated with a given signal and/or vertical signal path. However, this need not be the case. Indeed, all segments provided by all N vertical connection paths may be used as resources to define and implement the required M vertical signal paths. FIG. 2 illustrates stacked apparatus 7, which comprises four vertical connection paths comprising segments SEG1 through SEG16, and two of the vertical connection paths are associated with the first signal 51 while the other two of the vertical connection paths are associated with the second signal S2. However, in accordance with another embodiment of the invention, FIG. 8 illustrates a stacked apparatus 8 comprising eight (N=8) vertical connection paths 41-48 comprising segments SEG1 through SEG32 used to define and implement four (M=4) vertical signal paths communicating first through fourth signals S1-S4. In the embodiment illustrated in FIG. 8, each of vertical connection path 41-48 comprises four of segments SEG1 through SEG32. For example, a first vertical connection path 41 comprises segments SEG1, SEG9, SEG17, and SEG25. In addition, none of the eight vertical connection paths 41-48 of stacked apparatus 8 is particularly associated with any one of first through fourth signals S1-S4.

FIG. 9 further illustrates stacked apparatus 8 in accordance with an embodiment of the invention. FIG. 9 includes annotations showing fail segments and ultimately defined vertical signal paths through stacked apparatus 8. In the embodiment illustrated in FIG. 9, stacked apparatus 8 comprises eight vertical connection paths, many of which include one or more fail segments. In FIG. 9, each fail segment is indicated with an "X", and segments that are not indicated with an "X" are pass segments. In addition, in the embodiment illustrated in FIG. 9, each of the five (5) possible vertical signal paths extending though stacked apparatus 8 is a merged vertical signal path. In particular, the five (5) possible vertical signal paths extending though stacked apparatus 8 are merged vertical signal paths 31 through 35. However, it should be noted that the five (5) possible vertical signal paths are not equal in physical length. For example, vertical signal path 35 is significantly longer than vertical signal path 31. Given the increasingly high speed at which electrical signals are communicated through contemporary stacked apparatuses, vertical signal paths having significantly unequal lengths raises a number of issues related to signal flight time, signal group slew, signal noise reflections, etc.

Figure 10A:
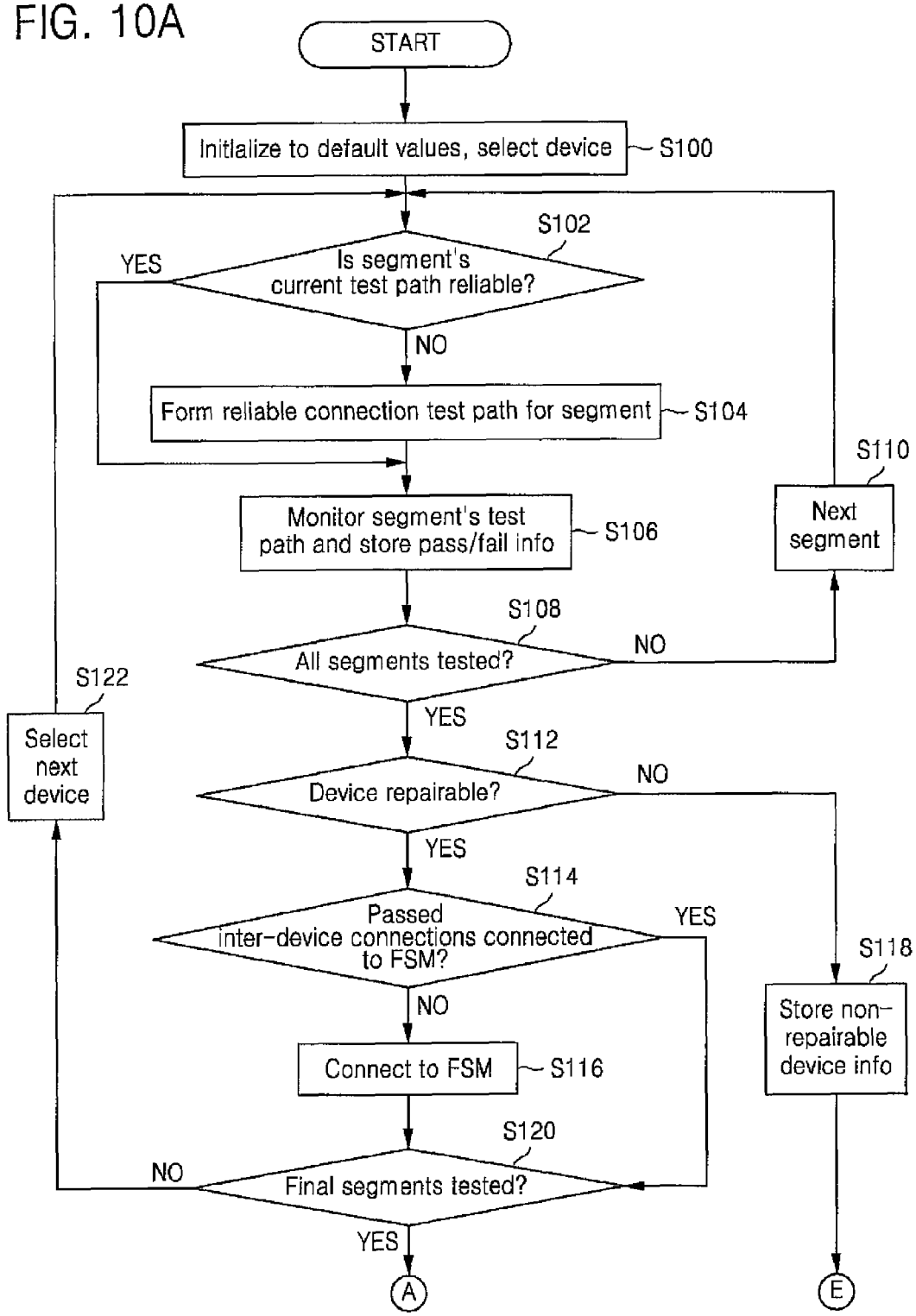
FIGS. 10A and 10B collectively illustrate a flow chart summarizing a method of detecting pass and fail segments in a stacked apparatus and obtaining path weight information in accordance with an embodiment of the invention.
Figure 10B:
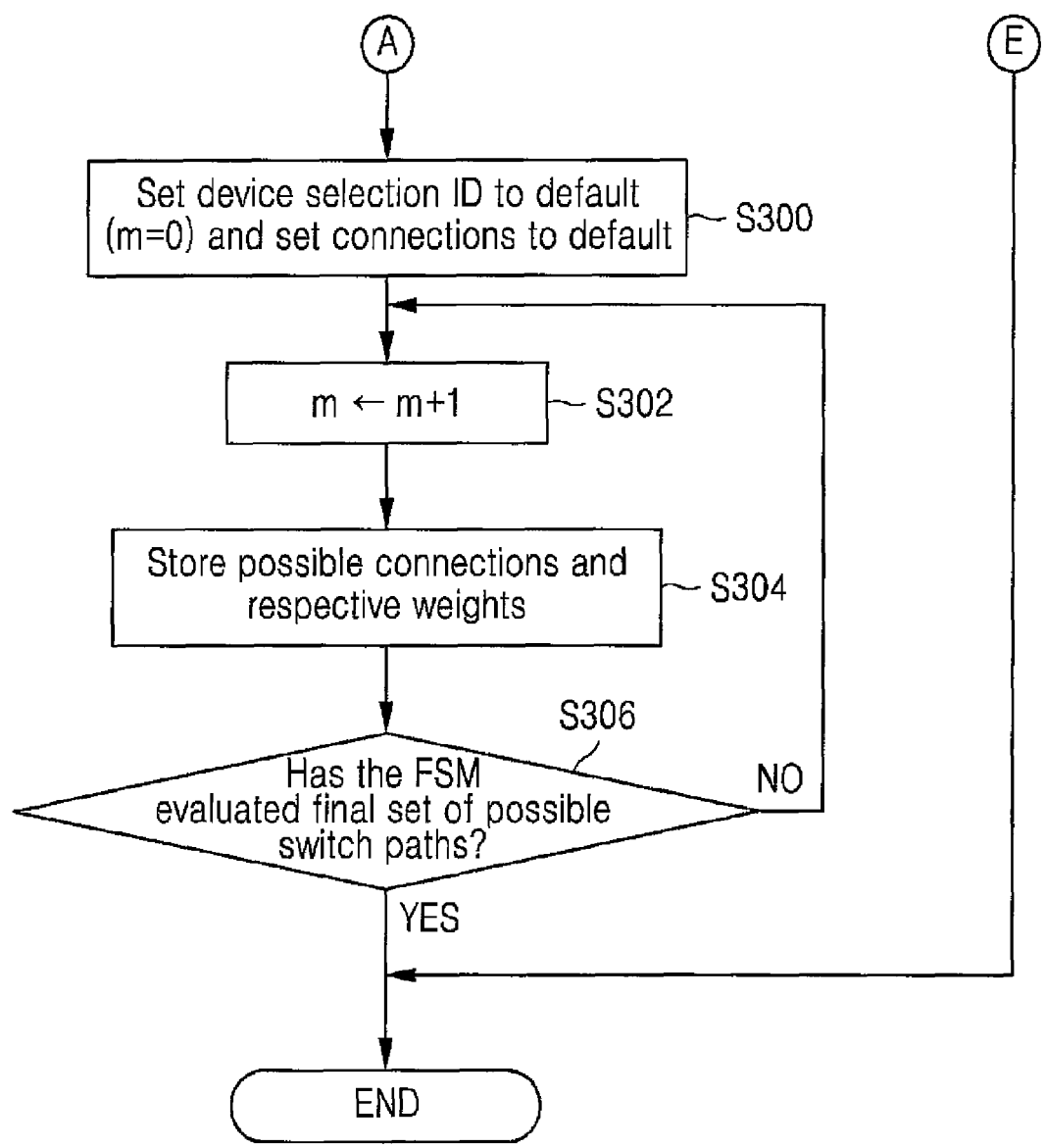
Figure 11:
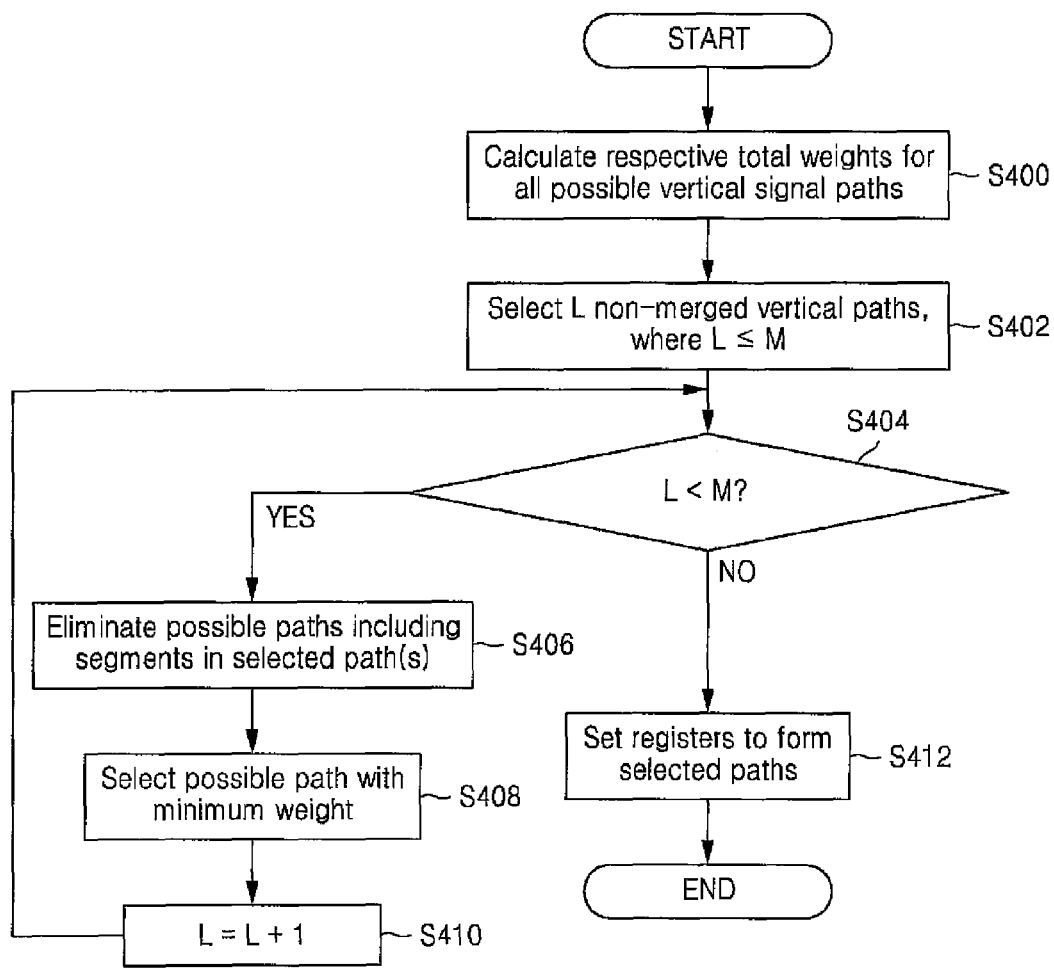
FIG. 11 is a flow chart summarizing a method of forming vertical signal paths in a stacked apparatus using path weight information in accordance with an embodiment of the invention.

FIGS. 10A and 10B collectively illustrate a flow chart summarizing a method of detecting pass and fail segments in a stacked apparatus and obtaining path weight information in accordance with an embodiment of the invention. FIG. 11 is a flow chart summarizing a method of forming vertical signal paths in a stacked apparatus using the path weight information in accordance with an embodiment of the invention. FIGS. 12-17 each illustrate a portion of stacked apparatus 8 and the annotations included in those figures illustrate the performance of the methods corresponding to FIGS. 10A, 10B, and 11 on the portion of stacked apparatus 8 illustrated in FIG. 12, for example. That is, an exemplary performance of the method corresponding to FIGS. 10A, 10B, and 11 will be described with regard to the portion of exemplary stacked apparatus 8 illustrated in FIG. 12, and that portion comprises devices 10, 20, 30, and 40.

Figure 12:
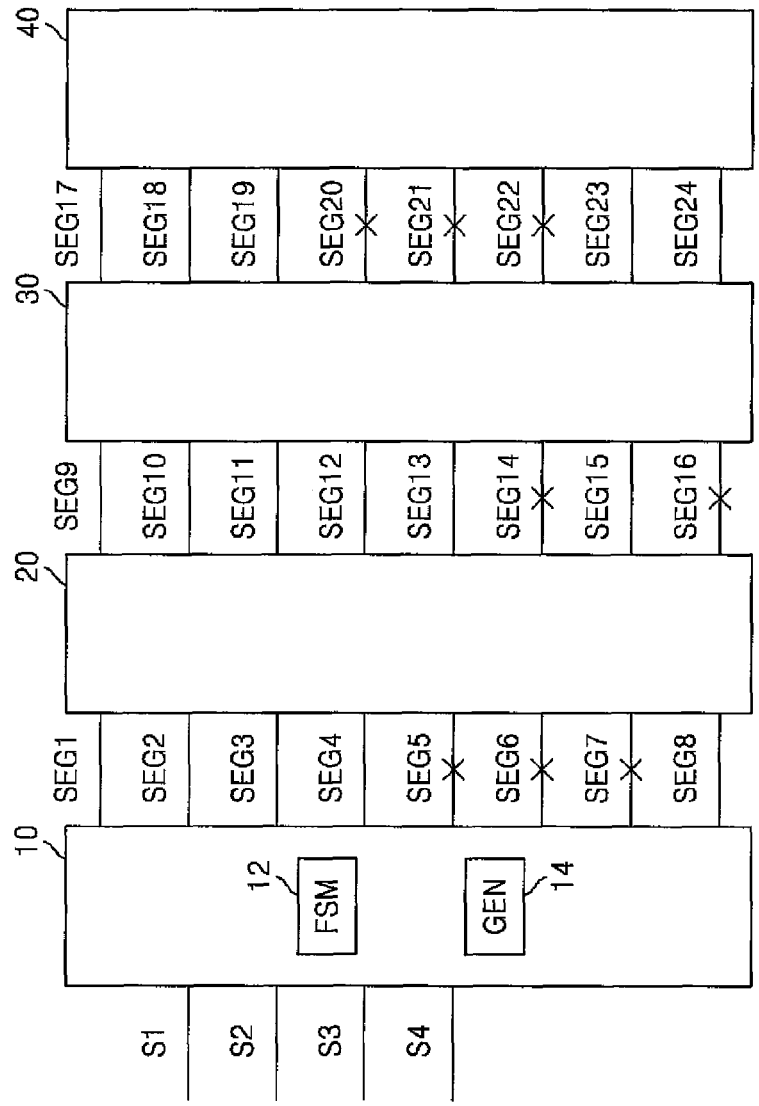
FIG. 12 illustrates a portion of the stacked apparatus of FIG. 8 and includes annotations illustrating an exemplary performance of a portion of the method corresponding to FIGS. 10A and 10B on the portion of the stacked apparatus of FIG. 8.

Referring to FIG. 12, the portion of the method corresponding to FIG. 10A may be performed by stacked apparatus 8 to determine which segments among segments SEG1 through SEG24 are pass segments and which are fail segments. FIG. 10A incorporates the steps of the method summarized in FIG. 4, so description of those steps will not be repeated here. By performing the portion of the method corresponding to FIG. 10A, information indicating which of segments SEG1 through SEG24 are pass segments and which are fail segments is stored in FSM 12 of stacked apparatus 8. As shown in FIG. 12, in the working example, FSM 12 has determined that segments SEG5, SEG6, SEG7, SEG14, SEG16, SEG20, SEG21, and SEG22 are fail segments (and each of those segments is indicated with an "X" to show that it is a fail segment), and has determined that the remaining segments are pass segments (absence of an "X" indicates a pass segment). In addition, segments associated with master device 10 (i.e., segments SEG1 through SEG8) may be referred to as a plurality of first layer segments SEG1 through SEG8. Likewise, segments associated with second device 20 (i.e., segments SEG9 through SEG16) may be referred to as a plurality of second layer segments SEG9 through SEG16, and segments associated with third device 30 (i.e., segments SEG17 through SEG24) may be referred to as a plurality of third layer segments SEG17 through SEG24.

After performing the portion of the method corresponding to FIG. 10A, stacked apparatus 8 proceeds to the portion of the method corresponding to FIG. 10B. The portion of the method illustrated in FIG. 10A proceeds to the portion illustrated in FIG. 10B through either connection A or connection E illustrated in both FIGS. 10A and 10B. If performance of the method proceeds through connection E, then performance of the method terminates.

Figure 13:
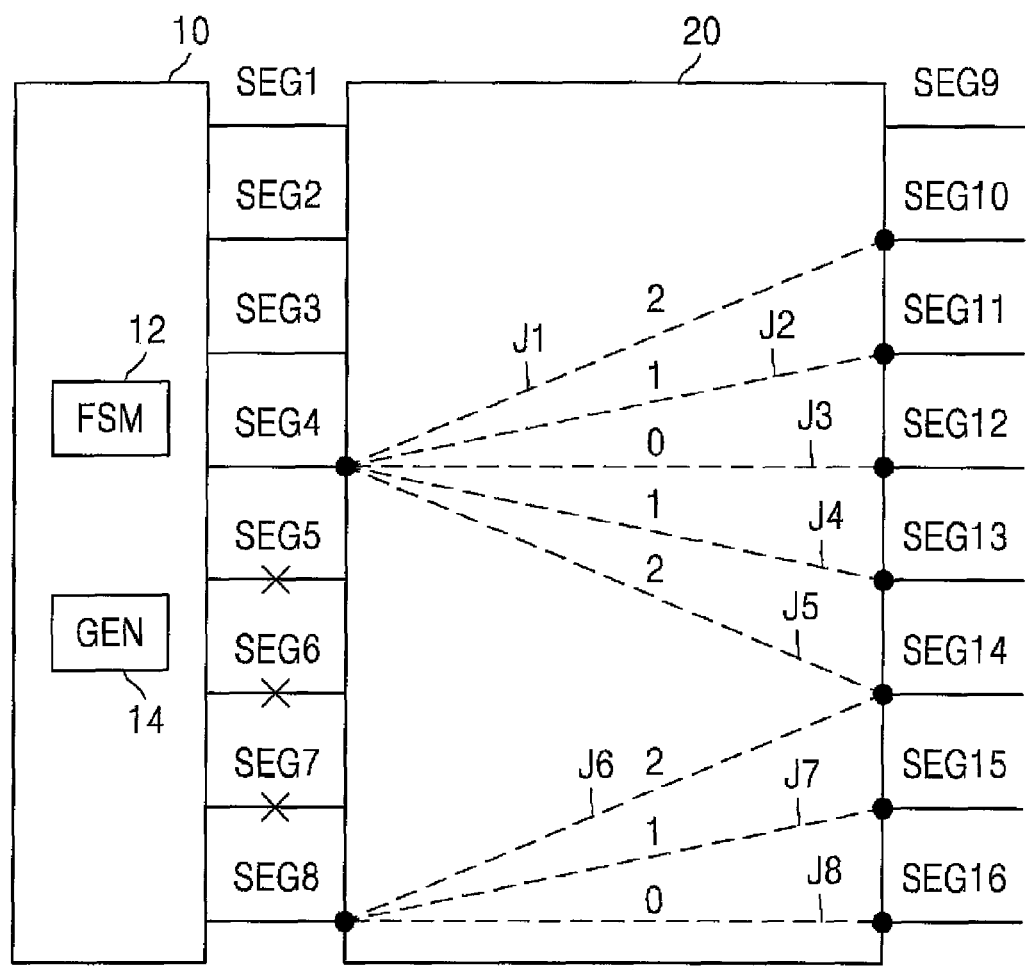
FIG. 13 illustrates a portion of the stacked apparatus of FIG. 12 and includes annotations partially illustrating an exemplary performance of another portion of the method corresponding to FIGS. 10A and 10B on the portion of the stacked apparatus of FIG. 12.

However, if performance of the method proceeds through connection A, then after master device 10 determines that the final plurality of segments associated with a device of stacked apparatus 8 that is to be tested (e.g., the plurality of third layer segments SEG17 through SEG24) has been tested (S306=yes), master device 10 proceeds to set a device selection ID to a default value (e.g., m=0) and initializes registers in devices 20, 30, and 40 to store default data to set default switch paths within stacked apparatus 8 (S300). In accordance with an embodiment of the invention, the default switch paths of stacked apparatus 8 may be analogous to the default switch paths described above with regard to stacked apparatus 7. After the default switch paths are set, master device 10 increments the device selection value (S302). Referring to FIG. 13, device 20 may be the current device when device selection ID m is equal to 1.

Next, master device 10 will store information regarding possible switch paths in the current device and the respective signal path weight value for each of those possible switch paths (S304). For example, master device 10 may then store information regarding each of the plurality of possible switch paths between first layer segments SEG1 through SEG8 associated with device 10 and second layer segments SEG9 through SEG16 associated with device 20. FIG. 13 shows some of the possible switch paths in device 20, and in particular, shows possible switch paths for connecting first layer segment SEG4 to various second layer segments associated with device 20. FIG. 13 also shows possible switch paths for connecting first layer segment SEG8 to various second layer segments associated with device 20. For example, FIG. 13 shows possible switch paths between first layer segment SEG4 and each of second layer segments SEG10 through SEG14, which are possible switch paths J1 through J5, respectively. FIG. 13 also shows possible switch paths between first layer segment SEG8 and each of second layer segments SEG14 through SEG16, which are possible switch paths J6 through J8, respectively.

FIG. 13 also illustrates the signal path weight values for each of possible switch paths J1 through J8.

In the example described with regard to FIGS. 12-17, master device 10 only stores information regarding possible switch paths that have signal path weight values within a range of 0-2. However, master device 10 may, for example, store information regarding possible switch paths having signal path weight values within a different range. Although not illustrated, FSM 12 also stores possible switch paths corresponding to each of first layer segments SEG1, SEG2, and SEG3 that have signal path weight values equal to 0, 1, or 2. FSM 12 does not store possible switch paths corresponding to any of first layer segments SEG5, SEG6, or SEG7 because each of those is a fail segment and will not form part of a vertical signal path. As used herein, a "signal path weight value" may correspond to, for example, the propagation delay of a switch path.

Figure 14:
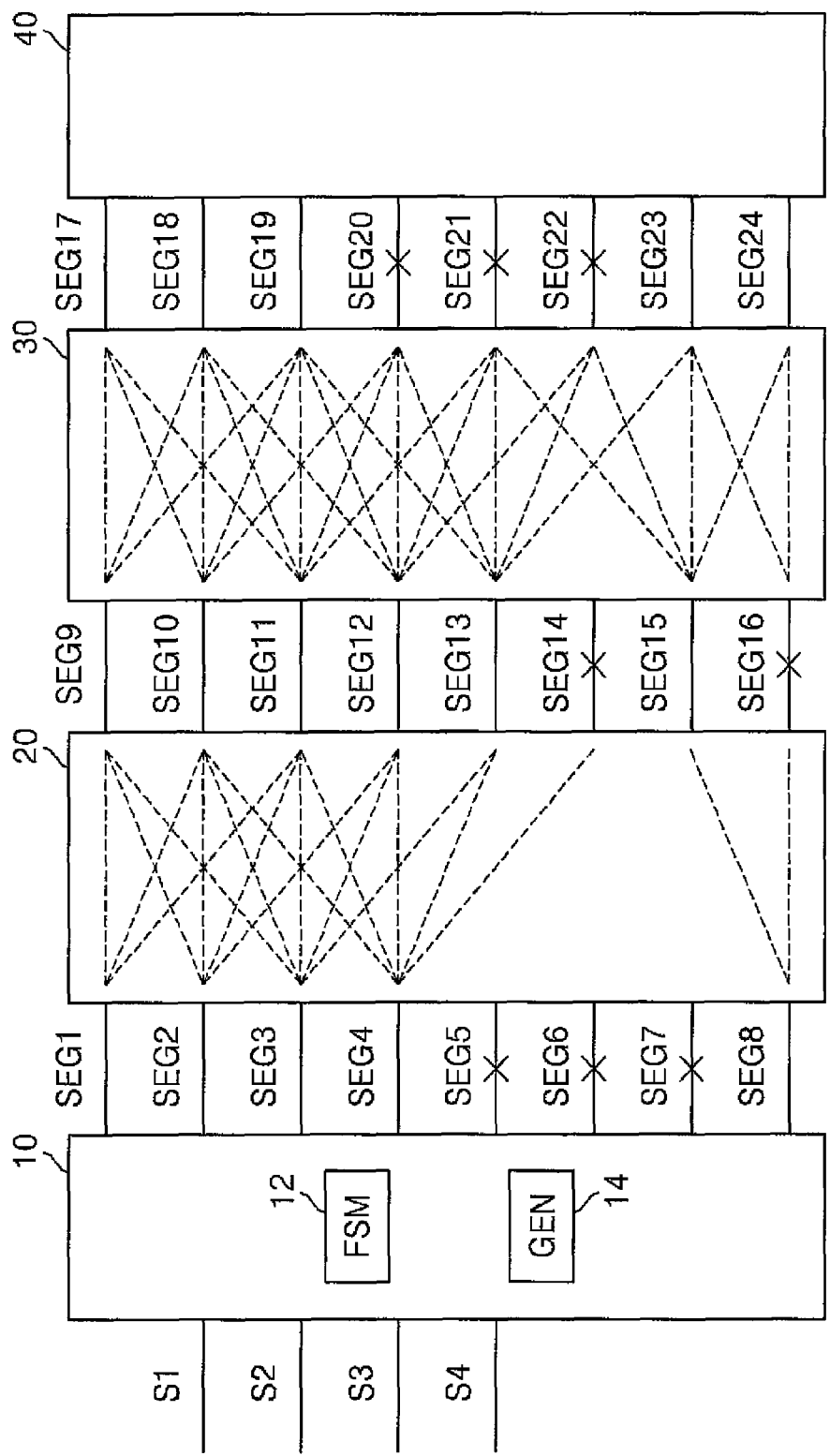
FIG. 14 further illustrates the stacked apparatus of FIG. 12 and includes annotations partially illustrating a stage in an exemplary performance of a method corresponding to FIGS. 10A and 10B on the stacked apparatus of FIG. 12.

Because master device 10 (or, more specifically, FSM 12) has not evaluated the final set of switch paths (i.e., the set of possible switch paths associated with third device 30) (S306), master device 10 increments the device selection ID (S302) and performance of the method continues. Thus, the device selection ID becomes m=2, and third device 30 becomes the current device. Master device 10 then stores the possible switch paths of third device 30, which are possible switch paths between second layer segments associated with second device 20 and third layer segments associated with third device 30, and their respective signal path weight values (S304). That is, master device 10 stores the possible switch paths between pass segments among the plurality of second layer segments (i.e., second layer segments SEG9 through SEG13 and second layer SEG15) and the plurality of third layer segments SEG17 through SEG24. FIG. 14 illustrates possible switch paths stored in FSM 12. Then, because master device 10 has evaluated the final set of possible switch paths that are to be evaluated (S306=yes), performance of the method terminates.

With knowledge of weighting factors associated with all of the possible switch paths, a conventionally defined least-cost algorithm may be used to define a set of vertical signal paths having the least or most uniform weights, which will correspond to sets of shortest vertical signal paths or vertical signal paths having the most similar lengths.

Thus, after performing the method corresponding to FIGS. 10A and 10B, information indicating which segments in stacked apparatus 8 of FIG. 12, for example, are pass segments and which are fail segments, and information indicating possible switch paths and their respective signal path weight values, is stored in FMS 12.

Subsequently, in accordance with an embodiment of the invention, a competent algorithm using the possible switch paths and their respective signal path weight values may be used to select and form vertical signal paths in stacked apparatus 8. The vertical signal paths selected and formed by the algorithm may include merged vertical signal paths. As one example, stacked apparatus 8 may use an algorithm that minimizes the total signal path weight value for each of the vertical signal paths to select and create the vertical signal paths. Alternatively, stacked apparatus 8 may use an algorithm that creates vertical signal paths having similar total signal path weight values. As used herein, a "total signal path weigh value" for a vertical signal path is the sum of all of the signal path weight values of the switch paths that form part of that vertical signal path. In addition, total signal path weight value may correspond to a total propagation delay of a vertical signal path. Also, the algorithm that stacked apparatus 8 uses may be performed by hardware in master device 10 or by software at master device 10, for example.

FIG. 11 is a flow chart summarizing a method of selecting and creating M vertical signal paths in a stacked apparatus, wherein the method seeks to minimize the total signal path weight value of each of the M vertical signal paths. In particular, after possible switch paths in stacked apparatus 8 and their respective signal path weight values have been stored in FSM 12 by performing the method corresponding to FIGS. 10A and 10B, stacked apparatus 8 may use the method corresponding to FIG. 11 to select and create M vertical signal paths in stacked apparatus 8. In the example corresponding to FIGS. 15-17, M is equal to 4.

Figure 15:
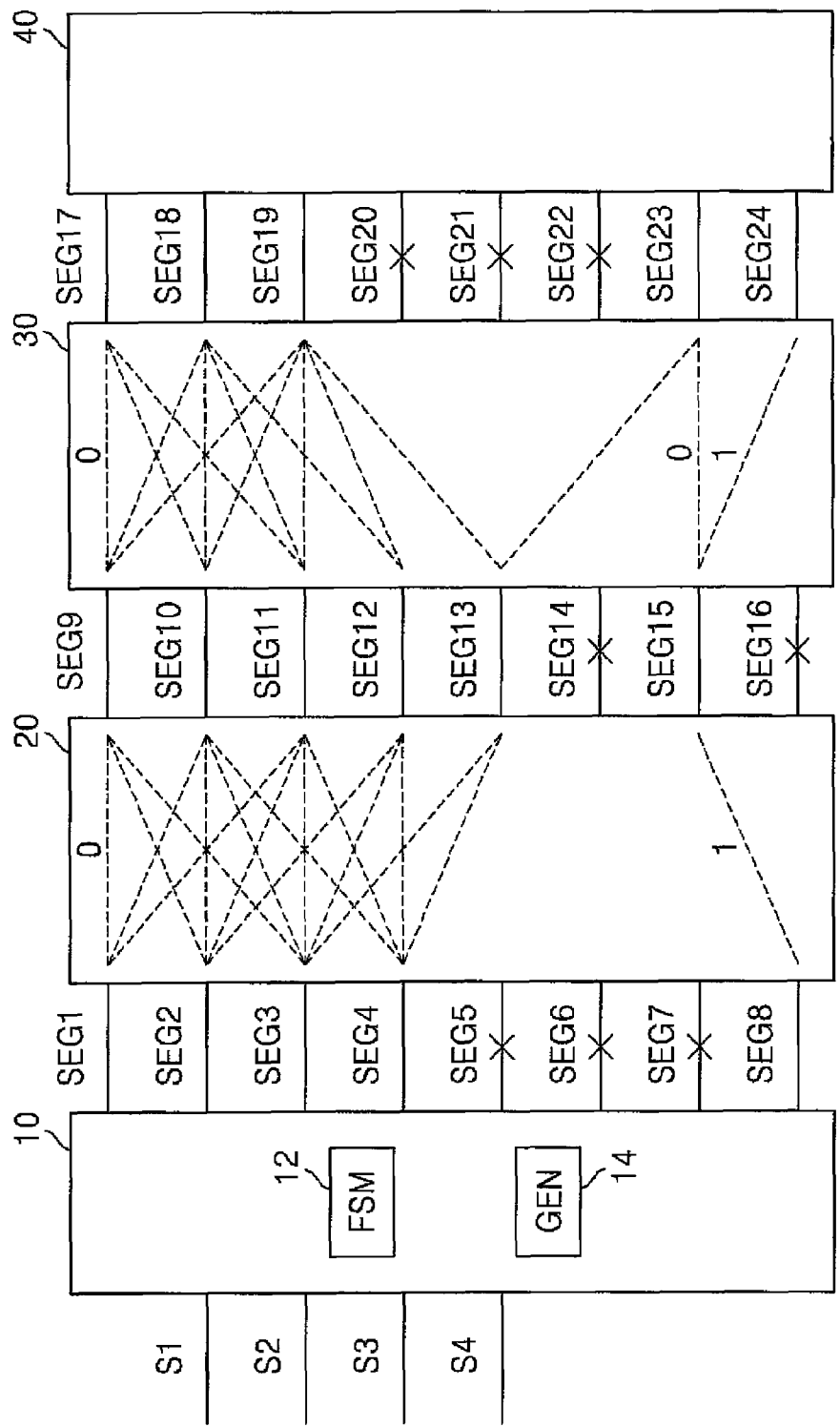
FIG. 15 further illustrates the stacked apparatus of FIG. 12 and includes annotations partially illustrating a stage in an exemplary performance of a method corresponding to FIG. 11 on the stacked apparatus of FIG. 12.

Referring to FIGS. 11 and 15-17, master device 10 calculates the total signal path weight values for all of the possible vertical signal paths in stacked apparatus 8 using the previously stored signal path weight values for the possible switch paths in stacked apparatus 8 (S400). FIG. 15 illustrates the possible vertical signal paths in stacked apparatus 8. Possible signal paths in stacked apparatus 8 that form connections with fail segments are not included in any of the possible vertical signal paths. FIG. 15 also illustrates signal path weight values for some of the possible signal paths in stacked apparatus 8. In particular, FIG. 15 shows that the possible signal path connecting segments SEG1 and SEG9 has a signal path weight value of 0, and that the possible signal path connecting segments SEG9 and SEG17 has a signal path weight value of 0. FIG. 15 also shows that the possible signal path connecting segments SEG8 and SEG15 has a signal path weight value of 1, the possible signal path connecting segments SEG15 and SEG23 has a signal path weight value of 0, and the possible signal path connecting segments SEG15 and SEG24 has a signal path weight value of 1. Thus, the total signal path weight value for a possible vertical signal path comprising segments SEG1, SEG9, and SEG17 is 0. In addition, the total signal path weight value for a possible vertical signal path comprising segments SEG8, SEG15, and SEG23 is 1, and the total signal path weight value for a possible vertical signal path comprising segments SEG8, SEG15, and SEG24 is 2.

After calculating the total signal path weight values for all of the possible vertical signal paths in stacked apparatus 8, master device 10 selects "L" non-merged vertical signal paths from among the possible vertical signal paths, wherein L is less than or equal to M (S402). As used herein, a "non-merged vertical signal path" is a vertical signal path formed using a vertical connection path that comprises only pass segments. In addition, in the example corresponding to FIGS. 15-17, a vertical connection path comprising only pass segments corresponds to a possible vertical signal path having a total weight value of 0. Thus, master device 10 may select a possible vertical signal path having a total weight value of 0 as one of the L non-merged vertical signal paths. For example, referring to FIG. 15, the possible vertical signal path comprising segments SEG1, SEG9, and SEG17 and the switch paths between those segments has a total weight value of 0 and may be selected by master device 10 as one of the L non-merged vertical signal paths. Additionally, segments SEG1, SEG9, and SEG17 form a vertical connection path within stacked apparatus 8. In the method corresponding to FIG. 11, master device 10 may select up to M possible vertical signal paths having total signal path weight values of 0, in accordance with the number of such possible vertical signal paths that are present in stacked apparatus 8.

Figure 16:
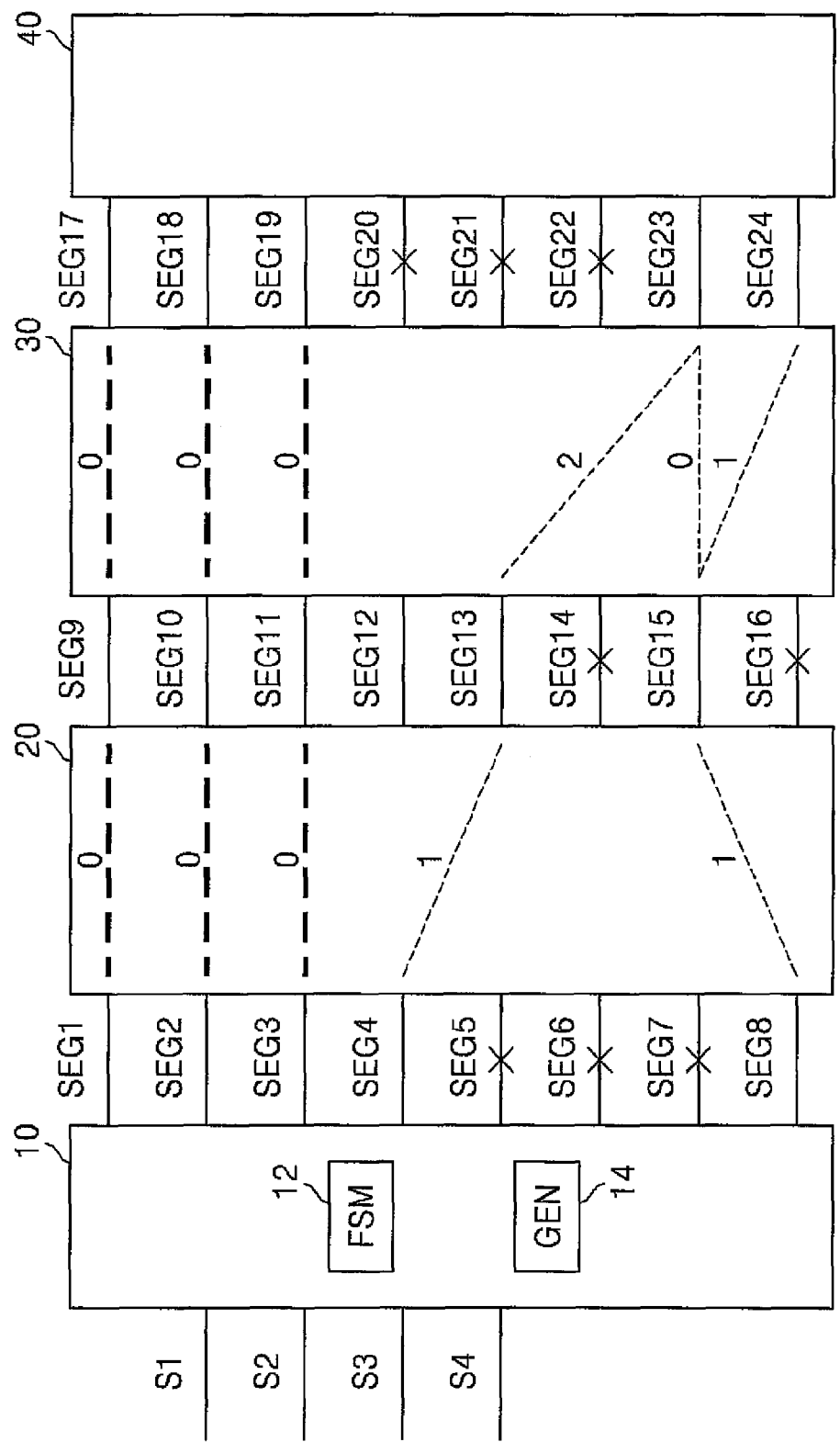
FIG. 16 further illustrates the stacked apparatus of FIG. 12 and includes annotations partially illustrating another stage in an exemplary performance of a method corresponding to FIG. 11 on the stacked apparatus of FIG. 12.
Figure 17:
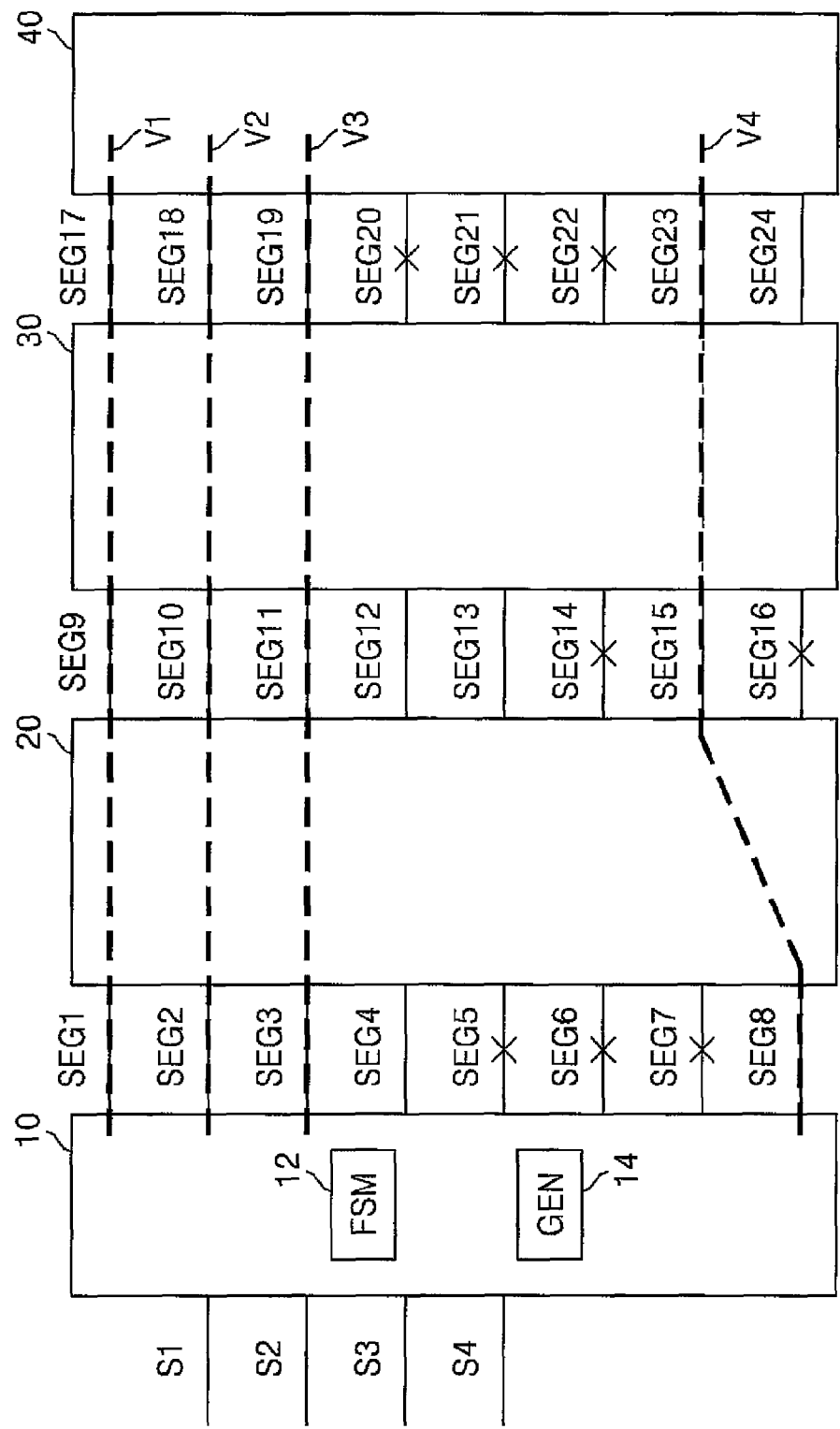
FIG. 17 further illustrates the stacked apparatus of FIG. 12 and includes annotations partially illustrating yet another stage in an exemplary performance of a method corresponding to FIG. 11 on the stacked apparatus of FIG. 12.

In the example of FIGS. 15-17, master device 10 selects three (3) non-merged vertical signal paths, the switch paths of which are represented by bold dotted lines in FIG. 16. As noted above, master device 10 may select possible vertical signal paths that each have total signal path weight values of 0 as the L non-merged vertical signal paths. As illustrated in FIG. 16, master device 10 selects the possible vertical signal path comprising segments SEG1, SEG9, and SEG17, which has a total signal path weight value of 0, as one of the non-merged vertical signal paths. Master device 10 also selects the possible vertical signal path comprising segments SEG2, SEG10, and SEG18 as one of the non-merged vertical signal paths, and selects the possible vertical signal path comprising segments SEG3, SEG11, and SEG19 as one of the non-merged vertical signal paths.

Master device 10 then determines whether L is less than M (S404). As noted above, the method corresponding to FIG. 11 selects and creates M vertical signal paths. If L is equal to M after selecting L non-merged vertical signal paths (S404=no), then no more vertical signal paths need to be selected. However, if L is less than M, then at least one additional vertical signal path needs to be selected. In the example of FIGS. 15-17, M equals 4, and L equals 3 (i.e., three (3) non-merged vertical signal paths were selected). Thus, in the example, L is less than M after selecting the L non-merged vertical signal paths (S404=yes). Therefore, FSM 12 eliminates each remaining possible vertical signal path that includes a segment that is included in one of the selected vertical signal paths (S406). At this point in the working example, the selected vertical signal paths are the L non-merged vertical signal paths. Thus, all remaining possible vertical signal paths including at least one of segments SEG1-SEG3, SEG9-SEG11, and SEG17-SEG19 are eliminated as possibilities, leaving three (3) possible vertical signal paths. FIG. 16 illustrates switch paths of the selected vertical signal paths with bold dotted lines, and illustrates with non-bold dotted lines the switch paths of the remaining possible vertical signal paths after eliminating non-selected possible vertical signal paths including at least one of segments SEG1-SEG3, SEG9-SEG11, and SEG17-SEG19.

Master device 10 then selects a possible vertical signal path having the minimum total signal path weight value among the remaining possible vertical signal paths (S408). In the example of FIGS. 15-17, the three remaining possible vertical signal paths are a path comprising segments SEG4, SEG13, and SEG23, which has a total signal path weight value of 3; a path comprising segments SEG8, SEG15, and SEG23, which has a total signal path weight value of 1; and a path comprising segments SEG8, SEG15, and SEG24, which has a total signal path weight value of 2. Thus, master device selects the possible vertical signal path comprising segments SEG8, SEG15, and SEG23, which has a total signal path weight value of 1. The selected vertical signal path comprising segments SEG8, SEG15, and SEG23 is a merged vertical signal path.

Master device then increments L by one (S410) and determines that L is no longer less than M (S404=no). Then, master device 10 sets registers within devices 20 and 30 to implement the selected vertical signal paths within stacked apparatus 8 (S412). Referring to FIG. 17, master device 10 forms vertical signal paths V1-V4 in stacked apparatus 8. Vertical signal paths V1-V3 are non-merged vertical signal paths, while vertical signal path V4 is a merged vertical signal path. Master device 10 may implement vertical signal paths V1-V4 in stacked apparatus 8 by forming the relevant switch paths using control registers and multiplexers in devices 20 and 30 in a manner analogous to the manner of forming switch paths described above with regard to the embodiment illustrated in FIGS. 3A and 3B.

While one exemplary algorithm for selecting vertical signal paths in accordance with an embodiment of the invention has been described above with regard to FIG. 11, other algorithms for selecting vertical signal paths among the possible vertical signal paths in stacked apparatus 8 may be used.

Various apparatuses that may be used for detecting whether segments in a stacked apparatus are pass or fail segments in accordance with embodiments of the invention will be described below. FIGS. 18-21 are each circuit diagrams illustrating a portion of stacked apparatus 7 in accordance with respective embodiments of the invention.

In each of the embodiments respectively illustrated in FIGS. 18-21, the illustrated portion of a stacked apparatus comprises a master device 10 and secondary devices 20 and 30. Devices 10, 20, and 30 of the respective embodiments illustrated in FIG. 18-21 are similar to devices 10, 20, and 30 of stacked apparatus 7 illustrated in FIGS. 1, 3A, and 3B in accordance with embodiments of the invention.

Figure 18:
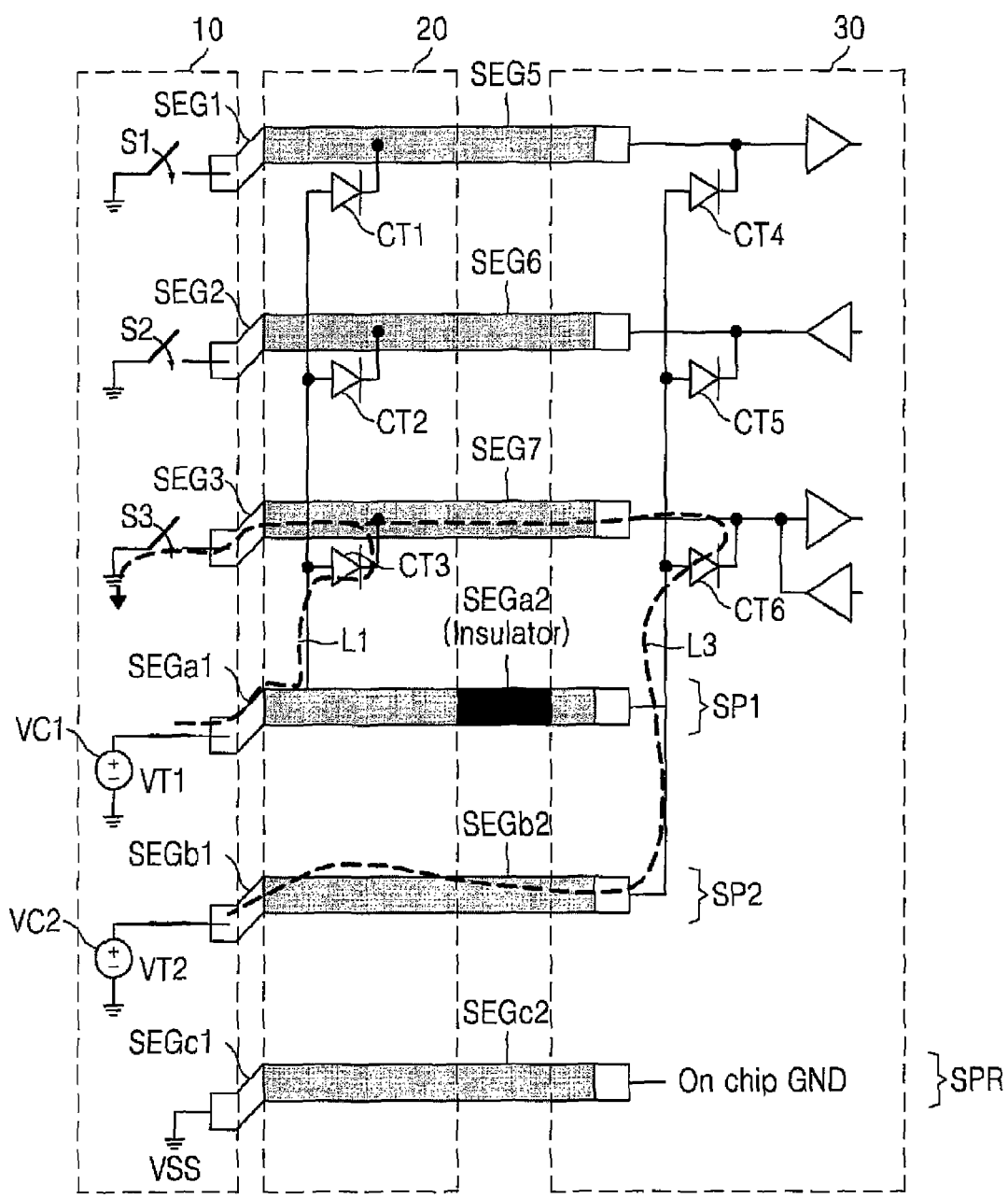
FIG. 18 is a circuit diagram illustrating a portion of stacked apparatus in accordance with an embodiment of the invention.

Referring to FIG. 18, master device 10 comprises first and second test voltage application circuits VC1 and VC2 generating first and second test voltages VT1 and VT2, respectively. Second test voltage application circuit VC2 is connected to a test voltage signal path SP2 and provides second test voltage VT2 to, for example, device 30 via test voltage signal path SP2. As illustrated in FIG. 18, test voltage signal path SP2 traverses devices 10, 20, and 30. In addition, first test voltage application circuit VC1 is connected to a test voltage signal path SP1 and provides first test voltage VT1 to, for example, device 20 via test voltage signal path SP1. As illustrated in FIG. 18, test voltage signal path SP1 traverses devices 10 and 20, but segment SEGa2 associated with device 20 isolates test voltage signal path SP1 from device 30. The stacked apparatus illustrated in FIG. 18 also comprises a reference voltage signal path SPR traversing devices 10, 20, and 30, by which master device 10 provides ground voltage VSS to devices 20 and 30.

As illustrated in FIG. 18, master device 10 comprises first, second, and third switches 51, S2, and S3. In addition, the stacked apparatus of FIG. 18 comprises segments SEG1-SEG3, SEGa1, SEGb1, and SEGc1, each of which is associated with device 10. Each of segments SEG1-SEG3, SEGa1, SEGb1, and SEGc1 may be referred to herein as a first layer segment. The stacked apparatus of FIG. 18 also comprises segments SEG5-SEG7, SEGa2, SEGb2, and SEGc2, each of which is associated with device 20. Each of segments SEG5-SEG7, SEGa2, SEGb2, and SEGc2 may be referred to herein as a second layer segment. Segment SEGa2 is an insulator substantially isolating device 30 from first test voltage VT1.

Additionally, device 20 comprises a plurality of connection test circuits CT1-CT3 respectively associated with segments of the stacked apparatus illustrated in FIG. 18. As illustrated in FIG. 18, a connection test circuit CT1 of device 20 is associated with segment SEG1, a connection test circuit CT2 of device 20 is associated with segment SEG2, and a connection test circuit CT3 of device 20 is associated with segment SEG3. In particular, connection test circuit CT1 comprises a diode connecting first test voltage application circuit VC1 to segment SEG1, connection test circuit CT2 comprises a diode connecting first test voltage application circuit VC1 to segment SEG2, and connection test circuit CT3 comprises a diode connecting first test voltage application circuit VC1 to segment SEG3. In addition, in the embodiment illustrated in FIG. 18, segment SEG1 is connected between switch 51 and connection test circuit CT1, segment SEG2 is connected between switch S2 and connection test circuit CT2, and segment SEG3 is connected between switch S3 and connection test circuit CT3.

Device 30 also comprises a plurality of connection test circuits. Device 30 comprises a plurality of connection test circuits CT4-CT6 respectively associated with segments of the stacked apparatus illustrated in FIG. 18. As illustrated in FIG. 18, a connection test circuit CT4 of device 30 is associated with segment SEG5, a connection test circuit CT5 of device 30 is associated with segment SEG6, and a connection test circuit CT6 of device 30 is associated with segment SEG7. In particular, connection test circuit CT4 comprises a diode connecting second test voltage application circuit VC2 to segment SEG5, connection test circuit CT5 comprises a diode connecting second test voltage application circuit VC2 to segment SEG6, and connection test circuit CT6 comprises a diode connecting second test voltage application circuit VC2 to segment SEG7. In addition, in the embodiment illustrated in FIG. 18, segment SEG5 is connected between switch S1 and connection test circuit CT4, segment SEG6 is connected between switch S2 and connection test circuit CT5, and segment SEG7 is connected between switch S3 and connection test circuit CT6.

Using first and second test voltages VT1 and VT2, master device 10 is able to detect pass segments and fail segments among first layer segments SEG1-SEG3 and second layer segments SEG5-SEG7. For example, master device 10 may activate first test voltage application circuit VC1, close switch S3, and detect whether master device 10 satisfactorily receives first test voltage VT1 through segment SEG3. If master device 10 determines that it does not satisfactorily receive first test voltage VT1, then master device 10 determines that segment SEG3 is a fail segment. However, if master device 10 determines that it satisfactorily receives first test voltage VT1 through segment SEG3 (see signal path L1), then master device 10 may determine that segment SEG3 is a pass segment.

Additionally, after determining that segment SEG3 is a pass segment, master device 10 may (after deactivating first test voltage application circuit VC1) activate second test voltage application circuit VC2, close switch S3, and detect whether master device 10 satisfactorily receives second test voltage VT2. If master device 10 determines that it does not satisfactorily receive second test voltage VT2, then master device 10 may determine that segment SEG7 is a fail segment. However, if master device 10 determines that it satisfactorily receives second test voltage VT2 through segment SEG7 (see signal path L2), then master device 10 may determine that segment SEG7 is a pass segment. Segments SEG1, SEG2, SEG5, and SEG6 may be judged in an analogous manner using first and second test voltages VT1 and VT2.

Although the embodiment illustrated in FIG. 18 comprises two test voltage sources, the stacked apparatus illustrated in FIG. 18 may be expanded to comprise additional devices as well as additional segments between devices, additional voltage sources, and additional test signal paths to test the segments associated with the devices.

Figure 19:
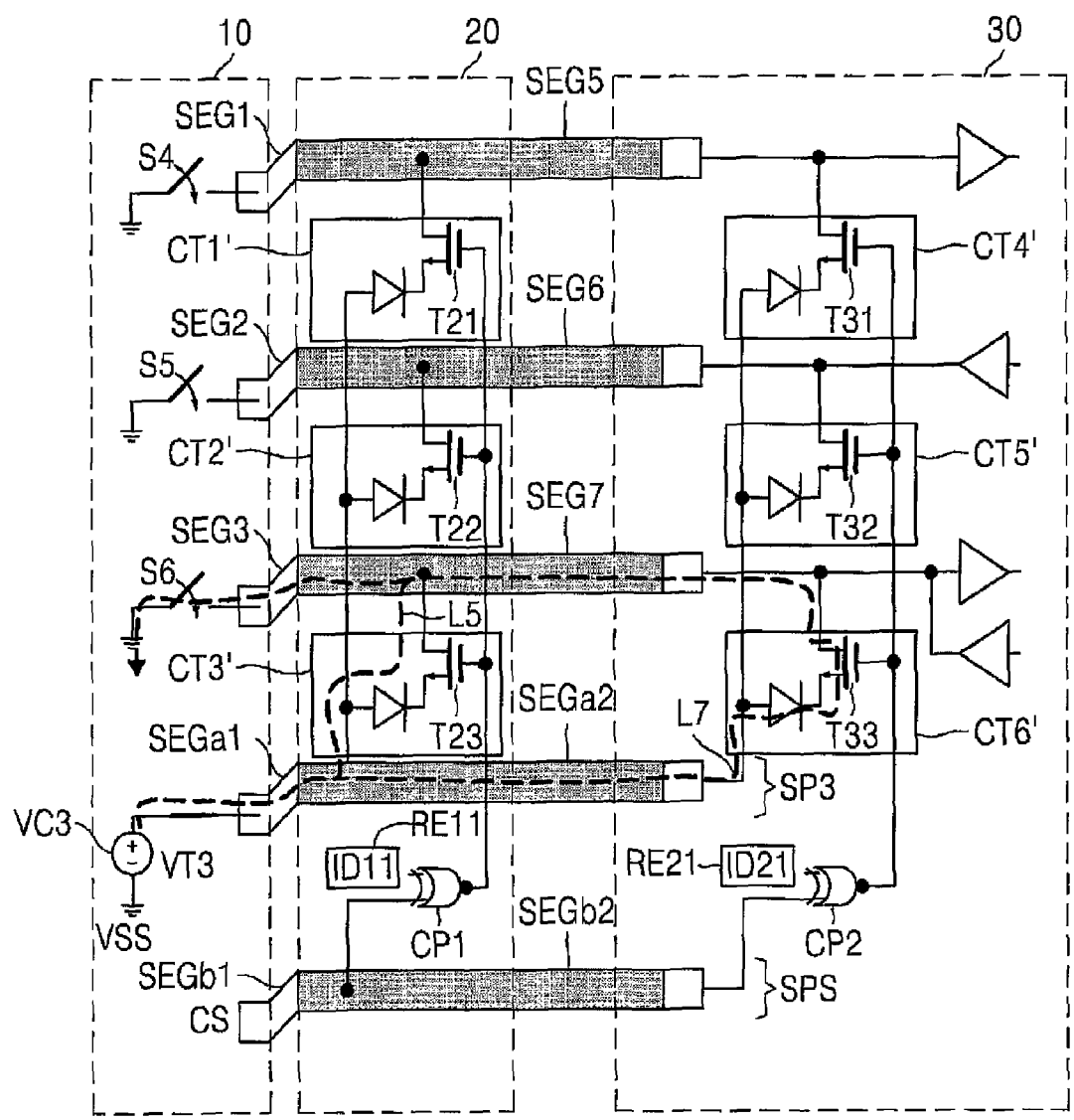
FIG. 19 is a circuit diagram illustrating a portion of stacked apparatus in accordance with another embodiment of the invention.

Referring to FIG. 19, master device 10 comprises a test voltage application circuit VC3 generating a test voltage VT3 and connected to a test voltage signal path SP3 comprising segment SEGa1. As illustrated in FIG. 19, test voltage signal path SP3 traverses devices 10, 20, and 30, and test voltage application circuit VC3 provides test voltage VT3 to devices 20 and 30 via test voltage signal path SP3.

As illustrated in FIG. 19, the stacked apparatus of FIG. 19 comprises first layer segments SEG1-SEG3, SEGa1, and SEGb1, each of which is associated with device 10. The stacked apparatus of FIG. 19 also comprises second layer segments SEG5-SEG7, SEGa2, and SEGb2, each of which is associated with device 20. Master device 10 also comprises fourth, fifth, and sixth switches S4, S5, and S6 connected to segments SEG1, SEG2, and SEG3, respectively.

Additionally, master device 10 provides a chip select signal CS to devices 20 and 30 via a test select signal path SPS traversing devices 10, 20, and 30. In addition, device 20 comprises a device select circuit connected to test select signal path SPS and device 30 comprises a device select circuit connected to test select signal path SPS. The device select circuit associated with device 20 comprises a comparator CP1 receiving chip select signal CS over test select signal path SPS, and an ID register RE11 providing ID signal ID11 to comparator CP1. The device select circuit associated with device 30 comprises a comparator CP2 receiving chip select signal CS over test select signal path SPS, and an ID register RE21 providing ID signal ID21 to comparator CP2. As used herein, a "device select circuit" is an element or combination of elements associated with a device that activates other element(s) associated with the device when it receives a selection signal corresponding to that device.

Additionally, device 20 comprises a plurality of connection test circuits CT1'-CT3' respectively associated with segments of the stacked apparatus illustrated in FIG. 19. As illustrated in FIG. 19, connection test circuits CT1'-CT3' of device 20 are associated with segments SEG1-SEG3, respectively. In particular, connection test circuit CT1' comprises a diode and a transistor T21, and connects test voltage application circuit VC3 to segment SEG1. Similarly, connection test circuit CT2' comprises a diode and a transistor T22, and connects test voltage application circuit VC3 to segment SEG2, and connection test circuit CT3' comprises a diode and a transistor T23, and connects test voltage application circuit VC3 to segment SEG3. In addition, in the embodiment illustrated in FIG. 19, segment SEG1 is connected between switch S4 and connection test circuit CT1', segment SEG2 is connected between switch S5 and connection test circuit CT2', and segment SEG3 is connected between switch S6 and connection test circuit CT3'. In the embodiment illustrated in FIG. 19, when the device select circuit associated with device 20 receives a chip select signal CS equal to ID signal ID11, an output of comparator CP1 is activated, which gates (i.e., turns ON) each of transistors T21, T22, and T23, and thereby turns ON each of connection test circuits CT1'-CT3'.

Device 30 also comprises a plurality of connection test circuits. As illustrated in FIG. 19, device 30 comprises a plurality of connection test circuits CT4'-CT6' associated with segments SEG5-SEG7, respectively. Connection test circuit CT4' comprises a diode and a transistor T31, and connects test voltage application circuit VC3 to segment SEG5. Similarly, connection test circuit CT5' comprises a diode and a transistor T32, and connects test voltage application circuit VC3 to segment SEG6, and connection test circuit CT6' comprises a diode and a transistor T33, and connects test voltage application circuit VC3 to segment SEG7. In addition, in the embodiment illustrated in FIG. 19, segment SEG5 is connected between switch S4 and connection test circuit CT4', segment SEG6 is connected between switch S5 and connection test circuit CT5', and segment SEG7 is connected between switch S6 and connection test circuit CT6'. In the embodiment illustrated in FIG. 19, when the device select circuit associated with device 30 receives a chip select signal equal to ID signal ID21, an output of comparator CP2 is activated, which gates (i.e., turns ON) each of transistors T31, T32, and T33, and thereby turns ON each of connection test circuits CT4'-CT6'.

In the embodiment illustrated in FIG. 19, master device 10 may test segment SEG3 by providing device 20 with a chip select signal CS corresponding to (e.g., equal to) ID signal ID11, closing switch S6, enabling test voltage application circuit VC3, and sensing whether master device 10 satisfactorily receives test voltage VT3 through segment SEG3 (i.e., through signal path L5). When a chip select signal CS corresponding to ID signal ID11 is provided to the device select circuit of device 20, the output signal of comparator CP1 is activated, and that output signal gates transistor T23, which may then provide test voltage VT3 to segment SEG3. If master device 10 determines that it satisfactorily receives test voltage VT3 via segment SEG3, then it may determine that segment SEG3 is a pass segment. Otherwise, master device 10 may determine that segment SEG3 is a fail segment. Master device 10 may test segments SEG1 and SEG2 in an analogous manner.

Additionally, in the embodiment illustrated in FIG. 19, after determining that segment SEG3 is a pass segment, master device 10 may test segment SEG7 by providing device 30 with a chip select signal CS corresponding to (e.g., equal to) ID signal ID21, closing switch S6, enabling the test voltage application circuit VC3, and sensing whether master device 10 satisfactorily receives test voltage VT3 through segment SEG7 (i.e., through signal path L7). When a chip select signal CS corresponding to ID signal ID21 is provided to the device select circuit of device 30, the output signal of comparator CP2 is activated, and that output signal gates transistor T33, which may then provide test voltage VT3 to segment SEG7. If master device 10 determines that it satisfactorily receives test voltage VT3 via segment SEG7, then it may determine that segment SEG7 is a pass segment. Otherwise, master device 10 may determine that segment SEG7 is a fail segment. Master device 10 may test segments SEG5 and SEG6 in an analogous manner. In addition, the stacked apparatus illustrated in FIG. 19 may be expanded to comprise additional devices similar to devices 20 and 30 as well as additional segments.

Figure 20:
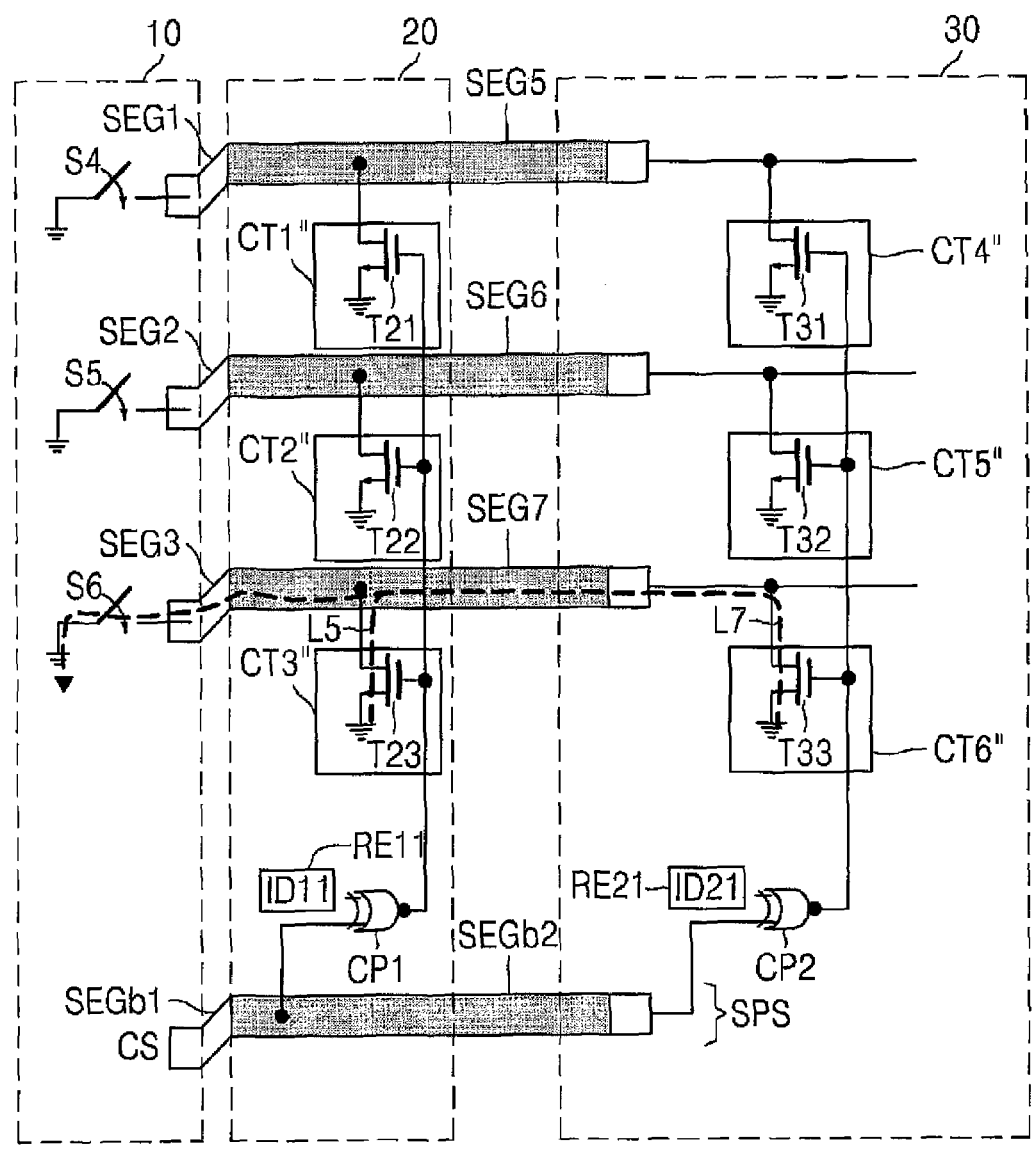
FIG. 20 is a circuit diagram illustrating a portion of stacked apparatus in accordance with yet another embodiment of the invention.

The embodiment illustrated in FIG. 20 is similar to the embodiment illustrated in FIG. 19. However, in the embodiment illustrated in FIG. 20, master device 10 does not comprise test voltage application circuit VC3, the stacked apparatus does not comprise test voltage signal path SP3, and transistors T21-T23 and T31-T33 are each connected to ground rather than to respective diodes, for example. In addition, like the embodiment illustrated in FIG. 19, the embodiment illustrated in FIG. 20 comprises device select circuits, and also comprises connection test circuits CT1"-CT6". Connection test circuits CT1"-CT3" comprise transistors T21-T23, respectively, and connection test circuits CT4"-CT6" comprise transistors T31-T33, respectively.

When, for example, the device select circuit associated with device 20 (which comprises a comparator CP1 and an ID register RE11) receives a chip selection signal CS corresponding to ID signal ID11, the output signal of comparator CP1 is activated, which gates each of transistors T21-T23, and the device select circuit of device 20 thereby activates each of connection test circuits CT1"-CT3". The device select circuit of device 30 activates connection test circuits CT4"-CT6" of device 30 in an analogous manner.

In the embodiment illustrated in FIG. 20, master device 10 may test SEG3 using a signal path L5, which comprises transistor T23, segment SEG3, and switch S6. For example, master device 10 may close switch S6 and supply device 20 with a chip select signal CS corresponding to ID signal ID11. When the device select circuit of device 20 receives the chip select signal CS corresponding to ID signal ID11, the output signal of comparator CP1 is activated, and that output signal gates transistor T23, which will then connect segment SEG3 to ground. Thus, by closing switch S6 and supplying device 20 with a chip select signal CS corresponding to ID signal ID11, both sides of segment SEG3 may be grounded. Master device 10 may determine whether segment SEG3 is a pass segment or a fail segment by, for example, monitoring the impedance on signal path L5 or monitoring the high frequency noise on signal path L5. Master device 10 may test segments SEG1 and SEG2 in an analogous manner.

Similarly, if master device 10 determines that segment SEG3 is a pass segment, master device 10 may test segments SEG7 in a manner analogous to the manner in which segment SEG3 is tested. Master device 10 may also test segments SEG5 and SEG6 in a manner to the manner in which segment SEG7 is tested.

Figure 21:
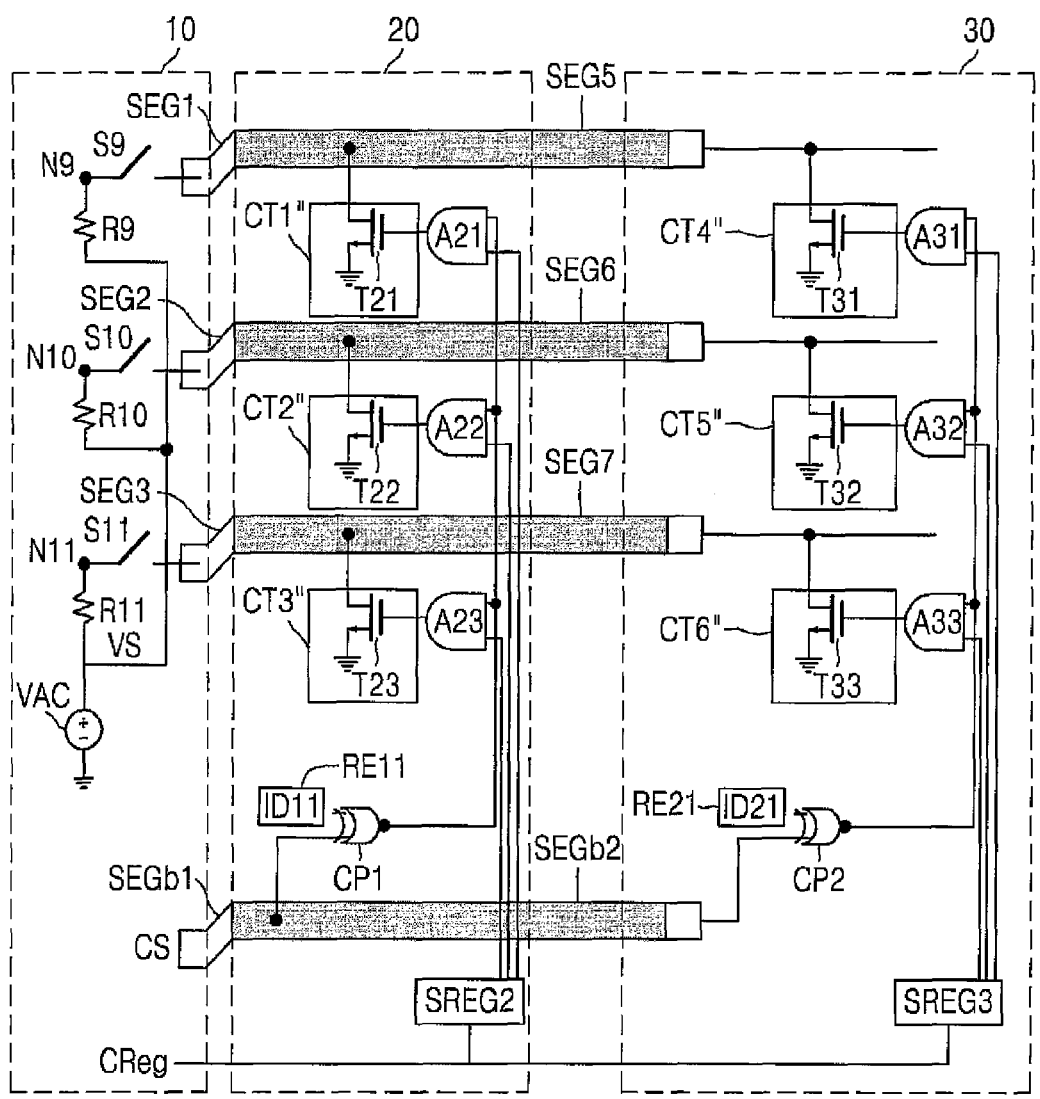
FIG. 21 is a circuit diagram illustrating a portion of stacked apparatus in accordance with still another embodiment of the invention.

In the embodiment illustrated in FIG. 21, first layer segments SEG1-SEG3 and SEGb1 are associated with master device 10, and second layer segments SEG5-SEG7 and SEGb2 are associated with second device 20. Master device 10 comprises a test voltage application circuit VAC generating test voltage VS, and switches S9, S10, and S11. Master device 10 also comprises resistors R9, R10, and R11 respectively connected between test voltage application circuit VAC and switches S9, S10, and S11. In addition, switch S9 is connected between resistor R9 and segment SEG1, switch S10 is connected between resistor R10 and segment SEG2, switch S11 is connected between resistor R11 and segment SEG3.

Additionally, device 20 comprises a segment register SREG2 receiving a register control signal CReg from master device 10 and providing output signals to segment select circuits. In the embodiment illustrated in FIG. 21, the segment select circuits of device 20 are logic circuits A21, A22, and A23. Device 20 also comprises a device select circuit comprising a comparator CP1 and an ID register RE11 providing ID signal ID11 to comparator CP1. The output signal of comparator CP1 is activated when comparator CP1 receives ID signal ID11 from ID register RE11 and a chip select signal CS corresponding to ID signal ID11. Logic circuits A21, A22, and A23 each receive the output signal of comparator CP1, and a respective output signal from segment register SREG2. In addition, logic circuits A21, A22, and A23 provide output signals to the gates of transistors T21, T22, and T23, respectively.

When logic circuit A21 receives an activated output signal from comparator CP1 and an activated signal from segment register SREG2, the output signal of logic circuit A23 is activated and gates transistor T23, which then connects segment SEG3 to ground. Logic circuits A22 and A23, and transistors T22 and T23 operate in an analogous manner to logic circuit A21 and transistor T21 as described above. Device 20 comprises connection test circuits CT1"-CT3" comprising transistors T21-T23, respectively. Connection test circuits CT1"-CT3" of the embodiment illustrated in FIG. 21 are similar to connection test circuits CT1"-CT3" of the embodiment illustrated in FIG. 20. In addition, the configuration of device 30 is analogous to the configuration of device 20.

In the embodiment illustrated in FIG. 21, master device 10 may, for example, test segment SEG3 by selecting device 20, generating test voltage VS using test voltage application circuit VAC, closing switch S11, selecting segment SEG3 using segment register SREG2, and monitoring whether a voltage drop occurs at node N11. For example, to test segment SEG3, master device 10 provides a chip select signal CS corresponding to ID signal ID11 to comparator CP1 to activate the output signal of comparator CP1. Comparator CP1 then provides an activated output signal to logic gates A21, A22, and A23, and master device 10 causes segment register SREG2 to provide an activated output signal to logic gate A23 so that the output signal of logic gate A23 will gate transistor T23 and thereby ground segment SEG3. Then, with switch 11 closed and test voltage application circuit VAC generating test voltage VS, if master device 10 detects a satisfactory voltage drop at node N11, master device 10 may determine that segment SEG3 is a pass segment. Otherwise, master device 10 may determine that segment SEG3 is a fail segment. Master device 10 may also test segments SEG1 and SEG2 in an analogous manner.

Once master device 10 has determined that segment SEG3 is a pass segment, master device 10 may test whether segment SEG7 is a pass segment in a manner analogous to the manner described above for testing segment SEG3. Master device 10 may also test segments SEG5 and SEG6 in an analogous manner.

Figure 22:
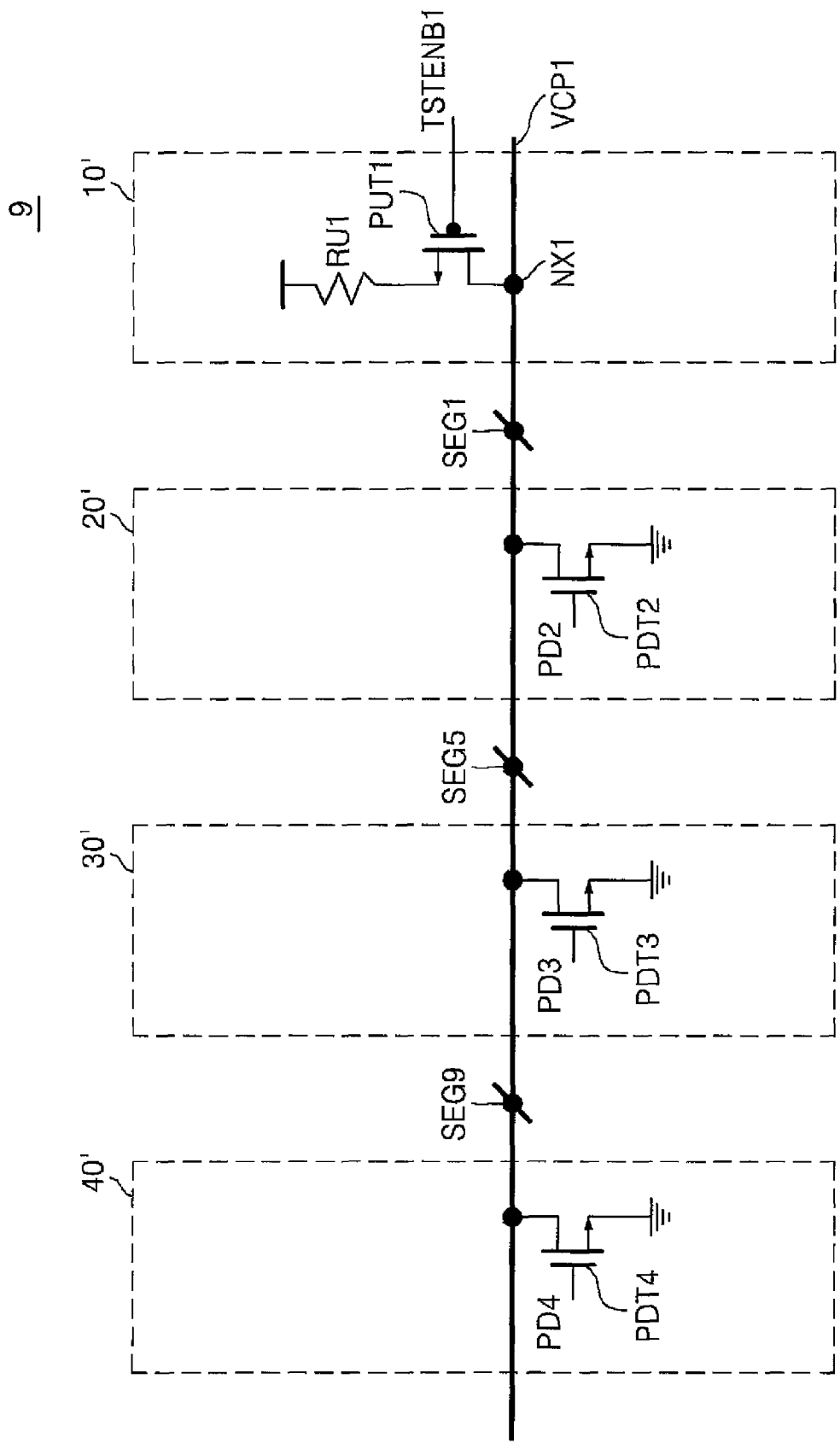
FIG. 22 is a circuit diagram illustrating portion of a stacked apparatus in accordance with an embodiment of the invention.

FIG. 22 is a circuit diagram illustrating a portion of a stacked apparatus in accordance with an embodiment of the invention. In particular, FIG. 22 illustrates a portion of a stacked apparatus 9 comprising devices 10', 20', 30', and 40' in accordance with an embodiment of the invention. FIG. 22 illustrates one vertical connection path extending through stacked apparatus 9. The illustrated vertical connection path comprises segments SEG1, SEG5, and SEG9.

Devices 20', 30', and 40' comprise pull-down transistors PDT2, PDT3, and PDT4, respectively. Pull-down transistors PDT2, PDT3, and PDT4 are gated by signals PD2, PD3, and PD4, respectively. Each of pull-down transistors PDT2-PDT4 is also connected both to ground and to the vertical connection path comprising segments SEG1, SEG5, and SEG9. Additionally, device 10' (i.e., master device 10') comprises a resistor RU1 and a pull-up transistor PUT1 serially-connected between a power source and a node NX1. The pull-up transistor PUT1 is gated by a test enable signal TSTENB1.

Master device 10' detects whether the vertical connection path comprising segments SEG1, SEG5, and SEG9 is a failed vertical connection path by monitoring the level of a voltage apparent at node NX1. For example, in the embodiment illustrated in FIG. 22, when test enable signal TSTENB1 is set to a logic low level to gate pull-up transistor PUT1, and each of signals PD2, PD3, and PD4 is set to (or maintained at) a logic low level, a relatively high voltage will be apparent at node NX1. Test enable signal TSTENB1 may then be set to a logic high level and signal PD4 may be set to a logic high level to gate pull-down transistor PDT4. Master device 10' then detects the level of a voltage apparent at node NX1. If master device 10' detects a relatively high voltage at node NX1, then master device 10' may determine that the vertical connection path (comprising segments SEG1, SEG5, and SEG9) is a failed vertical connection path. However, if master device 10' detects a relatively low voltage at node NX1, then master device 10' may determine that the vertical connection path is a passed vertical connection path.

In accordance with another embodiment of the invention, the test enable signal TSTENB1 may be set to a logic low level and signal PD4 may be set to a logic high level. Master device 10' then detects the level of a voltage apparent at node NX1. If the vertical connection path comprising segments SEG1, SEG5, and SEG9 is a pass vertical connection path, the node NX1 of master device 10' is discharged to ground via the vertical connection path and the pull-down transistor PDT4. So, the voltage of node NX1 becomes relatively low voltage. If the vertical connection path comprising segments SEG1, SEG5, and SEG9 is a failed vertical connection path, the node NX1 of master device 10' is not discharged to ground via the vertical connection path and the pull-down transistor PDT4. So, the voltage of node NX1 maintains relatively high voltage. In accordance with an embodiment of the invention, the size of each of the pull-down transistors PDT2-PDT4 may be larger than size of pull-up transistor PUT1. Also, in accordance with an embodiment of the invention, resistance of resistor RU1 may be relatively high.

Figure 32:
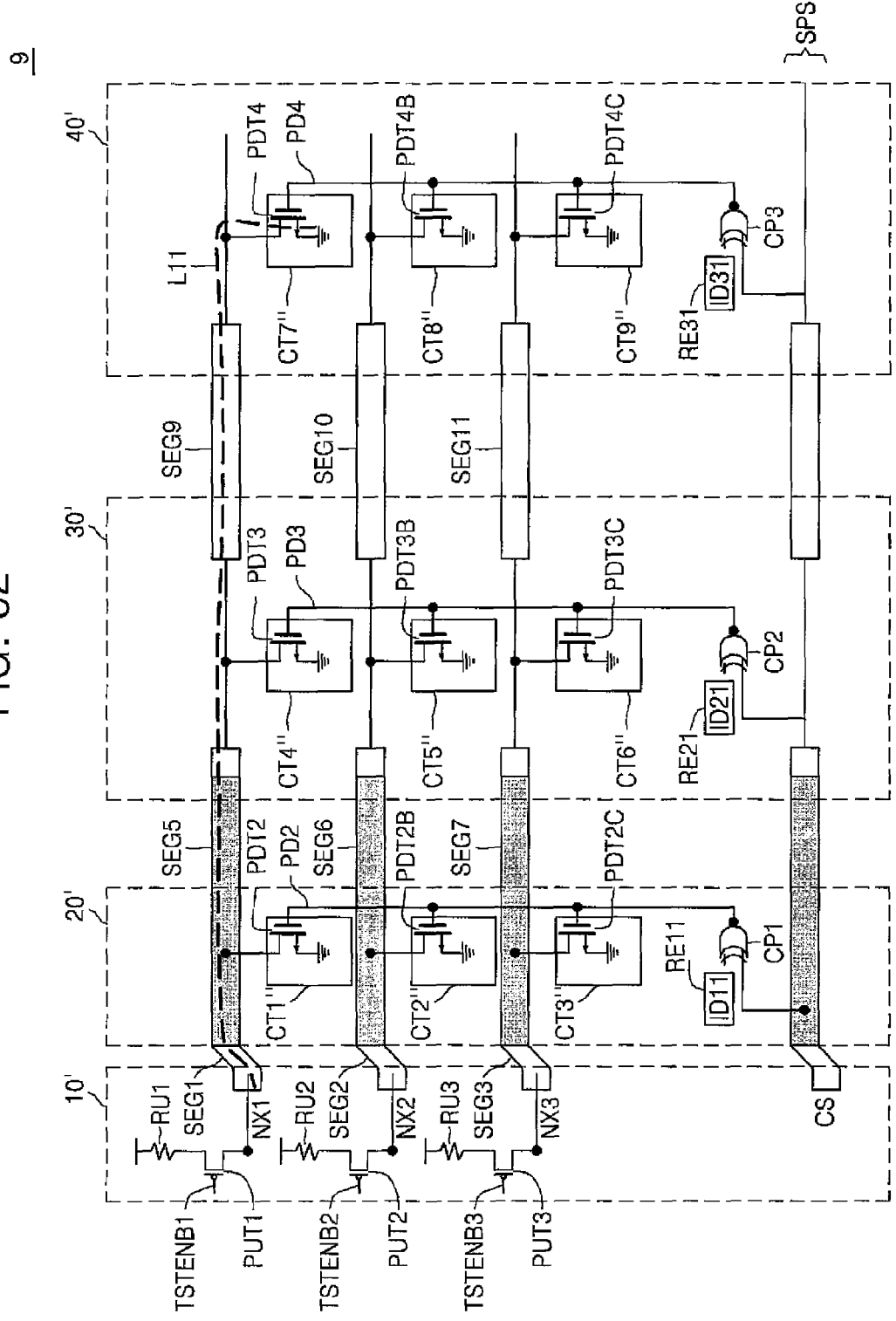
FIG. 32 is a circuit diagram illustrating a portion of the stacked apparatus that is also partially illustrated in FIG. 22 in accordance with an embodiment of the invention.

FIG. 32 is a circuit diagram illustrating a portion of stacked apparatus 9, which is also partially illustrated in FIG. 22, in accordance with an embodiment of the invention. That is, FIG. 32 illustrates a greater portion of stacked apparatus 9 than FIG. 22. As illustrated in FIG. 32, stacked apparatus 9 comprises devices 10', 20', 30', and 40'. In addition, stacked apparatus 9 comprises segments SEG1-SEG3 associated with master device 10', segments SEG5-SEG7 associated with device 20', and segments SEG9-SEG11 associated with device 30'.

Master device 10' comprises pull-up transistors PUT1, PUT2, and PUT3, which are gated by test enable signals TSTENB1, TSTENB2, and TSTENB3, respectively, and are connected to segments SEG1, SEG2, and SEG3, respectively. In addition, master device 10' comprises a node NX1 disposed between pull-up transistor PUT1 and segment SEG1, a node NX2 disposed between pull-up transistor PUT2 and segment SEG2, and a node NX3 disposed between pull-up transistor PUT3 and segment SEG3. Master device 10' also provides a chip select signal CS to devices 20', 30', and 40' via a test select signal path SPS traversing devices 20', 30', and 40'. In addition, test select signal path SPS may be a robust vertical signal path.

Device 40' comprises a device select circuit connected to test select signal path SPS. The device select circuit associated with device 40' comprises a comparator CP3 receiving chip select signal CS over test select signal path SPS, and an ID register RE31 providing ID signal ID31 to comparator CP3. In addition, device 40' comprises a plurality of connection test circuits CT7", CT8", CT9" associated with segments SEG9, SEG10, and SEG11, respectively. Connection test circuit CT7" comprises a pull-down transistor PDT4 that has one terminal connected to ground, another terminal connected to segment SEG9, and is gated by signal PD4. Additionally, connection test circuit CT8" comprises a pull-down transistor PDT4B that has one terminal connected to ground, another terminal connected to segment SEG10, and is gated by signal PD4. In addition, connection test circuit CT9" comprises a pull-down transistor PDT4C that has one terminal connected to ground, another terminal connected to segment SEG11, and is gated by signal PD4. Connection test circuits CT7"-CT9" are similar to connection test circuits CT1"-CT3" of FIGS. 20 and 21, for example. The respective configurations of devices 20' and 30' are analogous to the configuration of device 40' and therefore will not be described in further detail here.

In the embodiment illustrated in FIG. 32, master device 10' detects whether the vertical connection path comprising segments SEG1, SEG5, and SEG9 is a failed vertical connection path by monitoring the level of a voltage apparent at node NX1 of master device 10'. For example, when test enable signal TSTENB1 is set to a logic low level to gate pull-up transistor PUT1, and each of signals PD2, PD3, and PD4 is set to (or maintained at) a logic low level, a relatively high voltage will be apparent at node NX1. Signals PD2, PD3, and PD4 may be maintained at a logic low level by not selecting any of devices 20', 30' and 40'. For example, none of devices 20', 30', and 40' is selected when none of ID signals ID11, ID21, and ID31 is provided to devices 20', 30' and 40' on test select signal path SPS.

Test enable signal TSTENB1 may then be set to a logic high level and signal PD4 may be set to a logic high level to gate (i.e., turn ON) pull-down transistor PDT4. When pull-down transistor PDT4 is gated, it connects segment SEG9 to ground. Signal PD4 may be set to a logic high level by selecting device 40'. For example, device 40' may be selected by providing ID signal ID31 to device 40' over test select signal path SPS. When the device select circuit associated with device 40' receives ID signal ID31, comparator CP3 receives ID signal ID31 from both ID register RE31 and test select signal path SPS, and outputs signal PD4 having a logic high level.

After pull-down transistor PDT4 has been gated, master device 10' detects the level of a voltage apparent at node NX1. If master device 10' detects a relatively high voltage at node NX1, then master device 10' may determine that the vertical connection path (comprising segments SEG1, SEG5, and SEG9) is a failed vertical connection path. However, if master device 10' detects a relatively low voltage at node NX1, then master device 10' may determine that the vertical connection path is a passed vertical connection path.

A ring-type redundant connection scheme for a stacked apparatus in accordance with an embodiment of the invention will now be described with reference to FIGS. 23-29. The ring-type redundant connection scheme may be implemented on one of the devices of a stacked apparatus, such as a master device of a stacked apparatus, for example. Referring to stacked apparatus 9 of FIG. 22, for example, the ring-type redundant connection scheme may be implemented on master device 10'. For convenience of description, the ring-type redundant connection scheme of FIGS. 23-29 will be described in relation to an embodiment in which the ring-type redundant connection scheme is implemented on a master device 10' of stacked apparatus 9.

Figure 23:
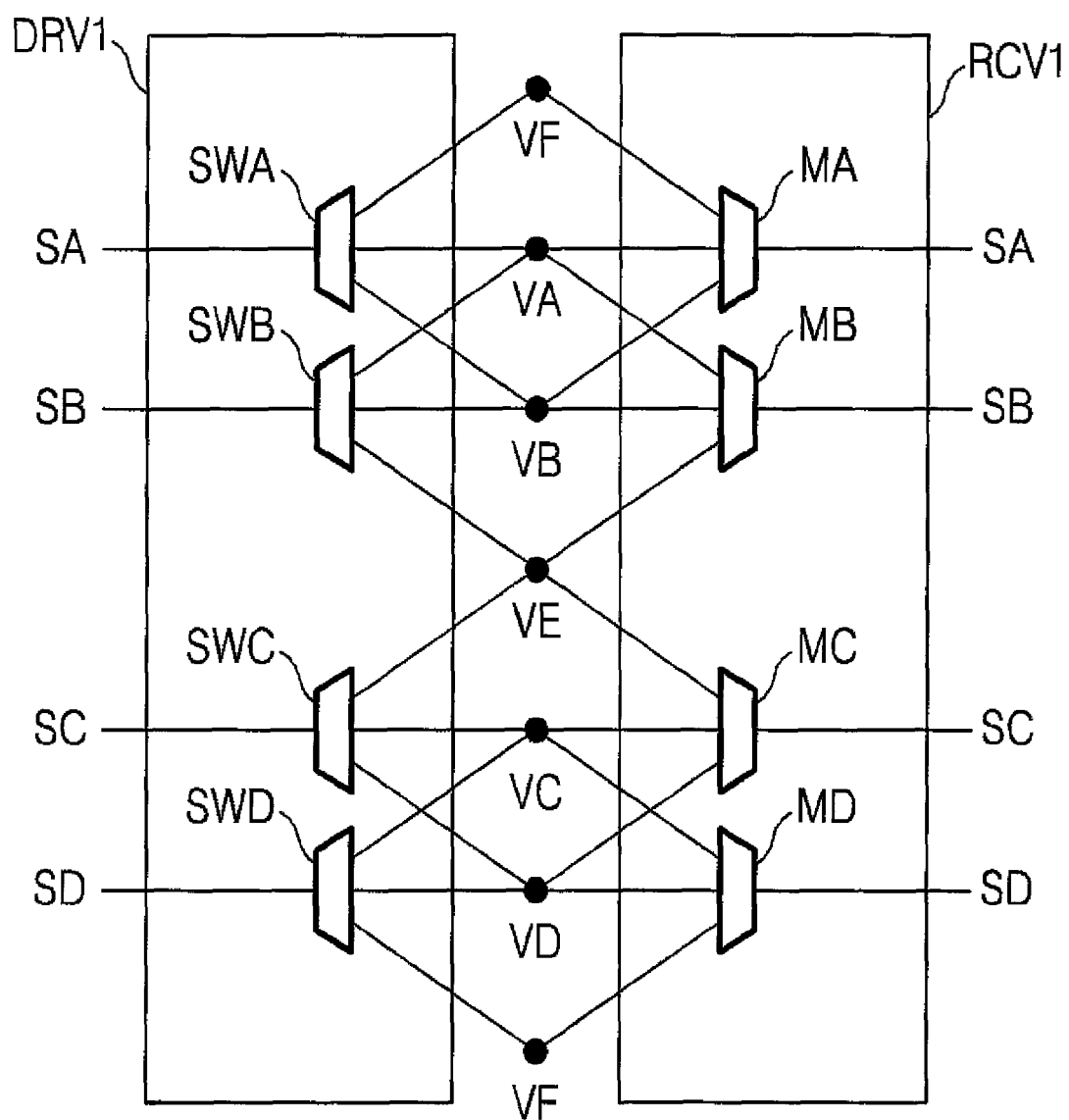
FIG. 23 is a conceptual diagram illustrating a ring-type redundant connection scheme for a stacked apparatus in accordance with an embodiment of the invention.

FIG. 23 is a conceptual diagram illustrating the ring-type redundant connection scheme for a stacked apparatus in accordance with an embodiment of the invention. FIG. 23 illustrates signals SA, SB, SC, and SD, each of which is a signal to be communicated through the stacked apparatus. FIG. 23 also illustrates connection points VA-VF, each of which is a point at which master device 10' (in the working example) may be connected to a corresponding vertical connection path of the stacked apparatus. Thus, in the ring-type redundant connection scheme illustrated in FIG. 23, four (4) signals (i.e., signals SA-SD) are communicated through the stacked apparatus using six (6) vertical connection paths connected to master device 10' at six (6) connection points (VA-VF), respectively. The ring-type redundant connection scheme of FIG. 23 has two (2) redundant connection points that correspond respectively to two (2) redundant vertical connection paths. Additionally, while connection point VF is illustrated twice in the conceptual diagram of FIG. 23 (i.e., at the top and the bottom of FIG. 23), there is only one connection point VF in the ring-type redundant connection scheme corresponding to FIG. 23.

Each of signals SA-SD is communicated in the stacked apparatus via one of the vertical connection paths corresponding connection points VA-VF. Each connection point is connected to a respective one of the vertical connection paths of the stacked apparatus. In addition, each of signals SA-SD is associated with a default connection point connected to a default vertical connection path for the signal, and two (2) alternate connection points respectively connected to two (2) alternate vertical connection paths for the signal. Connection point VA is the default connection point for signal SA, and connection points VF and VB are the alternate connection points for signal SA. Additionally, connection point VB is the default connection point for signal SB, and connection points VA and VE are the alternate connection points for signal SB. Connection point VC is the default connection point for signal SC, and connection points VE and VD are the alternate connection points for signal SC. In addition, connection point VD is the default connection point for signal SD, and connection points VC and VF are the alternate connection points for signal SD. Connection points VE and VF are not default connection points for any of signals SA-SD and are therefore redundant connection points corresponding to redundant vertical connection paths.

FIG. 23 also illustrates a driver DRV1 which, in the working example, receives signals SA-SD from master device 10' and provides them to selected connection points among connection points VA-VF. Driver DRV1 comprises switching elements SWA, SWB, SWC, and SWD.

Switching elements SWA-SWD are associated with signals SA-SD, respectively. Switching element SWA receives signal SA from master device 10' and outputs it to at least one of connection points VF, VA, and VB. Similarly, switching element SWB receives signal SB from master device 10' and outputs it to at least one of connection points VA, VB, and VE. Switching element SWC receives signal SC from master device 10' and outputs it to at least one of connection points VE, VC, and VD. Additionally, switching element SWD receives signal SD from master device 10' and outputs it to at least one of connection points VC, VD, and VF.

FIG. 23 also illustrates a receiver RCV1 which receives signals SA-SD from selected connection points among connection points VA-VF and, in the working example, provides signals SA-SD to master device 10'. Receiver RCV1 comprises switching elements MA, MB, MC, and MD, each of which has multiple inputs and at least one output. Switching elements MA, MB, MC, and MD may be multiplexers, for example.

Switching elements MA-MD are associated with signals SA-SD, respectively. Switching element MA receives signals from connection points VF, VA, and VB, and outputs signal SA to master device 10'. Similarly, switching element MD receives signals from connection points VA, VB, and VE, and outputs signal SB to master device 10'. Switching element MC receives signals from connection points VE, VC, and VD, and outputs signal SC to master device 10'. Additionally, switching element MD receives signals from connection points VC, VD, and VF, and outputs signal SD to master device 10'. As noted above, the ring-type redundant connection scheme of FIG. 23 comprises only one connection point VF. Thus, switching elements SWA, SWD, MA, and MD are all connected to the same connection point VF.

Figure 24:
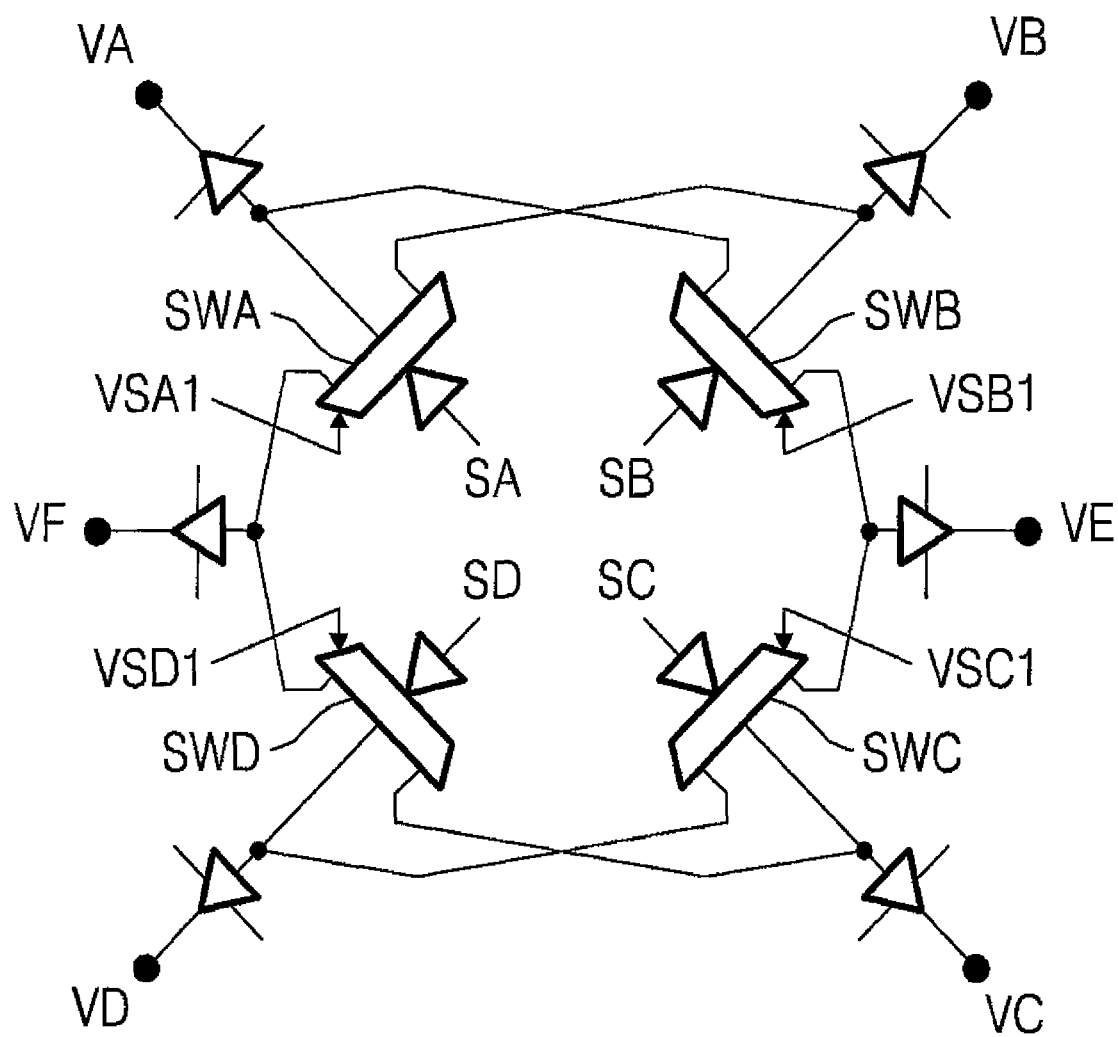
FIG. 24 is a circuit diagram corresponding to a driver of FIG. 23 in accordance with an embodiment of the invention.

FIG. 24 is a circuit diagram corresponding to driver DRV1 of FIG. 23 in accordance with an embodiment of the invention. While FIG. 23 is a conceptual diagram that illustrates various connections in a ring-type redundant connection scheme, FIG. 23 does not show elements of the connection scheme disposed in a ring-like arrangement. For example, FIG. 23 shows connections points VA-VF arranged along a single line. In contrast, FIG. 24 is a circuit diagram showing elements of driver DRV1 disposed in a ring-like arrangement in accordance with an embodiment of the invention.

In FIG. 24, connection points VA-VF have a ring-like arrangement, and switching elements SWA-SWD also have a ring-like arrangement. In addition, substantially the same connections are made among the various components of driver DRV1 in both FIGS. 23 and 24. As in FIG. 23, signals SA-SD are connected to switching elements SWA-SWD in the circuit diagram of FIG. 24. In addition, in the circuit diagram of FIG. 24, outputs of switching elements SWA-SWD are connected to the same connection points as in FIG. 23. Also, in the circuit diagram of FIG. 24, signals SA-SD are input to switching elements SWA-SWD through respective buffers, and the outputs of switching elements SWA-SWD are separated from connection points VA-VD by respective buffers. Each of the buffers may be a tri-state buffer.

In FIG. 24, outputs of switching element SWA are connected to default connection point VA and alternate connection points VF and VB. Outputs of switching element SWB are connected to default connection point VB and alternate connection points VA and VE. Outputs of switching element SWC are connected to default connection point VC and alternate connection points VD and VE. Outputs of switching element SWD are connected to default connection point VD and alternate connection points VC and VF. FIG. 24 also shows control signals VSA1, VSB1, VSC1, and VSD1, which are used select among the outputs of switching elements SWA, SWB, SWC, and SWD, respectively. Each of connection points VA-VD is a "default" connection point and an "alternate" connection point in relation to different switching elements of FIGS. 23 and 24 (and the signals associated with those switching elements). Similarly, each of the vertical connection paths respectively associated with connection points VA-VD is a "default" vertical connection path and an "alternate" vertical connection path in relation to different switching elements of FIGS. 23 and 24 (and the signals associated with those switching elements). Also, as used herein, an "alternate signal path" is a signal path between a switching element and an alternate connection point relative to that switching element.

Figure 25:
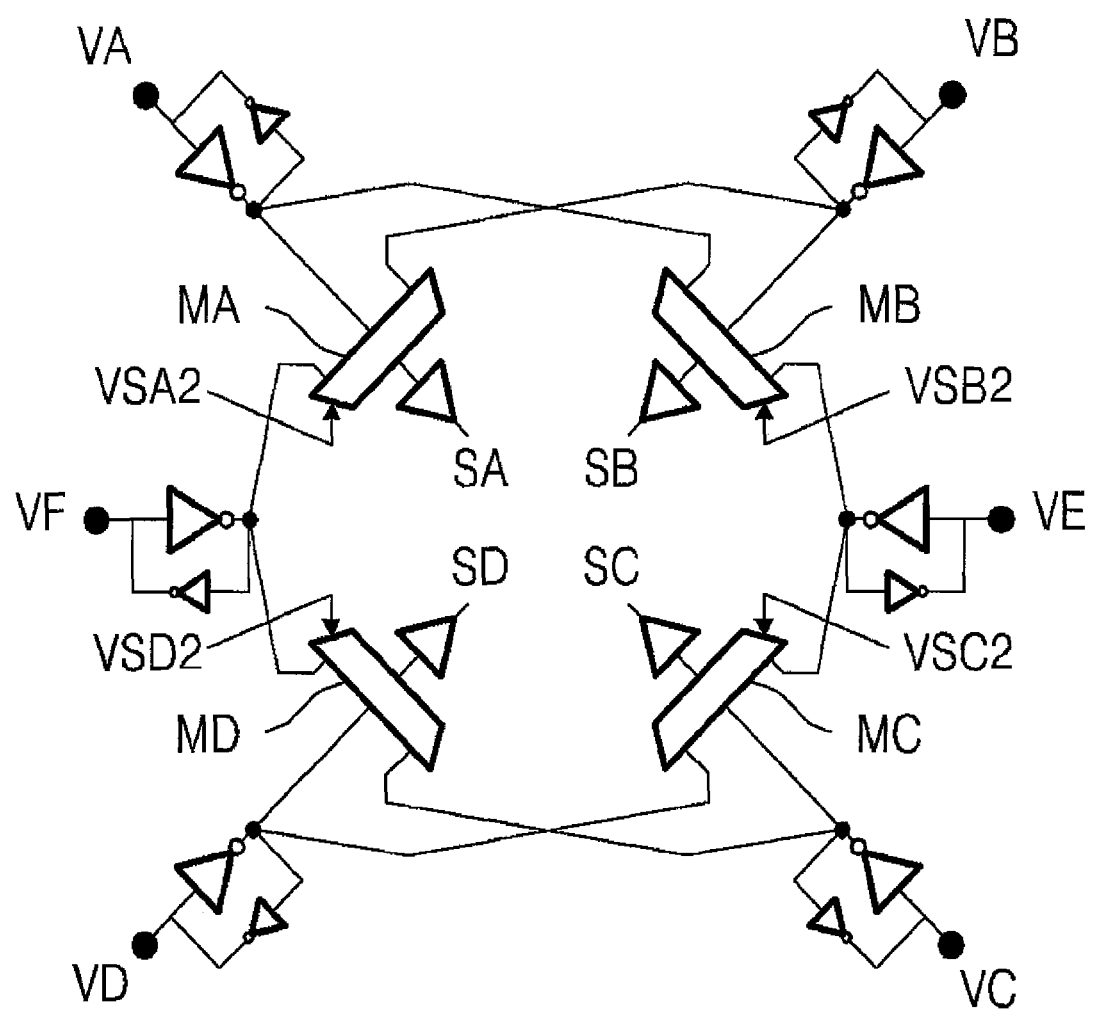
FIG. 25 is a circuit diagram corresponding to a receiver of FIG. 23 in accordance with an embodiment of the invention.

FIG. 25 is a circuit diagram corresponding to receiver RCV1 of FIG. 23 in accordance with an embodiment of the invention. As noted above, FIG. 23 is a conceptual diagram that illustrates various connections in a ring-type redundant connection scheme but does not show elements of the connection scheme disposed in a ring-like arrangement. In contrast, FIG. 25 illustrates elements of receiver RCV1 disposed in a ring-like arrangement in accordance with an embodiment of the invention.

The arrangement of elements within receiver RCV1 is analogous to the arrangement of elements within driver DRV1; however, receiver RCV1 receives signals SA-SD from among connection points VA-VF while driver DRV1 provides signals SA-SD to connection points among connection points VA-VF.

In the circuit diagram of FIG. 25, switching elements MA-MD have a ring-like arrangement. In addition, substantially the same connections are made among the various components of receiver RCV1 in both FIGS. 23 and 25. As in FIG. 23, signals SA-SD are received from switching elements MA-MD, respectively, in the circuit diagram of FIG. 25. In addition, in the circuit diagram of FIG. 25, each of switching elements MA-MD receives signals from the same connection points among connection points VA-VF as described with regard to FIG. 23. Also, as illustrated in FIG. 25, switching elements MA-MD provide signals SA-SD to master device 10' through buffers. Additionally, for each of connection points VA-VF, a latch is connected between the connection point and each switching element among switching elements MA-MD to which it is connected.

In FIG. 25, inputs of switching element MA are connected to default connection point VA and redundant connection points VF and VB. Inputs of switching element MB are connected to default connection point VB and redundant connection points VA and VE. Inputs of switching element MC are connected to default connection point VC and redundant connection points VD and VE. Also, inputs of switching element MD are connected to default connection point VD and redundant connection points VC and VF. FIG. 25 also shows control signals VSA2, VSB2, VSC2, and VSD2, which are used to select among inputs of switching elements MA, MB, MC, and MD, respectively. Each of connection points VA-VD is a "default" connection point and an "alternate" connection point in relation to different switching elements of FIGS. 23 and 25 (and the signals associated with those switching elements). Similarly, each of the vertical connection paths respectively associated with connection points VA-VD is a "default" vertical connection path and an "alternate" vertical connection path in relation to different switching elements of FIGS. 23 and 25 (and the signals associated with those switching elements).

FIG. 24 shows a possible implementation of the connections between switching elements SWA-SWD and connection points VA-VF, and FIG. 25 shows a possible implementation of the connections between switching elements MA-MD and connection points VA-VF. The ring-like arrangement of elements illustrated in FIGS. 24 and 25 allow the connections illustrated in FIG. 23 to be made such that all of the alternate signal paths in the ring-like arrangement have substantially the same length and will therefore exhibit substantially the same signal propagation delay. The "signal propagation lengths" of the alternate signal paths are an important consideration in avoiding or minimizing signal skew when using redundant vertical connection paths in a stacked apparatus.

Figure 26:
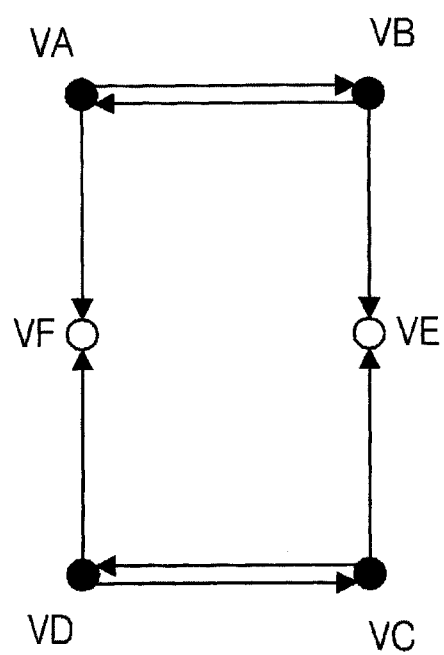
FIG. 26 is a conceptual diagram illustrating alternate signal paths in the ring-type redundant connection scheme of FIG. 23.

FIG. 26 is a conceptual diagram illustrating alternate signal paths in the ring-type redundant connection scheme of FIG. 23. In FIG. 26, each arrow represents an alternate signal path. For example, connection point VA is the default connection point for signal SA. However, connection points VB and VF are alternate connection points relative to signal SA illustrates the alternate signals paths to those connection points with arrows from connection point VA to each of connection points VB and VF. The embodiment of FIG. 26 comprises four (4) default connection points VA-VD (for signals SA-SD) and two (2) redundant connection points VE and VF. In addition, the embodiment of FIG. 26 provides two (2) alternate signal paths for each of the four (4) signals while providing only two (2) redundant connection points. Additionally, as noted above, each of the alternate signals paths has substantially the same length, so the embodiment of FIG. 26 provides two (2) alternate signal paths having substantially the same length for each of signals SA-SD while providing only two (2) redundant connection points.

Figure 27:
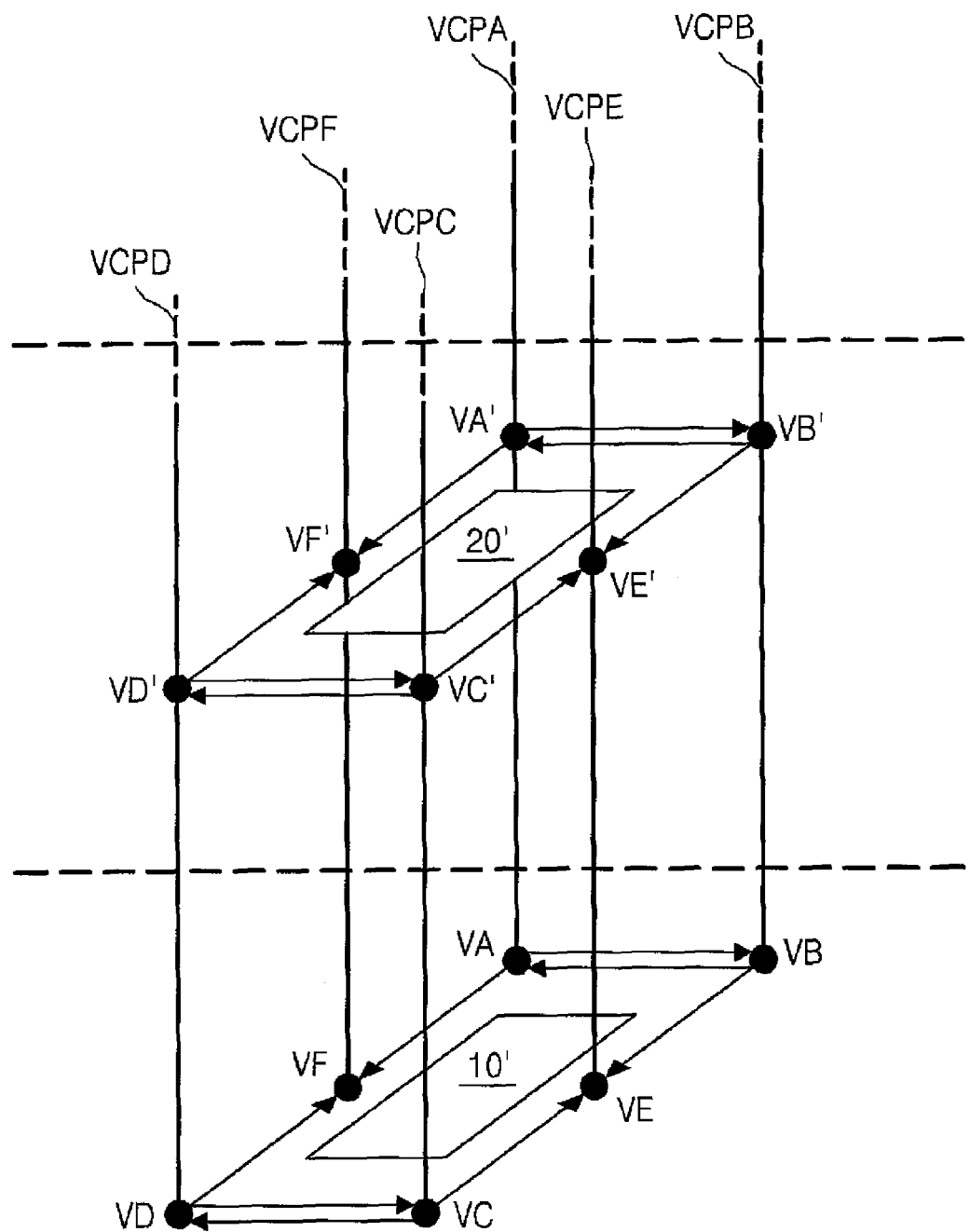
FIG. 27 illustrates a portion of a stacked apparatus implementing the ring-type redundant connection scheme of FIG. 23.

FIG. 27 illustrates a portion of a stacked apparatus implementing the ring-type redundant connection scheme of FIG. 23. The stacked apparatus of FIG. 27 comprises master device 10' and a device 20'. Master device 10' comprises the ring-type redundant connection scheme of FIG. 23, including driver DRV1 and receiver RCV1, and connection points VA-VF. Device 20' comprises connection points VA'-VF'. In addition, the stacked apparatus illustrated in FIG. 27 comprises vertical connection paths VCPA-VCPF. Connection points VA and VA' are connected to vertical connection path VCPA, connection points VB and VB' are connected to vertical connection path VCPB, etc. In addition, as illustrated by the arrows among connection points VA-VF, master device 10' in the embodiment of FIG. 27 implements the ring-type redundant connection scheme of FIG. 23. FIG. 27 also shows arrows among connection points VA'-VF'; however, device 20' only partially implements the ring-type redundant connection scheme of FIG. 23.

Figure 28:
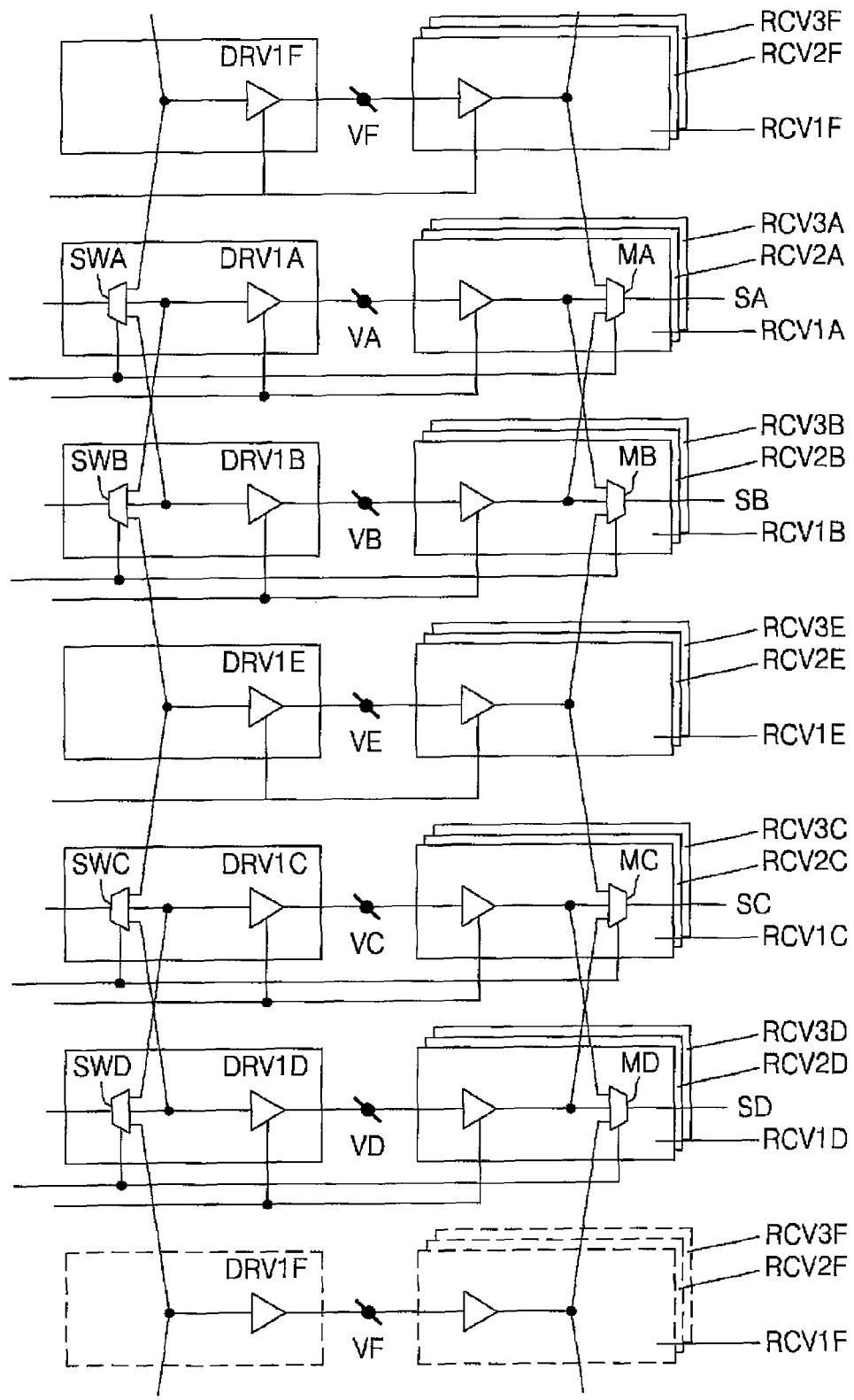
FIG. 28 further illustrates the ring-type redundant connection scheme for a stacked apparatus of FIG. 23 in accordance with an embodiment of the invention.

FIG. 28 further illustrates the ring-type redundant connection scheme for a stacked apparatus of FIG. 23 in accordance with an embodiment of the invention. FIG. 28 illustrates signal drivers DRV1A-DRV1F, which provide signals to connection points VA-VF, respectively. Driver DRV1 of FIG. 23 comprises signal drivers DRV1A-DRV1F. Each of signal drivers DRV1A-DRV1F comprises a buffer, and signal drivers DRV1A-DRV1D comprise switching elements SWA-SWD. In addition, signal drivers DRV1A-DRV1F are all disposed on the same device in the stacked apparatus. For example, in stacked apparatus 9 of FIG. 22, each of signal drivers DRV1A-DRV1F may be disposed on master device 10' in accordance with an embodiment of the invention. Although illustrated twice, there is only one connection point VF and only one signal driver DRV1F in the ring-type redundant connection scheme of FIG. 28.

FIG. 28 also illustrates first signal receivers RCV1A-RCV1F, which receive signals from connection points VA-VF, respectively. Receiver RCV1 of FIG. 23 comprises first signal receivers RCV1A-RCV1F. Each of first signal receivers RCV1A-RCV1F comprises a buffer, and first signal receivers RCV1A-RCV1D comprise switching elements MA-MD. In addition, first signal receivers RCV1A-RCV1F and signal drivers DRV1A-DRV1F are all disposed on the same device in the stacked apparatus. For example, in stacked apparatus 9 of FIG. 22, first signal receivers RCV1A-RCV1F and signal drivers DRV1A-DRV1F may all be disposed on master device 10' in accordance with an embodiment of the invention. Although illustrated twice, there is only one first signal receiver RCV1F in the ring-type redundant connection scheme of FIG. 28.

FIG. 28 also illustrates second signal receivers RCV2A-RCV2F and third signal receivers RCV3A-RCV3F. Second signal receivers RCV2A-RCV2F are analogous to first signal receivers RCV1A-RCV1F, but are all disposed on a second device in the stacked apparatus. In addition, third signal receivers RCV3A-RCV3F are analogous to first signal receivers RCV1A-RCV1F, but are all disposed on a third device in the stacked apparatus. For example, in stacked apparatus 9 of FIG. 22, first signal receivers RCV1A-RCV1F and signal drivers DRV1A-DRV1F may all be disposed on master device 10', second signal receivers RCV2A-RCV2F may all be disposed on a device 20', and third signal receivers RCV3A-RCV3F may all be disposed on a device 30' in accordance with an embodiment of the invention. Additionally, second signal receivers RCV2A-RCV2F may be connected to connection points VA'-VF' of device 20', respectively, in accordance with an embodiment of the invention (see FIG. 27). Similarly, third signal receivers RCV3A-RCV3F may be connected to connection points VA"-VF" of device 30', respectively, in accordance with an embodiment of the invention. Although illustrated twice, there is only one second signal receiver RCV2F and one third signal receiver RCV3F in the ring-type redundant connection scheme of FIG. 28.

Figure 29:
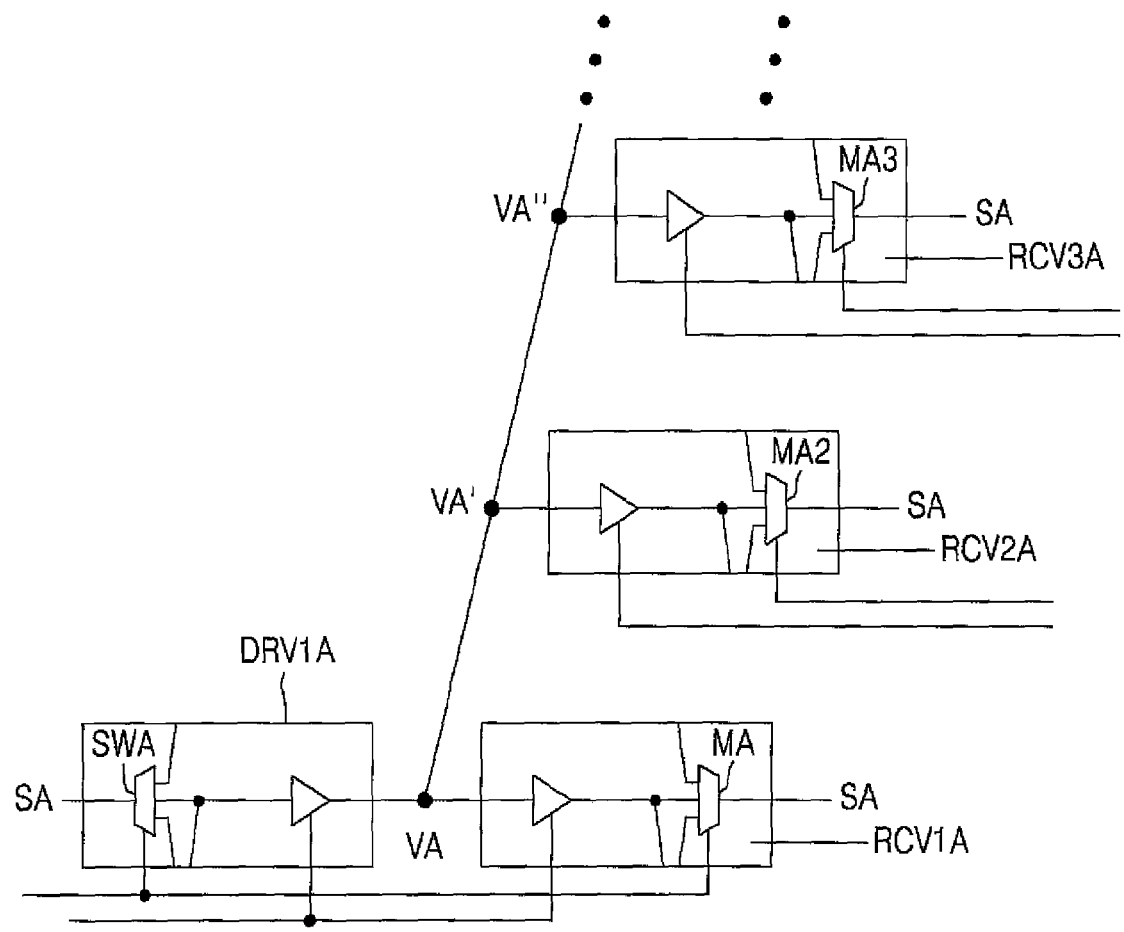
FIG. 29 further illustrates a portion of the ring-type redundant connection scheme for a stacked apparatus of FIG. 28 in accordance with an embodiment of the invention.

FIG. 29 further illustrates a portion of the ring-type redundant connection scheme for a stacked apparatus of FIG. 28 in accordance with an embodiment of the invention. FIG. 29 illustrates signal driver DRV1A and first signal receiver RCV1A disposed on a first device of the stacked apparatus, each of which is connected to connection point VA of the first device. FIG. 29 also illustrates second signal receiver RCV2A disposed on a second device of the stacked apparatus and connected to connection point VA' of the second device. Additionally, FIG. 29 illustrates third signal receiver RCV3A disposed on a third device of the stacked apparatus and connected to connection point VA" of the third device. Similar to first signal receiver RCV1A, which comprises a buffer and switching element MA, second signal receiver RCV2A comprises a buffer and a switching element MA2, and third signal receiver RCV3A comprises a buffer and a switching element MA3. Additionally, each of connection points VA, VA', and VA" is connected to a vertical connection path VCPA (see FIG. 27). Also, in an embodiment of the invention in which the ring-type redundant connection scheme is implemented in stacked apparatus 9 of FIG. 22, signal driver DRV1A and first signal receiver RCV1A may be disposed on master device 10', second signal receiver RCV2A may be disposed on a device 20', and third signal receiver RCV3A may be disposed on a device 30'.

Figure 30:
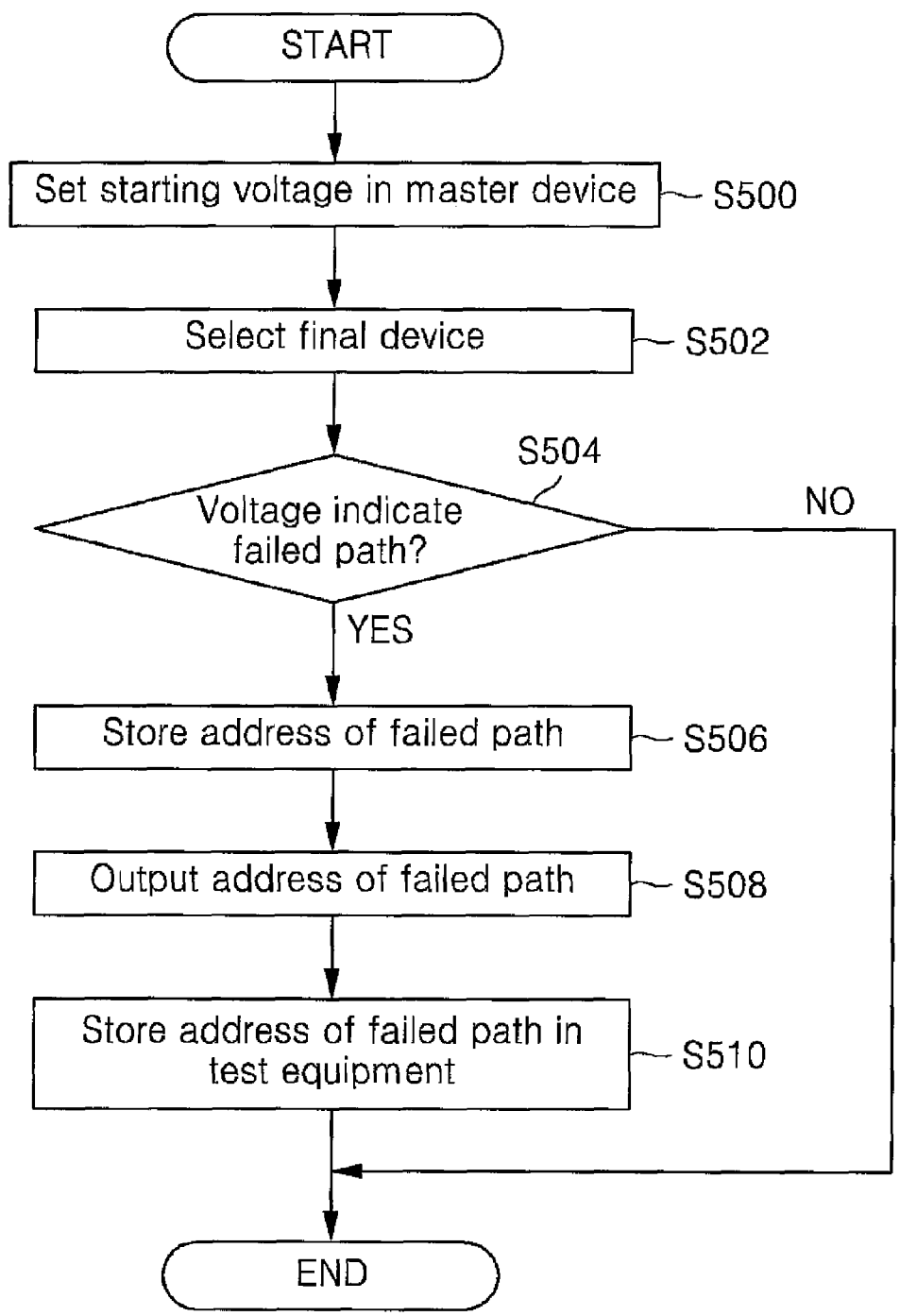
FIG. 30 is a flow chart summarizing a method of detecting a failed vertical connection path in a stacked apparatus in accordance with an embodiment of the invention.

FIG. 30 is a flow chart summarizing a method of detecting a failed vertical connection path in a stacked apparatus in accordance with an embodiment of the invention. An exemplary performance of the method corresponding to FIG. 30 will be described herein with reference to FIG. 22. In the method corresponding to FIG. 30, a starting voltage is set at a node in the master device (S500) and then a final device relative to a vertical connection path is selected (S502). As used herein, the "final device" relative to a vertical connection path is the device on the opposite side of the vertical connection path relative to the master device. Accordingly, in the embodiment illustrated in FIG. 22, device 40' is the final device relative to the vertical connection path because device 40' is disposed on the opposite side of the illustrated vertical connection path (i.e., the vertical connection path comprising segments SEG1, SEG5, and SEG9) relative to master device 10'.

Thus, in the exemplary performance of the method on the stacked apparatus illustrated in FIG. 22, a starting voltage is set at node NX1 of master device 10' (S500). To set the starting voltage at node NX1, test enable signal TSTENB1 is set to a logic low level and thereby gates pull-up transistor PUT1 of master device 10'. When test enable signal TSTENB1 is gated by pull-up transistor PUT1, node NX1 is set to a logic high level through pull-up transistor PUT1 (S500). Test enable signal TSTENB1 is then set to a logic high level (to turn OFF pull-up transistor PUT1). Then, device 40' is selected (S502). For example, referring to FIGS. 22 and 32, master device 10' may provide a chip select signal CS equal to ID signal ID31 to select device 40' and provide signal PD4 having a logic high level to pull-down transistor PDT4 to gate pull-down transistor PDT4 (S502). In accordance with another embodiment of the invention, the test enable signal TSTENB1 may maintain a logic low level when the signal PD4 is set to a logic high level, so that pull-up transistor PUT1 may remain turned ON when the signal PD4 is set to a logic high level.

Master device 10' then determines whether the voltage apparent at node NX1 indicates that the vertical connection path is a failed vertical connection path (S504). If the voltage apparent at node NX1 indicates that the vertical connection path is a passed vertical connection path (S504=no), then the performance of the method ends. For example, referring to FIG. 22, if the vertical connection path comprising segments SEG1, SEG5, and SEG9 is a passed vertical connection path, then node NX1 will be grounded through pull-down transistor PDT4 when signal PD4 is activated. Thus, when master device 10' detects a logic low level at node NX1, master device 10' may determine that the vertical connection path comprising segments SEG1, SEG5, and SEG9 is a passed vertical connection path (S504=no) and performance of the method will end.

On the other hand, if master device 10' determines that the vertical connection path is a failed vertical connection path (S504=yes), then performance of the method will continue. For example, referring to FIG. 22, if the vertical connection path comprising segments SEG1, SEG5, and SEG9 is a failed vertical connection path (i.e., at least one of segments SEG1, SEG5, and SEG9 is a failed segment), then node NX1 may not satisfactorily receive the ground voltage through pull-down transistor PDT4. Thus, if master device 10' detects a relatively high level at node NX1, then master device 10' may determine that the vertical connection path comprising segments SEG1, SEG5, and SEG9 is a failed vertical connection path (S504=yes) and performance of the method will continue.

If master device 10' determines that the vertical connection path is a failed vertical connection path (S504=yes), then master device 10' stores an address corresponding to the failed vertical connection path (S506). For example, a load command may be issued and master device 10' may store the address corresponding to the failed vertical connection path in a shift register. Master device 10' then outputs the address of the failed vertical connection path (S508). For example, a shift command may be issued and master device 10' may shift the address out of the shift register and output the address from master device 10'. Finally, the address of the failed vertical connection path may be stored in test equipment connected to the stacked apparatus (S510).

Figure 31:
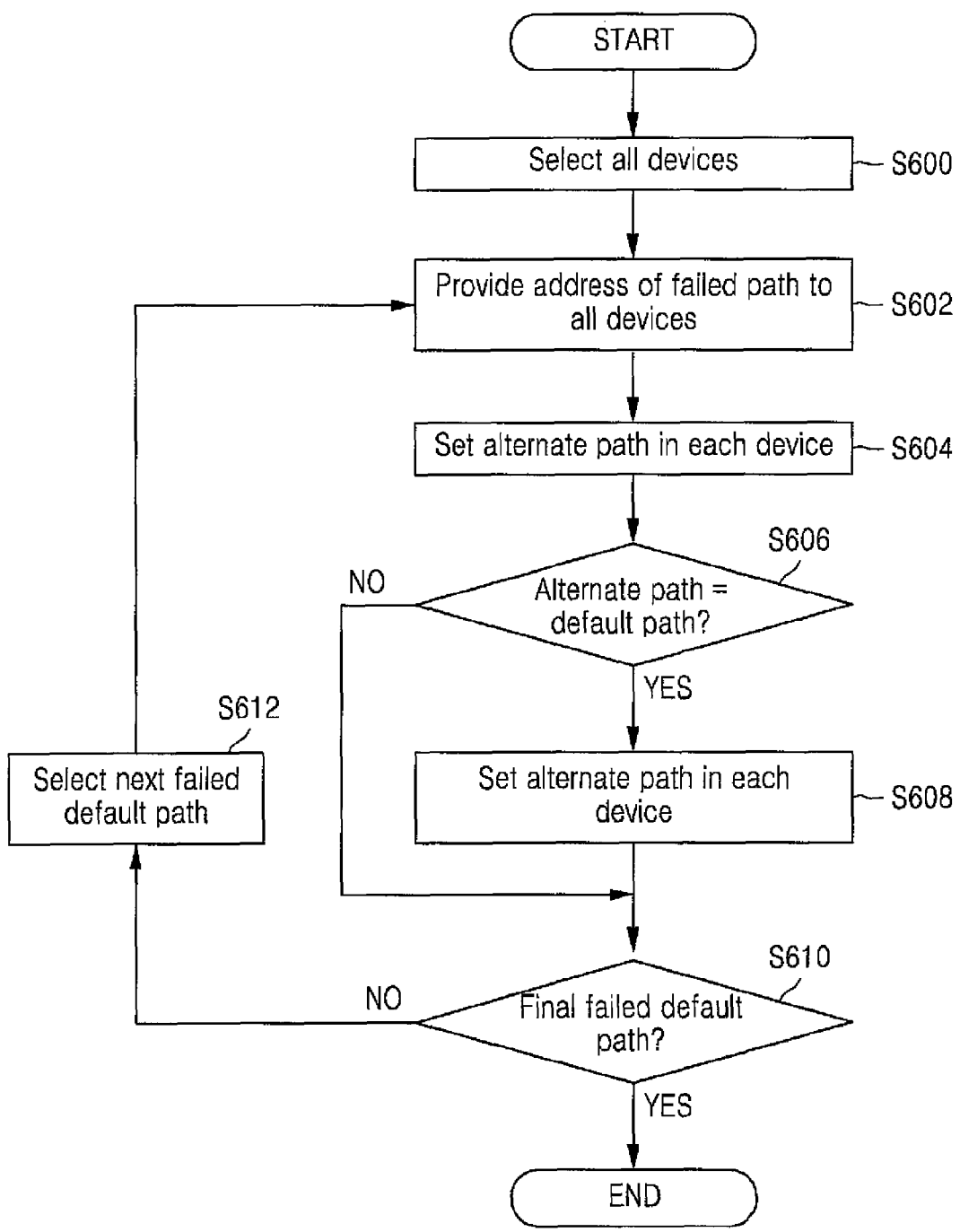
FIG. 31 is a flow chart summarizing a method of connecting alternate vertical connection paths in place of failed vertical connection paths in a stacked apparatus in accordance with an embodiment of the invention.

FIG. 31 is a flow chart summarizing a method of connecting alternate vertical connection paths in place of failed vertical connection paths in a stacked apparatus in accordance with an embodiment of the invention. The method corresponding to FIG. 31 is performed after the method corresponding to FIG. 30 has been performed to determine which vertical connection paths are failed vertical connection paths. Thus, when the method corresponding to FIG. 31 is performed, the failed vertical connection paths among the vertical connection paths of the stacked device have been detected. The method will be described herein with reference to an exemplary performance of the method in a stacked apparatus corresponding to stacked apparatus 9 of FIG. 22 that comprises the ring-type redundant connection scheme of FIGS. 23-29. Also, vertical connection paths VCPD and VCPF are assumed to be failed vertical connection paths in this working example. As used herein, a "default" vertical connection path is a vertical connection path that is the default vertical connection path for a given signal in the stacked apparatus. For example, referring to FIGS. 23 and 27, vertical connection path VCPA is the default vertical connection path for signal SA. Also, as used herein, a "redundant" vertical connection path is a vertical connection path that is not a default vertical connection path for any signal in the stacked apparatus. For example, referring to FIGS. 23 and 27, vertical connection paths VCPE and VCPF are redundant vertical connection paths.

In the method corresponding to FIG. 31, all of the devices in the stacked apparatus are selected (S600). Then, an address corresponding to a failed default vertical connection path is provided to each device in the stacked apparatus (S602). In the working example, an address corresponding to vertical connection path VCPD is provided to each device in the stacked apparatus (S602). An alternate path for vertical connection path VCPD is then set in each device (S604). In the working example, since vertical connection path VCPF is also a failed vertical connection path, vertical connection path VCPC is set as the alternate vertical connection path. The alternate vertical connection path may be set in each device by using switching elements corresponding to signal SD in each device (e.g., switching elements SWD and MD in device 10') to set alternate signals paths between the switching elements and the alternate connection point corresponding to the alternate vertical connection path. For example, master device 10' may select alternate signal paths between connection point VC and each of switching elements SWD and MD so that device 10' will communicate signal SD using vertical connection path VCPC.

Next, whether the alternate vertical connection path is a default vertical connection path corresponding to another signal is determined (S606). In the working example, the alternate vertical connection path VCPC is the default connection path for signal SC (S606=yes), so an alternate vertical connection path must be set for vertical connection path VCPC for the communication of signal SC (S608). In the working example, vertical connection path VCPC is being used for signal SD, and vertical connection path VPCD is a failed vertical connection path, so vertical connection path VCPE is set as the alternate vertical connection path for signal SC (S608).

Then it is determined whether an alternate vertical connection path has been set for the final failed default vertical connection path (S610). In the working example, vertical connection path VCPD was the only failed default vertical connection path, so it was the final failed default vertical connection path (S610=yes), so performance of the method terminates. However, if another failed default connection path remained (S610=no), then performance of the method would return to step S602 to provide an alternate vertical connection path for the failed default vertical connection path.

When performance of the method terminates in the working example, signal SA is communicated via vertical connection path VCPA, signal SB is communicated via vertical connection path VCPB, signal SC is communicated via vertical connection path VCPE, and signal SD is communicated via vertical connection path VCPC.

Figure 33A:
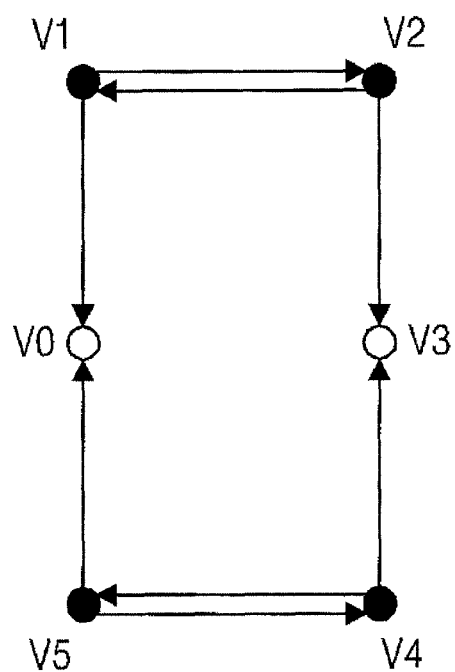
FIG. 33A is a conceptual diagram illustrating the ring-type redundant connection scheme for a stacked apparatus in accordance with an embodiment of the invention.
Figure 33B:
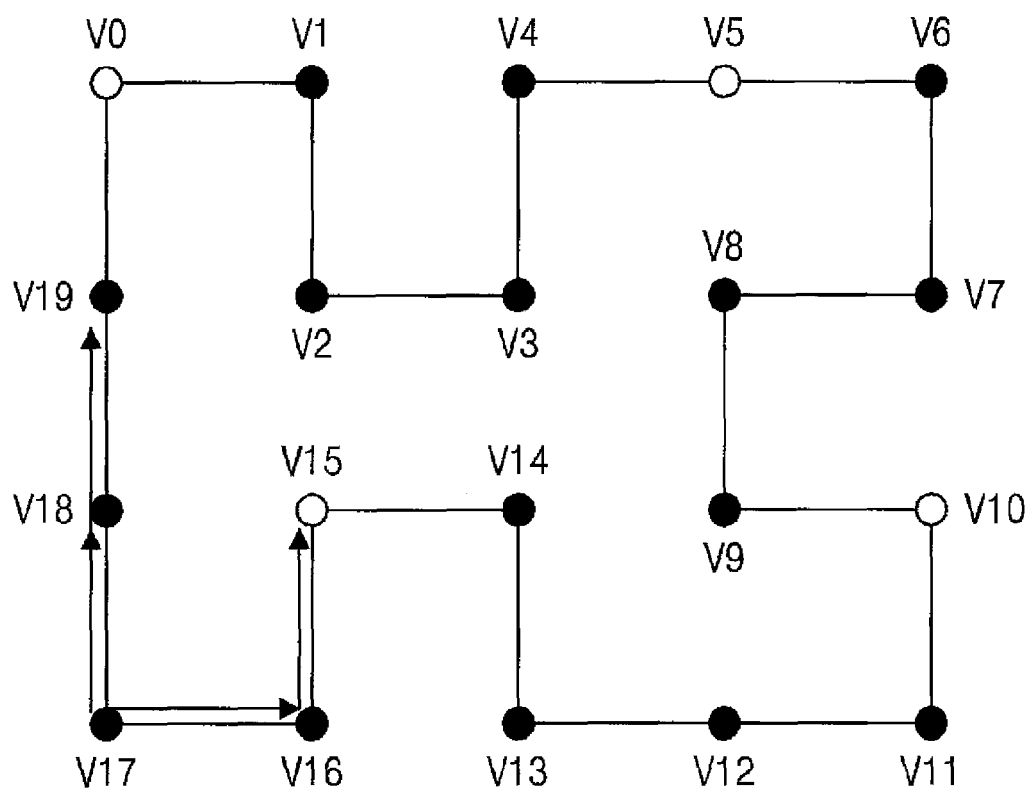
FIG. 33B is a conceptual diagram illustrating the ring-type redundant connection scheme for a stacked apparatus in accordance with another embodiment of the invention.

FIGS. 33A and 33B are conceptual diagrams respectively illustrating ring-type redundant connection schemes for a stacked apparatus in accordance with respective embodiments of the invention. In the following description, an integer "q" will represent a number of default vertical connection paths and a number of signals to be communicated in a stacked apparatus. In addition, an integer "r" will represent a number of redundant vertical connection paths in the stacked apparatus, and (q+r) will represent the total number of vertical connection paths in the stacked apparatus. Additionally, as used herein, "RU" represents a round-up function and "/" represents division. In accordance with embodiments of the invention, an ordering of all of the vertical connection paths in the stacked apparatus may be established such that, when the vertical connection paths in the stacked apparatus are traversed in order, one redundant vertical connection path is arranged after every RU(q/r) default vertical connection paths.

In FIGS. 33A and 33B, each shaded circle (e.g., the circle labeled V1 in FIG. 33A) corresponds to a default vertical connection path, and each non-shaded circle (e.g., the circle labeled V0 in FIG. 33A) corresponds to a redundant vertical connection path. Additionally, while FIGS. 33A and 33B illustrate connection points V0, V1, V2, etc., each of those connection points is connected to a respective vertical connection path. Thus, connection points V0, V1, V2, etc., will be referred to as vertical connection paths V0, V1, V2, etc., for convenience of description.

In the embodiment illustrated in FIG. 33A, q=4 and r=2. Thus, the total number of vertical connection paths is six (q+r=6), and RU(q/r)=RU(4/2)=2. FIG. 33A illustrates vertical connection paths V0-V5 (i.e., connection points V0-V5 that respectively correspond to vertical connection paths of the stacked apparatus). Thus, in the ring-type redundant connection scheme illustrated in FIG. 33A, four (4) signals are communicated through the stacked apparatus using six (6) vertical connection paths. As illustrated in FIG. 33A, one redundant vertical connection path is arranged after every RU(q/r) (i.e., 2) default vertical connection paths according to the ordering of the vertical connection paths. In particular, the ordering of the vertical connection paths in the embodiment illustrated in FIG. 33A is a redundant vertical connection path V0, two default vertical connection paths V1 and V2, a redundant vertical connection path V3, and two default vertical connection paths V4 and V5, in that order.

The ordering of vertical connection paths V0-V5 orders vertical connection paths V0-V5 into $0^{th}$ through $(q+r-1)^{th}$ vertical connection paths. In accordance with embodiments of the invention, in the ordering of the vertical connection paths, the $(q+r-1)^{th}$ vertical connection path is directly adjacent to the $0^{th}$ vertical connection path. In addition, the $0^{th}$ vertical connection path is a redundant vertical connection path. If any $k^{th}$ vertical connection path among the $0^{th}$ through $(q+r-1)^{th}$ vertical connection paths is a default vertical connection path and a failed vertical connection path (i.e., is a failed default vertical connection path), then any one of RU(q/r) vertical connection paths nearest to the $k^{th}$ vertical connection path may be selected and used as an alternate vertical connection path for the $k^{th}$ vertical connection path. The RU(q/r) vertical connection paths nearest to the $k^{th}$ vertical connection path are the $(k-1+q+r)\mod(q+r)^{th}$, $(k-2+q+r)\mod(q+r)^{th}$, ... $(k-RU(q/r/2)+q+r)\mod(q+r)^{th}$ vertical connection paths and the $(k+1+q+r)\mod(q+r)^{th}$, $(k+2+q+r)\mod(q+r)^{th}$, ..., and $(k+RU(q/r/2)+q+r)\mod(q+r)^{th}$ vertical connection paths. As used herein, a vertical connection path "nearest" the $k^{th}$ vertical connection path may not be the nearest vertical connection path in physical distance, but may be the vertical connection path that is most adjacent to the $k^{th}$ vertical connection path according to the ordering of the vertical connection paths. For example, in the embodiment illustrated in FIG. 33A, the vertical connection paths nearest the $0^{th}$ vertical connection path V0 are the $1^{st}$ vertical connection path V1 and the $5^{th}$ vertical connection path V5. In addition, the vertical connection paths nearest the $3^{rd}$ vertical connection path V0 are the $2^{nd}$ vertical connection path V2 and the $4^{th}$ vertical connection path V4.

In the embodiment illustrated in FIG. 33A, a $1^{st}$ vertical connection path V1 may be a failed vertical connection path, for example. When the $1^{st}$ vertical connection path V1 is a failed vertical connection path (i.e., when k=1), the RU(q/r) (i.e., 2) vertical connection paths nearest the $1^{st}$ vertical connection path V1 may be found using $(k-1+q+r)\mod(q+r)=6 \mod(6)=0$, and $(k+1+q+r)\mod(q+r)=8 \mod(6)=2$. Thus, either one of the $0^{th}$ vertical connection path V0 and the $2^{nd}$ vertical connection path V2 may be used as alternate vertical connection path for the $1^{st}$ vertical connection path V1. As another example, the $5^{th}$ vertical connection path V5 may be a failed vertical connection path. When the $5^{th}$ vertical connection path V5 is a failed vertical connection path (i.e., when k=5), the RU(q/r) (i.e., 2) vertical connection paths nearest the $1^{st}$ vertical connection path V1 may be found using $(k-1+q+r)\mod(q+r)=10 \mod(6)=4$, and $(k+1+q+r)\mod(q+r)=12 \mod(6)=0$. Thus, either one of the $4^{th}$ vertical connection path V4 and the $0^{th}$ vertical connection path V0 may be used as alternate vertical connection path for the $5^{th}$ vertical connection path V5.

In the embodiment illustrated in FIG. 33B, q=16 and r=4. Thus, the total number of vertical connection paths is twenty (q+r=20) and RU(q/r)=RU(16/4)=4. FIG. 33B illustrates vertical connection paths V0-V19 (i.e., connection points V0-V19 that respectively correspond to vertical connection paths of the stacked apparatus). Thus, in the ring-type redundant connection scheme illustrated in FIG. 33B, sixteen (16) signals are communicated through the stacked apparatus using twenty (20) vertical connection paths. As illustrated in FIG. 33B, one redundant signal path maybe arranged after every RU(q/r) (i.e., 4) default vertical connection paths according to a predefined arrangement order. In particular, the ordering of the vertical connection paths in the embodiment illustrated in FIG. 33B is a redundant vertical connection path V0, four default vertical connection paths V1-V4, a redundant vertical connection path V5, four default vertical connection paths V6-V9, a redundant vertical connection path V10, four default vertical connection paths V11-V14, a redundant vertical connection path V15, and four default vertical connection paths V16-V19, in that order.

The ordering of vertical connection paths V0-V19 orders vertical connection paths V0-V19 into $0^{th}$ through $(q+r-1)^{th}$ vertical connection paths. In accordance with embodiments of the invention, in the ordering of the vertical connection paths, the $(q+r-1)^{th}$ vertical connection path is directly adjacent to the $0^{th}$ vertical connection path. In addition, the $0^{th}$ vertical connection path is a redundant vertical connection path. If any $k^{th}$ vertical connection path among the $0^{th}$ through $(q+r-1)^{th}$ vertical connection paths is a failed vertical connection path, then any one of RU(q/r) vertical connection paths nearest the $k^{th}$ vertical connection path may be selected and used as an alternate vertical connection path for the $k^{th}$ vertical connection path. The RU(q/r) vertical connection paths nearest the $k^{th}$ vertical connection path are the $(k-1+q+r)\mod(q+r)^{th}$, $(k-2+q+r)\mod(q+r)^{th}$, ..., $(k-RU(q/r/2)+q+r)\mod(q+r)^{th}$ vertical connection paths and the $(k+1+q+r)\mod(q+r)^{th}$, $(k+2+q+r)\mod(q+r)^{th}$, ..., and $(k+RU(q/r/2)+q+r)\mod(q+r)^{th}$ vertical connection paths.

In the embodiment illustrated in FIG. 33B, a $1^{st}$ vertical connection path V1 may be a failed vertical connection path, for example. When the $1^{st}$ vertical connection path V1 is a failed vertical connection path (i.e., when k=1), the RU(q/r) (i.e., 4) vertical connection paths nearest the $1^{st}$ vertical connection path V1 may be found using $(k-1+q+r)\mod(q+r)=20 \mod(20)=0$, $(k-2+q+r)\mod(q+r)=19 \mod(20)=19$, $(k+1+q+r)\mod(q+r)=22 \mod(20)=2$, and $(k+2+q+r)\mod(q+r)=23 \mod(20)=3$. Thus, any one among the $0^{th}$ vertical connection path V0, the $19^{th}$ vertical connection path V19, the $2^{nd}$ vertical connection path V2, and the $3^{rd}$ vertical connection path V3 may be used as alternate vertical connection path for the $1^{st}$ vertical connection path V1. As another example, the $19^{th}$ vertical connection path V19 may be a failed vertical connection path. When the $19^{th}$ vertical connection path V19 is a failed vertical connection path (i.e., when k=19), the RU(q/r) (i.e., 4) vertical connection paths nearest the $19^{th}$ vertical connection path V19 may be found using $(k-1+q+r)\mod(q+r)=38 \mod(20)=18$, $(k-2+q+r)\mod(q+r)=37 \mod(20)=17$, $(k+1+q+r)\mod(q+r)=40 \mod(20)=0$, and $(k+2+q+r)\mod(q+r)=41 \mod(20)=1$. Thus, any one among the $18^{th}$ vertical connection path V18, the $17^{th}$ vertical connection path V17, the $0^{th}$ vertical connection path V0, and the $1^{st}$ vertical connection path V1 may be used as an alternate vertical connection path for the $19^{th}$ vertical connection path V19.

In the foregoing embodiments, multiple vertical signal paths are implemented through a stacked apparatus, as necessary, using methods which identify one or more connection path segment characteristics for segments in a plurality of vertical connection paths, evaluate the complete constellation of available segments and their suitability for use within a vertical signal path, and thereafter define various inter-device layer connections between segments. Embodiments of the invention are capable of effectively defining M vertical signal paths from N vertical connection paths, where N is greater than M where at least one of the defined vertical signal paths is a merge-connected signal path. Thus, it is no longer necessary to allocate by means of dedicating two or more vertical connections paths to the transmission of a single vertical signal path, as is conventionally required. The flexibility provided by embodiments of the invention allows for a significant reduction in the number of vertical connection paths that must be provided through a stacked apparatus.

Although various embodiments of the invention have been described herein, various changes and modifications may be made to the embodiments by one having ordinary skill in the art without departing from the scope of the invention, as defined by the accompanying claims.

What is claimed is:

1. A method of configuring M vertical signal paths through a stacked plurality of devices using a plurality of N vertical connection paths, wherein 'M' and 'N' are respective natural numbers and M is less than N, and the stacked plurality of devices comprises a plurality of segments, the method comprising:
    detecting whether each of the plurality of segments is a pass segment or a fail segment, respectively;
    identifying all vertical connection paths in the plurality of N vertical connection paths comprising only pass segments as L non-merged vertical connection paths and designating the L non-merged vertical connection paths as respective ones of the M vertical signal paths, wherein L is a natural number less than M; and
    configuring K merged vertical signal paths, where K is a natural number equal to M minus L, and designating the K merged vertical signal paths as respective ones of the M vertical signal paths,
    wherein configuring each one of the K merged vertical signal paths comprises adaptively connecting at least one pass segment from each one of at least two of the plurality of vertical connection paths, excluding the L non-merged vertical connection paths,
    the stacked plurality of devices comprises a first device and a second device adjacent to the first device,
    each of the vertical connection paths comprises a vertical subset of the plurality of segments,
    the plurality of segments comprises a plurality of first layer segments associated with the first device and a plurality of second layer segments associated with the second device,
    the designation of the L non-merged vertical connection paths also designates a plurality of H failed vertical connection paths within the plurality of N vertical connection paths, where N is a natural number equal to L plus H and each one of the plurality of H failed vertical connection paths comprises at least one fail segment, and
    configuring the K merged vertical signal paths further comprises;
        selecting K possible vertical signal paths traversing the plurality of H failed vertical connection paths and thereafter adaptively connecting at least one pass segment from one of the plurality of H failed vertical connection paths with at least one pass segment from another one of the plurality of H failed vertical connection paths,
        obtaining a first plurality of possible switch paths of the first device and respective first signal path weight values corresponding to the first plurality of possible signal paths, and
        obtaining a second plurality of possible switch paths of the second device and respective second signal path weight values corresponding to the second plurality of possible signal paths.

2. The method of claim 1, wherein selecting the K possible vertical signal paths comprises:
    selecting the K possible vertical signal paths from among a plurality of possible vertical signal paths traversing the plurality of H failed vertical connection paths based on respective total signal path weight values associated with the plurality of possible vertical signal paths, wherein each of the plurality of possible merged vertical signal paths comprises one of the possible signal paths of the first device and one of the possible signal paths of the second device.

3. The method of claim 2, wherein selecting the K possible vertical signal paths comprises selecting the K possible vertical signal paths having the least total signal path weight values among the total signal path weight values of the plurality of possible vertical signal paths.

4. The method of claim 3, wherein each of the signal path weight values corresponds to propagation delay.

5. The method of claim 4, wherein, for each of the plurality of possible vertical signal paths, the total signal path weight value associated with the possible vertical signal path is equal to the sum of the respective signal path weight values corresponding to the possible signal paths included in the possible vertical signal path.

6. The method of claim 2, wherein selecting the K possible vertical signal paths comprises selecting the K possible merged vertical signal paths having the least difference in total signal path weight values among the total signal path weight values of the plurality of possible vertical signal paths.

7. The method of claim 6, wherein each of the total signal path weight values corresponds to propagation delay.

8. The method of claim 7, wherein, for each of the possible vertical signal paths, the total signal path weight value associated with the possible vertical signal path is equal to the sum of the respective signal path weight values corresponding to the possible signal paths included in the possible vertical signal path.

9. The method of claim 1, wherein detecting whether each of the plurality of segments is a pass segment or a fail segment, respectively, comprises:
    performing a connection test on each one of the plurality of first layer segments, and determining whether the first device is repairable based on the results of the connection tests performed on the plurality of first layer segments, and
    performing a connection test on each one of the plurality of second layer segments, and determining whether the second device is repairable based on the results of the connection tests performed on the plurality of second layer segments, and
    performance of the method ends without configuring the merged vertical signal path in response to a determination that either the first or the second device is not repairable.

10. The method of claim 9, wherein performing a connection test on one of the second layer segments comprises:
    determining whether a current connection test path associated with the second layer segment is reliable;
    if the current connection test path is reliable, monitoring the current connection test path; and otherwise, forming a new connection test path associated with the second layer segment and subsequently monitoring the new connection test path, if the new connection test path is reliable.

11. The method of claim 10, wherein the current connection test path comprises a first switch path connecting the second layer segment to a fail segment among the plurality of first layer segments, and forming the new connection test path associated with the second layer segment comprises forming a second switch path connecting the second layer segment to a pass segment among the plurality of first layer segments.

12. The method of claim 1, wherein at least one device in the stacked plurality of devices is a semiconductor chip.

13. The method of claim 12, wherein at least one segment in the plurality of segments includes a conductive via extending through the semiconductor chip.

* * * * *